(12) United States Patent
Shirai et al.

(10) Patent No.: US 8,843,457 B2
(45) Date of Patent: *Sep. 23, 2014

(54) DATA CONVERSION DEVICE, DATA CONVERSION METHOD, AND PROGRAM

(71) Applicant: Sony Corporation, Tokyo (JP)

(72) Inventors: Taizo Shirai, Kanagawa (JP); Kyoji Shibutani, Tokyo (JP); Shiho Moriai, Kanagawa (JP); Toru Akishita, Tokyo (JP); Tetsu Iwata, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/767,394

(22) Filed: Feb. 14, 2013

(65) Prior Publication Data

US 2013/0159264 A1 Jun. 20, 2013

Related U.S. Application Data

(63) Continuation of application No. 13/059,643, filed as application No. PCT/JP2009/064782 on Aug. 25, 2009, now Pat. No. 8,380,683.

(30) Foreign Application Priority Data

Aug. 25, 2008 (JP) .................................. 2008-214810

(51) Int. Cl.
 *G06F 17/30* (2006.01)
 *H03M 7/30* (2006.01)
 *G06F 7/544* (2006.01)
 *H03M 7/28* (2006.01)

(52) U.S. Cl.
 CPC ....... *G06F 17/30303* (2013.01); *H03M 7/3077* (2013.01); *G06F 7/544* (2013.01); *H03M 7/28* (2013.01)

USPC ............ 707/693; 707/698; 380/220; 380/269

(58) Field of Classification Search
 USPC ........................... 707/693, 698; 380/220, 269
 See application file for complete search history.

(56) References Cited

U.S. PATENT DOCUMENTS 3,656,178 A * 4/1972 De Maine et al. ............... 341/87
5,574,586 A * 11/1996 Chu et al. ........................ 398/53

(Continued)

OTHER PUBLICATIONS

Hirose, Shoichi; "Collision Resistance of Double-Block-Length Hash Function Against Free-Start Attack;" IEICE Trans. Fundamentals; vol. E91-A, No. 1; pp. 74-82, dated Jan. 2008.

(Continued)

*Primary Examiner* — Hanh Thai
(74) *Attorney, Agent, or Firm* — Finnegan, Henderson, Farabow, Garrett & Dunner, LLP

(57) ABSTRACT

There is realized a data conversion device that performs generation of a hash value with improved analysis resistance and a high degree of safety. There are provided a stirring processing section performing a data stirring process on input data; and a compression processing section performing a data compression process on input data including data segments which are divisions of message data, the message data being a target of a data conversion. Part of multi-stage compression subsections is configured to perform a data compression process based on both of output of the stirring processing section and the data segments in the message data. There is provided such a configuration that the stirring process is executed at least on fixed timing of a compression processing round of plural rounds and thus, there is realized a data conversion device that performs generation of a hash value with improved analysis resistance and a high degree of safety.

20 Claims, 37 Drawing Sheets

(56) References Cited

U.S. PATENT DOCUMENTS

| | | | | |
|---|---|---|---|---|
| 6,220,585 B1* | 4/2001 | Heron | | 267/153 |
| 6,327,994 B1* | 12/2001 | Labrador | | 114/382 |
| 6,404,923 B1* | 6/2002 | Chaddha | | 382/224 |
| 6,549,702 B2* | 4/2003 | Islam et al. | | 385/31 |
| 7,970,015 B2* | 6/2011 | Brandstatter | | 370/477 |
| 2002/0165912 A1* | 11/2002 | Wenocur et al. | | 709/203 |
| 2002/0178360 A1* | 11/2002 | Wenocur et al. | | 713/170 |
| 2002/0194483 A1* | 12/2002 | Wenocur et al. | | 713/185 |
| 2002/0194501 A1* | 12/2002 | Wenocur et al. | | 713/201 |
| 2002/0196935 A1* | 12/2002 | Wenocur et al. | | 380/37 |
| 2002/0199001 A1* | 12/2002 | Wenocur et al. | | 709/227 |
| 2002/0199096 A1* | 12/2002 | Wenocur et al. | | 713/153 |
| 2003/0009694 A1* | 1/2003 | Wenocur et al. | | 713/201 |
| 2003/0041110 A1* | 2/2003 | Wenocur et al. | | 709/206 |
| 2005/0032918 A1* | 2/2005 | Schliephake et al. | | 518/702 |
| 2007/0058610 A1* | 3/2007 | Brandstatter | | 370/352 |
| 2007/0065031 A1* | 3/2007 | Yokose | | 382/238 |
| 2007/0071340 A1* | 3/2007 | Yokose | | 382/243 |
| 2007/0291934 A1* | 12/2007 | Volkovs et al. | | 380/28 |
| 2008/0013724 A1* | 1/2008 | Shamoon et al. | | 380/201 |
| 2010/0111296 A1* | 5/2010 | Brown et al. | | 380/28 |
| 2011/0219229 A1* | 9/2011 | Cholas et al. | | 713/168 |

OTHER PUBLICATIONS

Office Action for Application No. 2008-214810, from the Japanese Patent Office, dated Jun. 11, 2013.

* cited by examiner

DATA CONVERSION DEVICE, DATA CONVERSION METHOD, AND PROGRAM

CROSS-REFERENCE TO RELATED APPLICATIONS

This application claims priority to and benefit from U.S. application Ser. No. 13/059,643, filed Jun. 8, 2011, which is now allowed, which claims priority to and benefit from International Application No. PCT/JP09/064782, filed Aug. 25, 2009, all of which are incorporated herein by reference in their entireties.

TECHNICAL FIELD

The present invention relates to a data conversion device, a data conversion method, and a program. To be more specific, the present invention relates to, for example, a data conversion device, a data conversion method, and a program which perform a hash-value generating process for input message data.

BACKGROUND ART

In data conversion processing such as encryption processing, a hash function that executes hash processing for input data is often used. The hash function is a function for calculating a compressed value (digest) having a fixed length, for a given message. As the hash function already known, there are: MD5 having an output value of 128 bits; SHA-1 having an output value of 160 bits; further, SHA-256 having an output value of 256 bits; and the like.

For example, based on an analysis-resistance enhancement request and the like, the hash function is desired to have the following resistances.

Preimage Resistance
Second Preimage Resistance
Collision Resistance
These resistances will be briefly described.
In a hash function that outputs y=h(x) where an input is x and the hush function is h, the Preimage Resistance is equivalent to difficulty in calculating the input x that results in h(x)=y for the output y.
The Second Preimage Resistance is equivalent to difficulty in finding a different input value x' that satisfies h(x')=h(x) when one input value x is known.
The Collision Resistance is equivalent to difficulty in finding two different input values x and x' that satisfy h(x')=h(x).
It can be said that the higher these resistances are, the safer the hash function is.

Up to now, due to progress of analytical methods in recent years, vulnerability of the hash functions that have been used, in terms of the above-described resistances, has been revealed. For example, it has become evident that the Collision Resistances of MD5, SHA-1 and the like that have been often used as the hash functions do not meet many system requirement levels. Further, there is SHA-256 or the like having a comparatively long output length as an existing hash function, but this SHA-256 follows the design policy of SHA-1 and thus, anxiety about safety remains as well and therefore, a safer hash function based on other design policy is desired to emerge.

SUMMARY OF INVENTION

The present invention has been made in view of the foregoing problems and aims to provide a data conversion device, a data conversion method, and a program which realize a hash function with a high level of safety and a high degree of processing efficiency.

A first aspect of the present invention is a data conversion device including: a stirring processing section performing a data stirring process on input data; and a compression processing section performing a data compression process on input data including data segments which are divisions of message data, the message data being a target of data conversion, wherein the compression processing section is configured of multi-stage compression subsections which are capable of receiving all of the data segments in the message data, part of the multi-stage compression subsections is configured to perform the data compression process based on both of output of the stirring processing section and the data segments in the message data, part of the multi-stage compression subsections is configured to perform the data compression process based on both of output of a previous-stage compression subsection and the data segments in the message data, and a compression subsection located in a final stage of the multi-stage compression subsections is configured to output a hash value of the message data.

Further, in one implementation mode of the data conversion device of the present invention, the multi-stage compression subsections have an MD construction (Merkle-Damgard Construction).

Still further, in one implementation mode of the data conversion device of the present invention, the multi-stage compression subsections have a plurality of processing series that receive the same data segments in the message data to perform processing in parallel.

Furthermore, in one implementation mode of the data conversion device of the present invention, the stirring processing section is configured to perform the data stirring process on the input data, and to generate output data whose number of bits is equal to number of bits in the input data, and the compression processing section is configured to perform the data compression process on the input data, and to generate output data whose number of bits is less than number of bits in the input data.

Still furthermore, in one implementation mode of the data conversion device of the present invention, the data conversion device is configured such that the data stirring process in the stirring processing section and the data compression process in the compression processing section are alternately performed.

Moreover, in one implementation mode of the data conversion device of the present invention, the data conversion device is configured such that the data stirring process of the stirring processing section is performed corresponding to each of multi-stage data compression processes in the compression processing section.

Further, in one implementation mode of the data conversion device of the present invention, the stirring processing section includes: a data conversion section performing an adjustment process of number of bits in the input data; and a stirring-section-imbedded compression section receiving the input data and output from the data conversion section to perform a compression process thereon.

Still further, in one implementation mode of the data conversion device of the present invention, the data conversion section is configured of a plurality of data conversion subsections which perform processes in parallel, and the stirring-section-imbedded compression section has a plurality of compression subsections that perform processes, in parallel, on outputs from the respective data conversion sections.

Furthermore, in one implementation mode of the data conversion device of the present invention, the stirring processing section includes: a transposition-function executing section with intermediate output, configured to repeatedly perform each of transposition processes to output an intermediate value which is a result of each of the transposition processes, and a transposition-function executing section with additional input, configured to repeatedly perform a transposition process with use of the intermediate value outputted from the transposition-function executing section with intermediate output, as an additional input.

Still furthermore, in one implementation mode of the data conversion device of the present invention, the transposition-function executing section with additional input is configured to utilize an XOR result as input data for the transposition process in following stage, the XOR result being a logical value of an exclusive OR between the intermediate value outputted from the transposition-function executing section with intermediate output and a result of transposition process in previous stage.

Moreover, in one implementation mode of the data conversion device of the present invention, each of the transposition processes performed by the transposition-function executing sections is configured to include a non-linear conversion process performed for part or all of input data and a swap process which is a data interchanging process.

Further, in one implementation mode of the data conversion device of the present invention, the non-linear conversion process is a process including an exclusive OR operation with use of a constant, a non-linear conversion, and a linear conversion with use of a linear conversion matrix.

Still further, in one implementation mode of the data conversion device of the present invention, the linear conversion process in each of the transposition processes executed by the transposition-function executing sections is performed according to a DSM (Diffusion Switching Mechanism) with use of a plurality of different matrixes.

Furthermore, in one implementation mode of the data conversion device of the present invention, each of the transposition processes performed by the transposition-function executing sections is configured such that a data process is performed based on a respective one of a plurality of constants groups which are different from one another, and the plurality of constants groups, which are generated by data conversion processes performed on a fundamental group and are different from one another, are applied to respective transposition processes, the fundamental group being defined as a constants group to be applied to one transposition process.

Still furthermore, in one implementation mode of the data conversion device of the present invention, the constants group to be utilized as the fundamental group is configured of a plurality of constants generated through application of a conversion rule to a plurality of initial values S and T which are different from each other, and the conversion rule is configured to include an update process for the initial values, the update process being represented by following expression;

$$S \leftarrow S \cdot x^a, \quad T \leftarrow T \cdot x^b$$

where $a \neq b$.

Moreover, in one implementation mode of the data conversion device of the present invention, the data conversion processes for the fundamental group is a process which allows a bit rotation operation to be performed on each of constants which constitute the fundamental group, or a process which allows an operation to be performed on a predetermined mask data.

Further, in one implementation mode of the data conversion device of the present invention, the data conversion section is configured to perform a cutting-off process which allows an ultimately outputted hash value to be reduced in number of bits, and a calculation of the number of bits to be reduced, for output bits of each of a plurality of output-data series which constitute an output of the data conversion section, is performed according to a predetermined calculation expression, and then the cutting-off process is executed according to a result of the calculation.

Further, a second aspect of the present invention is a data conversion method executed in a data conversion device, the method including steps of: performing a data stirring process on input data by a stirring processing section; and performing a data compression process on input data by a compression processing section, the input data including data segments which are divisions of message data, the message data being a target of data conversion, wherein the compression processing section is configured of multi-stage compression subsections which receive all of the data segments in the message data, part of the multi-stage compression subsections is configured to perform the data compression process based on both of output of the stirring processing section and the data segments in the message data, part of the multi-stage compression subsections is configured to perform the data compression process based on both of output of a previous-stage compression subsection and the data segments in the message data, and a compression subsection located in the final stage of the multi-stage compression subsections is configured to output a hash value of the message data.

Still further, a third aspect of the present invention is a program including a recorded sequence which allows a data conversion device to execute a data conversion process, the sequence including steps of: performing a data stirring process on input data by a stirring processing section; and performing a data compression process on input data by a compression processing section, the input data including data segments which are divisions of message data, the message data being a target of data conversion, wherein the compression processing section is configured of multi-stage compression subsections which receive all of the data segments in the message data, part of the multi-stage compression subsections is configured to perform the data compression process based on both of output of the stirring processing section and the data segments in the message data, part of the multi-stage compression subsections is configured to perform the data compression process based on both of output of a previous-stage compression subsection and the data segments in the message data, and a compression subsection located in the final stage of the multi-stage compression subsections is configured to output a hash value of the message data.

Incidentally, the program of the present invention is a program that can be provided by, for example, a storage medium or a communication medium that provides in a computer readable form to a general-purpose system capable of executing various program codes. The provision of such a program in a computer readable form realizes a process according to the program on a computer system.

Further, other objects, features and advantages of the present invention will be revealed by detailed description provided later based on embodiments and appended figures of the present invention. Incidentally, the system in the present description is a configuration of a logical group of plural devices, and is not limited to one in which individual devices are present within the same enclosure.

According to one embodiment of the present invention, there are provided the stirring processing section performing the data stirring process on input data; and the compression processing section performing the data compression process on input data including the data segments which are divisions of the message data, the message data being a target of the data conversion. The part of the multi-stage compression subsections is configured to perform the data compression process based on both of output of the stirring processing section and the data segments in the message data. There is provided the configuration in which the stirring process is executed based on at least each fixed timing of a compression processing round in plural rounds and thus, there is realized the data compression device that performs generation of a hash value with improved analysis resistance and a high degree of safety.

DESCRIPTION OF EMBODIMENTS

Figure 1:
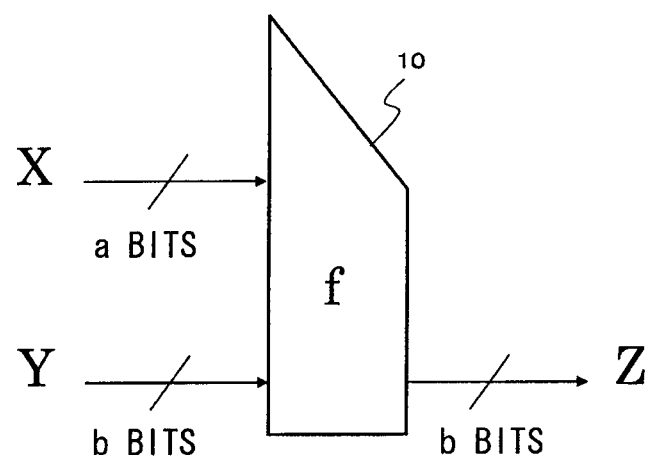
FIG. 1 is a diagram that explains a compression function (f) serving as a data compression processing section.

In the following, the data conversion device, the data conversion method, and the program of the present invention will be described in detail with reference to the drawings.

The description will be presented with items in the following order.
1. Domain extension method
2. New domain extension method expanding output size
3. Method of improving processing efficiency in new domain extension method
4. Method of implementing stirring function F
5. Generalization of domain extension method
6. Generalization of configuration of stirring function F
7. About use of different compression functions
8. Method of efficiently implementing internal processing of compression function
9. Method of extending input message length
10. Hash function implementing method using repeated type of transposition for CV processing section and MS section
11. Method of expanding size of MS section
12. Method of expanding size of CV processing section
13. Method of expanding sizes of CV processing section and MS section
14. Method of configuring stirring function F for domain extension method
15. Method of implementing transposition processing with high diffusion performance
16. Method of generating transposition function having output with high independence
17. Processing of generating constant applied to transposition function
18. Method of generating constants for plural overall transpositions
19. Technique of reducing output value of hash function
20. Configurational example of data conversion device

[1. Domain Extension Method]

As described earlier, a hash function execution section is desired to have the above-described various kinds of resistance, namely, the following resistances.
Preimage Resistance
Second Preimage Resistance
Collision Resistance Incidentally, the data conversion device of the present invention includes various kinds of function execution section such as a hash function execution section and a compression function execution section which will be described below. In the following description, one merely expressed as "... function" is executed in the function execution section that executes each function, in the data conversion device of the present invention. Incidentally, the function execution sections are implemented by using hardware, or software, or both.

The hash function uses a compression function that calculates a compressed value (digest) having a fixed length for a given message. When building a hash processing section formed by hardware and software executing the hash function, it is desired to provide a configuration by taking the above-described various kinds of resistance into consideration. The configuration of the hash processing section is roughly divided into two layers. The two layers are:
(1) a first layer that is a Domain Extension part, and
(2) a second layer that is an internal configuration of the compression function.

The domain is a bit size (input size) acceptable as an input value of the hash function. One compression function execution section performs processing of converting an input value having a fixed length into an output value having a fixed length, but generally, in one compression function execution section, an acceptable input bit size is small, and an input value of a large bit size cannot be processed, and therefore, extension is performed by linking plural compression functions so that a message input of an arbitrary length is handled. Processing like this makes it possible to perform hash processing of input data having a long bit length. The Domain Extension processing is this kind of processing.

The levels of the above-described resistances depend on the domain extension configuration serving as this first layer and the internal configuration of the compression function serving as the second layer.

First, here, a new scheme for the domain extension processing in the former will be described. The compression function is a function that converts the bit string of an input value into a bit string having a length shorter than an input bit length. FIG. 1 is a diagram that illustrates a compression function (f) serving as the compression function section.

A compression function 10 illustrated in FIG. 1 is a function that receives an a+b-bit input that is the sum of X: a-bit serving as an input value and an initial value Y: b-bit, and outputs an output Z of a b-bit value. A bit size acceptable as an input value of a compression function is called a domain (input size). The one compression function 10 alone cannot handle a long input message and thus, an input message size can be expanded by appropriately linking compression functions to each other and thereby extending the domain (input size). In other words, it is possible to input data having a long bit length.

Figure 2:
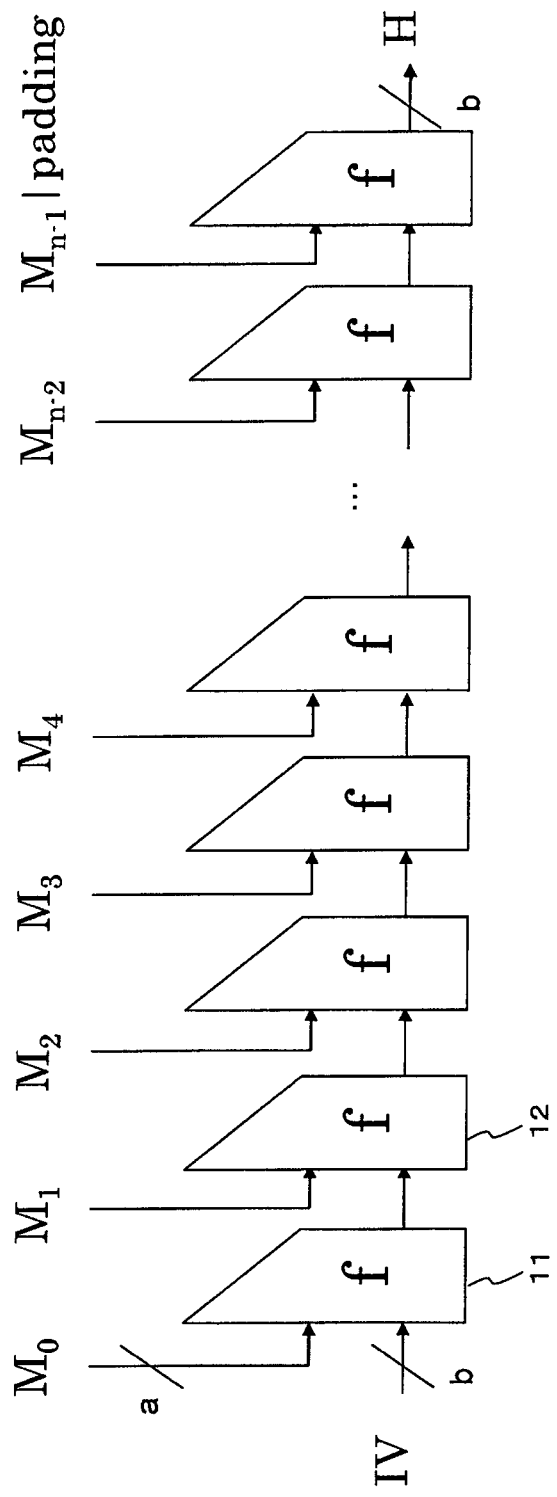
FIG. 2 is a diagram that explains an MD construction (Merkle-Damgard Construction) with message padding, which is a representative domain extension method.

FIG. 2 illustrates an MD construction (Merkle-Damgard Construction) with message padding, which is a representative domain extension method. Incidentally, as for this configuration, see, for example, [reference literature: R. Merkle, "One way hash functions and des." in Proceedings of Crypto'89 (G. Brassard, ed.), no. 435 in LNCS, pp. 428-446, Springer-Verlag, 1989. I. Damgard, "A design principle for hash functions." in Proceedings of Crypto'89 (G. Brassard, ed.), no. 435 in LNCS, pp. 417-427, Springer-Verlag, 1989.)]

The MD construction is a configuration that makes it possible to expand an input size by arranging compression functions (f) in series as illustrated in FIG. 2. By the padding processing performed as bit-data applying processing for bit-length adjustment, an input message is corrected to be a value of an integer multiple of a-bit which is a message input section size of the compression function. The input message after the padding processing is divided into bit units that are $M_0, M_1, M_2 \ldots, M_{n-2}, M_{n-1}|Padding$. $[M_{n-1}|Padding]$ is data in which the input bit size is caused to be a-bit by adding padding data as an overhead bit to $[M_{n-1}]$ that is the last data of the input message.

In this configuration, in order to create a digest with respect to the message, an operation, in which a predetermined b-bit initial value IV (Initial value) and a first segment message $M_0$ are input to a compression function 11 and compressed and therefore a b-bit value is output as a median value, and the median value output and a subsequent message are input to a compression function 12 and compressed, is repeated by using plural compression functions so that a hash value (H) is obtained eventually. The median value at the time is called a Changing Variable.

It is known that this configuration can show that if the Collision Resistance exists in the individual compression functions themselves, the entire hash function has the collision resistance, and this configuration is often used for an actual hash function. As representative hash functions using this configuration, there are MD5 and SHA-1.

[2. New Domain Extension Method Expanding Output Size]

In the above-described configuration, the case of the b-bit output has been described and next, a configuration of a hash function that generates a 2b-bit hash value of a long big length will be discussed.

When the above-described MD construction is used as it is, it is necessary to prepare a compression function having a 2b-bit output. However, generally, it is difficult to newly generate a compression function having a large-size output and a high degree of safety. It is necessary to design a new compression function and assess the safety, and the larger the size is, the more this design and assessment become difficult. Therefore, it is desirable to be able to configure a hash function of 2b-bit output by using the compression function of b-bit output that has been already assessed.

As an existing technique that realizes a hash value of a large output-bit size by using a compression function of a small output-bit size, a cascading hash configuration is known. The cascading hash configuration will be described with reference to FIG. 3.

Figure 3:
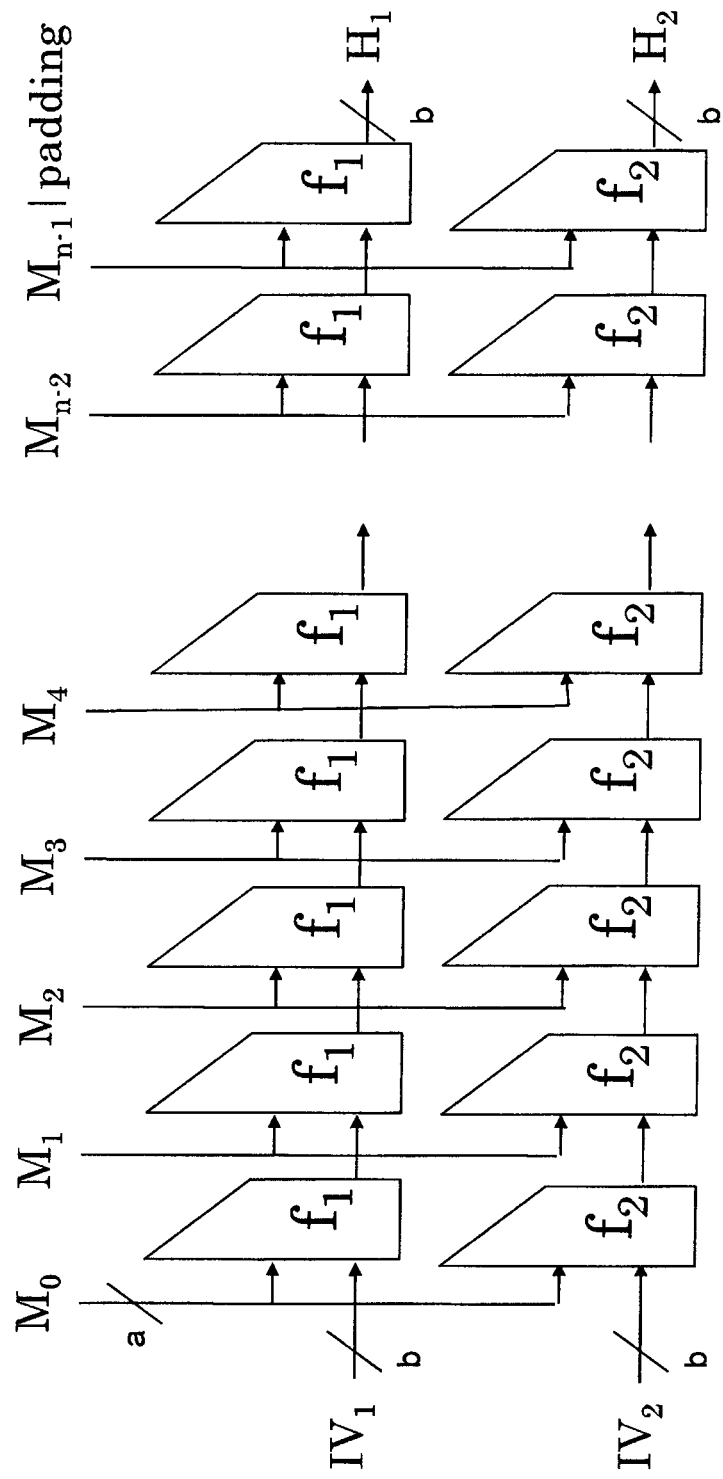
FIG. 3 is a diagram that explains a cascading hash configuration that realizes a hash value of a large output-bit size by using a compression function of a small output-bit size.

The cascading hash configuration is a configuration in which a hash value of a large output size is made possible by using two compression functions in parallel. As illustrated in FIG. 3, in the cascading hash, two compression functions $f_1$ and $f_2$ are simply arranged in parallel. This configuration makes it possible to configure a hash function having a 2b-bit output.

However, the safety of such a hash function that executes 2b-bit output by arranging two compression functions of b-bit output does not reach a level required of the hash function having a 2b-bit output size. It is known that strictly, there is only the safety on the scale of the hash function having a b-bit output size. This is described in, for example, the following literature: [A. Joux, "Multicollisions in iterated hash functions. application to cascaded constructions." in Proceedings of Crypto '04 (M. Franklin, ed.), no. 3152 in LNCS, p. 306-316, Springer-Verlag, 2004.].

Figure 4:
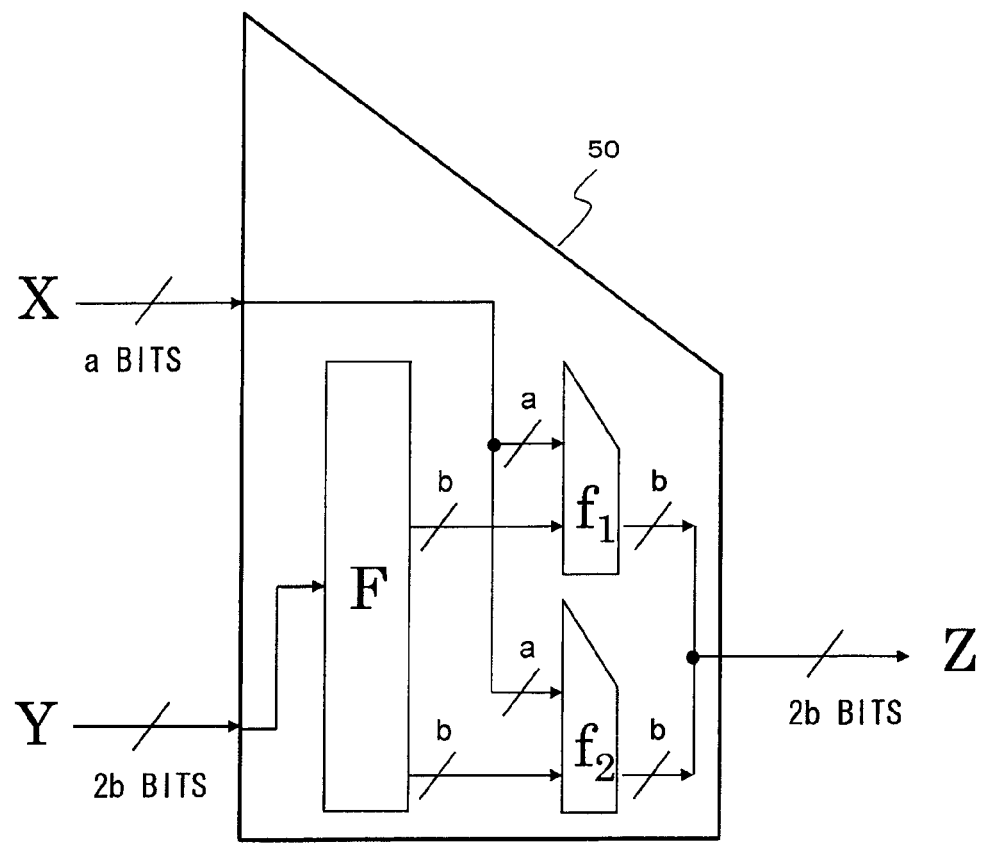
FIG. 4 is a diagram that explains a configurational example of a compression processing section (compression function) with improved safety.

Next, the configuration of a compression processing section (compression function) with improved safety according to one embodiment of the present invention will be described with reference to FIG. 4. FIG. 4 illustrates a compression function unit 50 that is a compression processing section of a-bit input and 2b-bit output. The compression function unit 50 illustrated in FIG. 4 includes: compression functions $f_1$ and $f_2$ serving as two independent data compression sections of a+b-bit input and b-bit output; and a stirring function F serving as a data stirring processing section of 2b-bit input and output. In other words, there are provided one stirring function F and two-series compression functions $f_1$ and $f_2$.

The compression function unit 50 receives a 2b+a-bit input that is the sum of a-bit [X] and 2b-bit [Y]. Of the input, the 2b-bit data [Y] is stirred by passing through the stirring function F having 2b-bit input and output. Subsequently, the 2b-bit output of the stirring function F is divided into b-bit segments, and one b-bit segment data and the remaining a-bit data X of the compression function unit 50 are processed by the compression function $f_1$ in the unit. The other b-bit segment data and the a-bit data X are subjected to parallel processing by the compression function $f_2$ in the unit. Ultimately, a 2b-bit output that is the combination of the outputs of $f_1$ and $f_2$ becomes an output of the compression function unit 50. Incidentally, the stirring function F is a function that stirs the input 2b-bit data and produces an output, and the two compression functions $f_1$ and $f_2$ are different compression functions.

Figure 5:
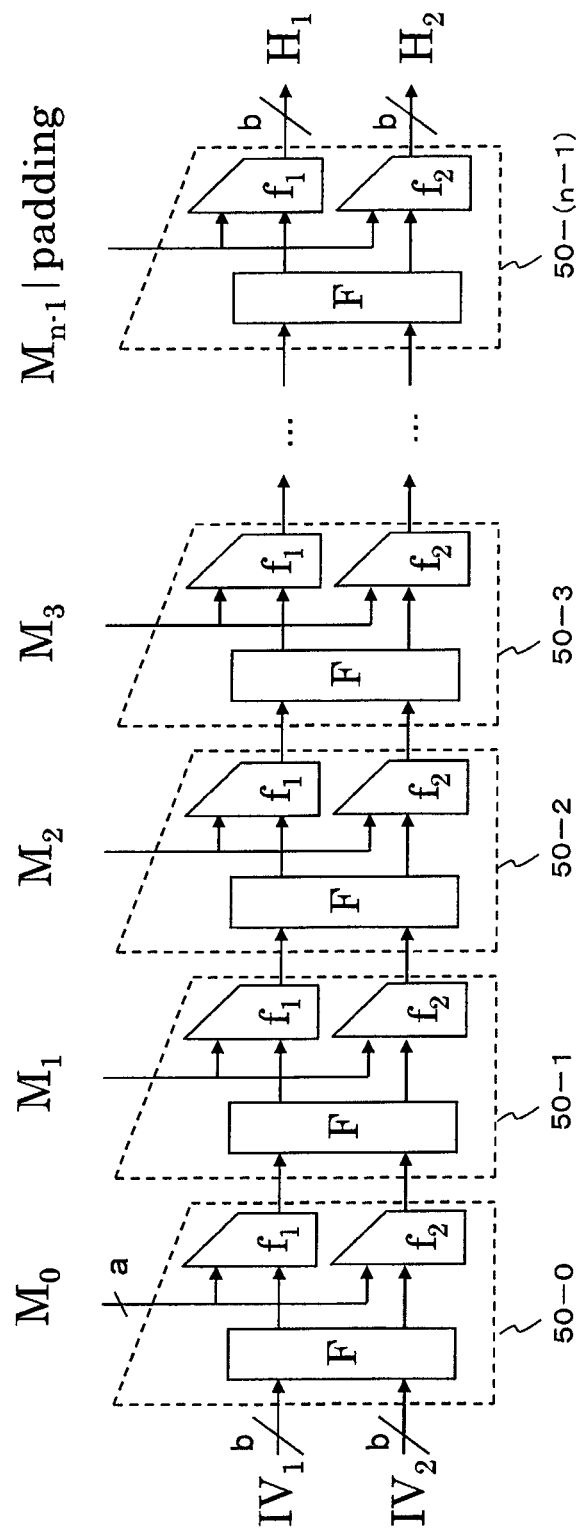
FIG. 5 is a diagram that explains an example of a hash function configuration in which compression function units 50 illustrated in FIG. 4 are linked as the MD construction.

FIG. 5 illustrates an example of a hash function configuration in which the compression function units 50 as illustrated in FIG. 4 are linked as the MD construction, for the domain extension that enables processing of a long input-bit length. A data conversion device illustrated in FIG. 5 includes a data conversion section formed by the MD construction. The configuration illustrated in FIG. 5 is formed by the data conversion section having the compression function units 50 described with reference to FIG. 4 in n stages. In other words, the data conversion device has the hash function execution section formed by the compression function units 50 in n stages, each of the compression function units 50 having the one stirring function F of 2b-bit input and output and the two-series compression functions $f_1$ and $f_2$ of a+b-bit input and b-bit output.

In the hash function illustrated in FIG. 5, repeated application is made by using the compression function units 50-0 to 50-$(n-1)$ as an n-stage configuration, and a 2b-bit hash value $(H_1|H_2)$ is output from the compression function unit 50-$(n-1)$ in the final stage.

To the compression function unit 50-0 in the first stage, a first a-bit $M_0$ among input bits $M_0$ through $M_{n-1}$ and two b-bit initial values $IV_1$ and $IV_2$ are input, and a b-bit output is produced by each of the compression functions $f_1$ and $f_2$, namely a 2b-bit output in total is output. Subsequently, the 2b-bit output from the compression functions $f_1$ and $f_2$ in the compression function unit in the previous stage and an a-bit input whose bits are constituent bits of the $M_0$ through $M_{n-1}$ are fed, and a 2b-bit output is produced. Afterwards, the same processing is repeatedly performed, and in the final stage, the 2b-bit output in the previous stage and an a-bit input formed by $M_{n-1}$ and padding data are fed, and b-bit outputs $H_1$ and $H_2$ are produced, i.e. the 2b-bit hash value $(H_1|H_2)$ is output.

This configuration shows that there is a sufficient degree of safety if the internal compression functions $f_1$ and $f_2$ and the stirring function F of the compression function unit 50 meet a property called a random oracle. The random oracle is a function that generates a random number in the inside and outputs the random number when being provided with an input, and outputs again a random number outputted in the past when being provided again with an input that is already given. Actually, it is realized by designing a function that approximates a behavior like the random oracle and computes an output by a decisive procedure requiring no generation of a random number and by performing replacement with the designed function. This configuration makes it possible to use, within the compression functions, components whose safety is readily assessed and processing is light and thus, it is possible to realize a hash function easy to design and high in efficiency.

According to the present embodiment, there is provided such a configuration that the stirring processing is performed at least on every fixed timing in a compression processing round formed by plural rounds and thus, the data conversion device that generates a hash value with an enhanced analysis resistance and a high degree of safety is realized.

Figure 6:
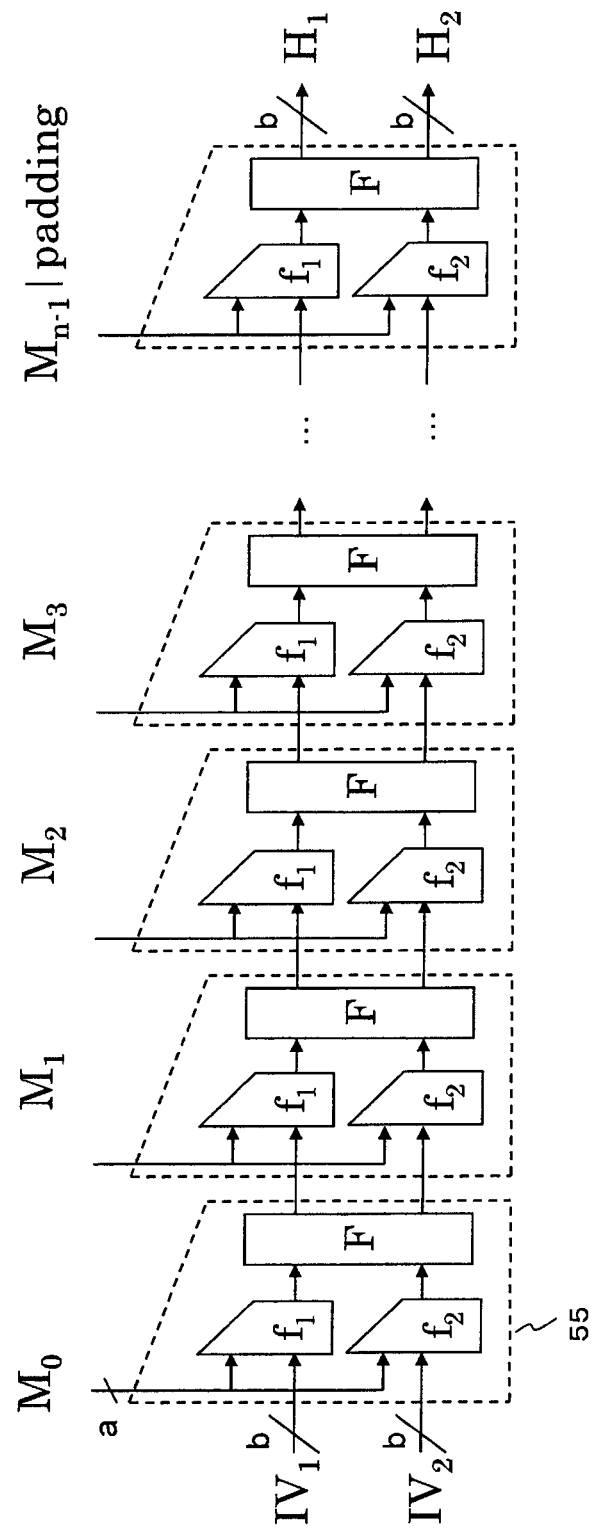
FIG. 6 is a diagram that explains a modification of the configuration illustrated in FIG. 5, and a configurational example of a hash function that uses a compression function unit 55 where the order of a stirring function F and compression functions $f_1$ and $f_2$ are interchanged.

Further, as a modification of the configuration illustrated in FIG. 5, there is a case in which a compression function unit 55 where the order of the stirring function F and the compression functions $f_1$ and $f_2$ are interchanged is used as illustrated in FIG. 6, and this case also can be used as a hash function having the same effects.

Figure 7:
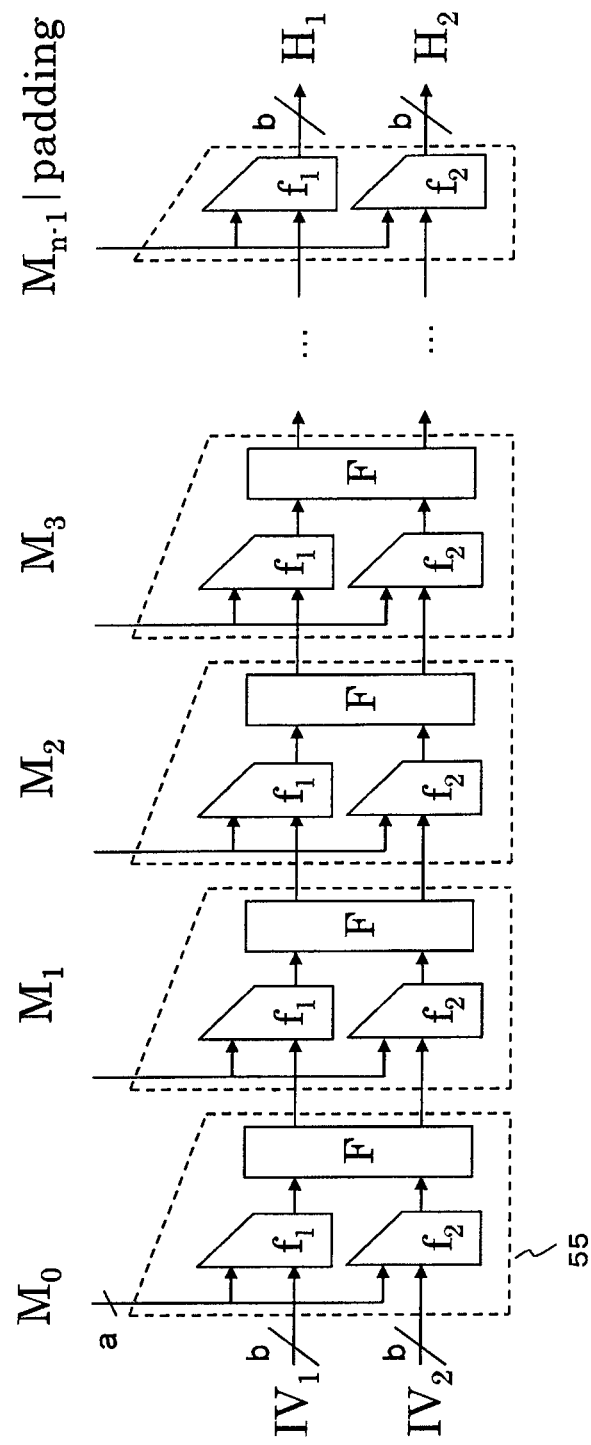
FIG. 7 is a diagram that explains a configurational example in which the stirring function F on the last part in the configuration illustrated in FIG. 6 is deleted.

Furthermore, as a modification of the configurations illustrated in FIG. 5 and FIG. 6, there is a configuration in which the stirring function F on the last part in the configuration illustrated in FIG. 6 is deleted as illustrated in FIG. 7, and this configuration also can be used as a hash function having the same effects in terms of safety. The same is also derived from the fact that this configuration is achieved by redefining the outputs of the first stirring function F as $IV_1$ and $IV_2$ in the configuration illustrated in FIG. 5.

In this way, it is possible to configure the hash function of 2b-bit output with a high degree of safety, by the compression functions of smaller b-bit output and the stirring function F, without creating a compression function dedicated to 2b-bit output.

Moreover, in the configurations illustrated in FIG. 5, FIG. 6 and FIG. 7, the number of bits of both of the respective output of the internal compression functions $f_1$ and $f_2$ in the compression function unit are b-bit, and it is configured such that there is an agreement in terms of median value, namely Chaining Variable, between the internal compression functions $f_1$ and $f_2$.

However, there is no need for the bit sizes of the chaining variables (CV) of these internal compression functions $f_1$ and $f_2$ to agree with each other. For example, there may be provided such a configuration that the internal compression function $f_1$ is set to output a b-bit chaining variable (CV), the internal compression function $f_2$ is set to output a c-bit chaining variable (CV), and the chaining variable (CV) as a whole is a b+c-bit variable. In this configuration as well, it is possible to realize the compression function unit by a configuration of smaller functions and thus, compression functions having confirmed safety and supporting a small bit size can be applied as the internal compression functions.

[3. Method of Improving Processing Efficiency in New Domain Extension Method]

Figure 8:
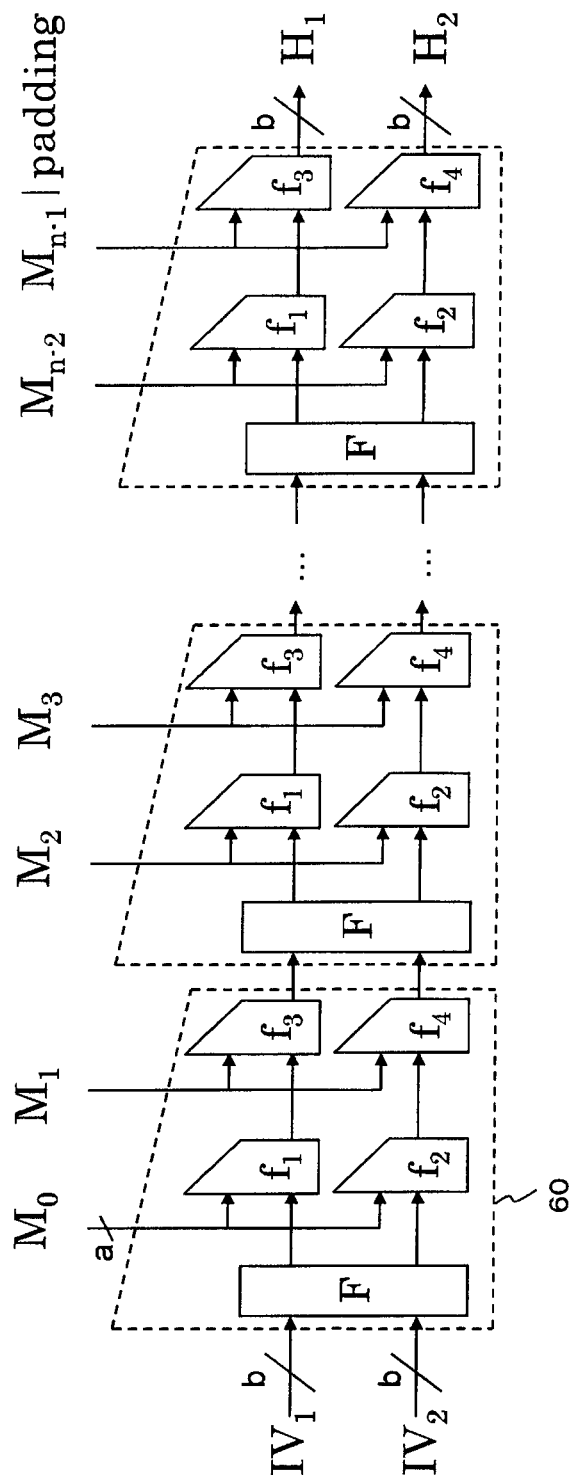
FIG. 8 is a diagram that explains a configurational example in which an interval for inserting the stirring function F is set for every two cycles of processing of the compression functions.

Subsequently, a configurational example of a hash function in which processing efficiency of the domain extension method described with reference to FIG. 5 and FIG. 6 is improved will be described with reference to FIG. 8. FIG. 8 is a configurational example of a hash function in which an interval for inserting the stirring function F is set for every two cycles of processing of the compression functions.

A compression function unit 60 is configured to include the stirring function F, internal compression functions $f_1$ and $f_3$ in two stages, and internal compression functions $f_2$ and $f_4$ in two stages. Incidentally, the four internal compression functions included in the compression function unit 60 are compression functions independent of each other. In other words, the four internal compression functions included in a region interposed between the two stirring functions F are independent compression functions.

To the compression function unit 60 in the first stage, two b-bit initial values $IV_1$ and $IV_2$ are input, and the stirring function F stirs the input 2b-bit data and produces a b-bit output to each of the compression functions $f_1$ and $f_2$. To the compression functions $f_1$ and $f_2$, the first a-bit $M_0$ among input bits $M_0$ through $M_{n-1}$ and the b-bit outputs from the stirring function F are input, and b-bit outputs are generated and fed to the compression functions $f_3$ and $f_4$ in a subsequent stage.

To the compression functions $f_3$ and $f_4$, an a-bit $M_1$ among the input bits $M_0$ through $M_{n-1}$ and the b-bit outputs from the compression functions $f_1$ and $f_2$ in the previous stage are input, and b-bit outputs are generated and fed to the stirring function F of the compression function unit in a subsequent stage.

Subsequently, the 2b-bit output from the compression functions in the compression function unit in the previous stage and a 2a-bit input with bits that are constituent bits of the $M_0$ through $M_{n-1}$ are fed, and a 2b-bit output is produced. Afterwards, the same processing is repeatedly executed, and in the final stage, the 2b-bit output from the previous stage, an a-bit $M_{n-2}$, and an a-bit input formed by $M_{n-1}$ and padding data are fed, and b-bit outputs $H_1$ and $H_2$ are produced, i.e. a 2b-bit hash value ($H_1|H_2$) is output.

In this configuration, the number of calls for the stirring function F at the time of processing a message of the same length is reduced as compared to the configuration illustrated in FIG. 5 and thus, processing efficiency is improved. Specifically, in the configuration illustrated in FIG. 5, processing required in the time during which two a-bit messages are processed uses the stirring function F twice and the compression function four times, whereas in the configuration illustrated in FIG. 8, this is performed by processing of using the stirring function F once and the compression function four times and thus, it is possible to reduce the processing of F by one time and promotion of efficiency in processing is realized.

Figure 9:
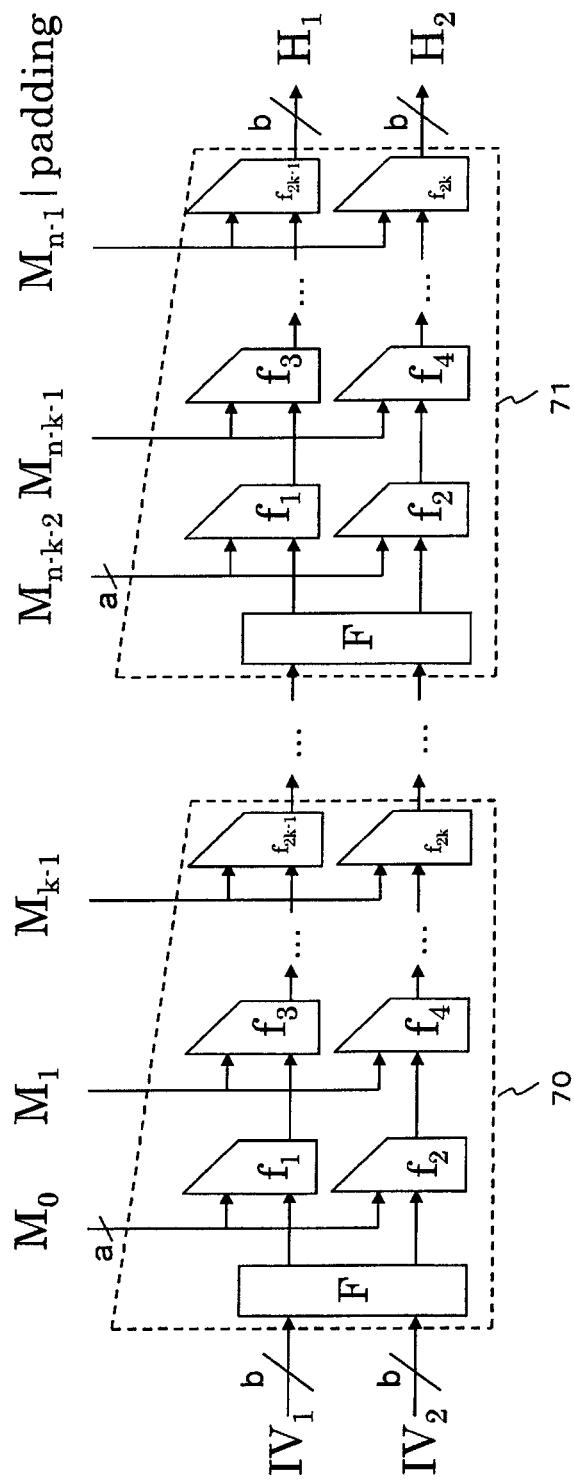
FIG. 9 is a diagram that explains a configurational example of a generalized hash function execution section in which the interval for inserting the stirring function F is set so that the stirring function F is inserted every k-th compression function.

In the configuration illustrated in FIG. 8, the stirring function F and the compression functions in two steps are set to be repeatedly performed. It is also possible to provide such a configuration that the number of processes in the stirring function is further reduced and the stirring function F is set for every three or more stages of compression functions. FIG. 9 illustrates a configurational example of a generalized hash function execution section in which the interval for inserting the stirring function F is set so that the stirring function F is inserted every k-th compression function. In the configuration illustrated in FIG. 9, a compression function unit 70 has a configuration including one stirring function F of 2-bit input and output, and two-series compression functions of a+b-bit input and b-bit output in a k stage.

To the compression function unit 70 in the first stage, two b-bit initial values $IV_1$ and $IV_2$ are input, and the stirring function F stirs the input 2b-bit data and produces a b-bit output to each of the compression functions $f_1$ and $f_2$ configured in two series. To the compression functions $f_1$ and $f_2$, the first a-bit $M_0$ among input bits $M_0$ through $M_{n-1}$ and the b-bit outputs from the stirring function F are input, and b-bit outputs are generated and fed to the compression functions $f_3$ and $f_4$ in a subsequent stage.

To the compression functions $f_3$ and $f_4$, an a-bit $M_1$ among the input bits $M_0$ through $M_{n-1}$ and the b-bit outputs from the compression functions $f_1$ and $f_2$ in the previous stage are input, and b-bit outputs are generated and fed to the next compression functions. Afterwards, the output from the compression functions in the previous stage and the a-bit input with bits that form the input bits $M_0$ through $M_{n-1}$ are fed to the compression functions in a subsequent stage and each b-bit output is produced, which are repeated k times, and the output from the k-th compression functions in two series is input to the stirring function F of the next compression function unit 71.

Processing of the compression function unit 71 is similar to the processing of the compression function unit 70. However, bit data in the latter half of the input bits $M_0$ through $M_{n-1}$ and padding data are input. Ultimately, from the compression functions in two series in the final stage of the compression function unit 71, b-bit outputs $H_1$ and $H_2$ are produced, i.e. a 2b-bit hash value ($H_1|H_2$) is output.

Incidentally, the interval of inserting the stirring function F is a value determined in a range not to compromise safety, according to an output length $2b$ serving as a hash value. For example, there is a configuration in which k=8 when b=256. The larger the k is, the more the processing efficiency improves.

The configuration illustrated in FIG. 9 is a configuration in which, like the configuration in FIG. 5, the initial values are input to the stirring function F and the compression functions in two series are set in a stage subsequent to the stirring function F, but it is also possible to provide a configuration of using a compression function unit in which first, the initial values are input to the compression functions in two series described with reference to FIG. 6 and the like, and after the compression functions in two series are performed in plural stages, the stirring function F is finally executed.

[4. Method of Implementing Stirring Function F]

Figure 10:
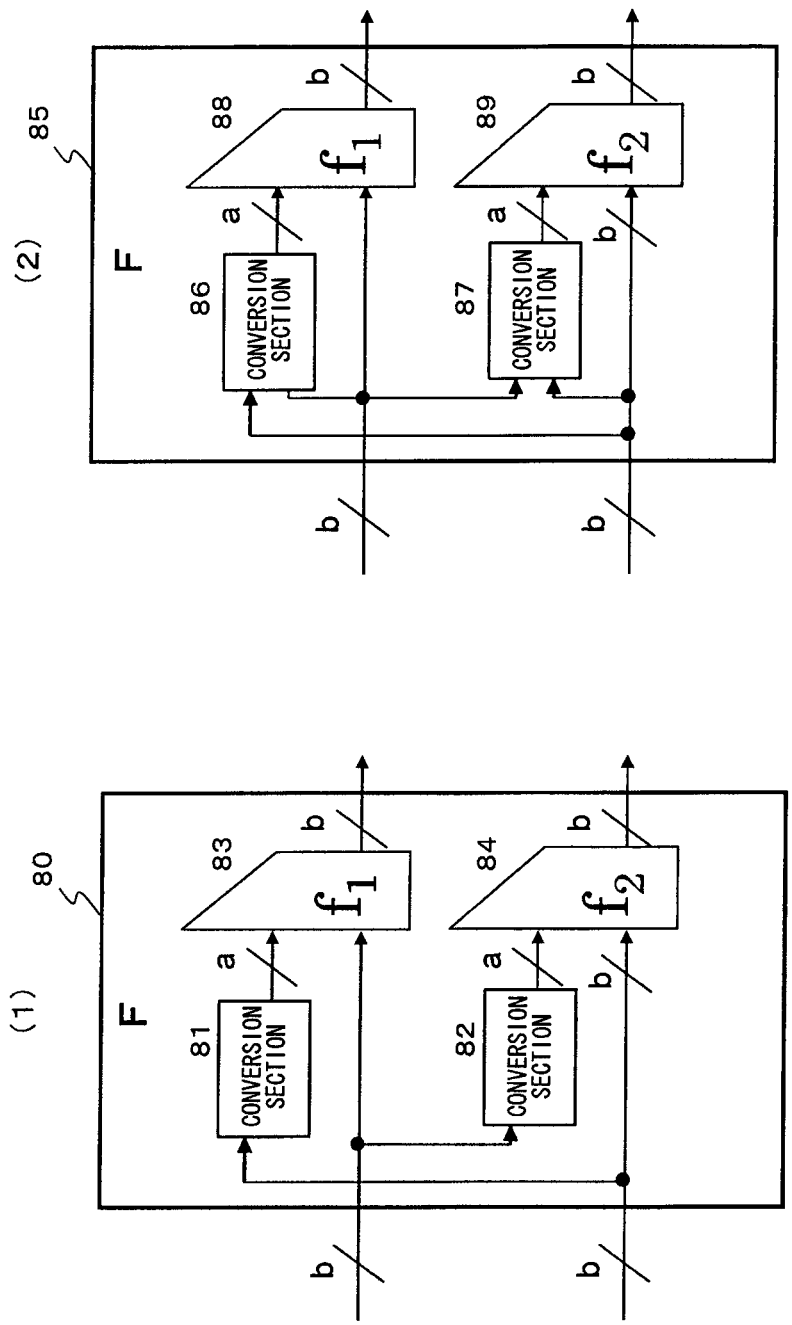
FIG. 10 is a diagram that explains a configurational example in which the stirring function F is implemented by using two compression functions.

The stirring function F is a function that stirs input bits and outputs data whose number of bits is equal to number of bit in the input data. A specific configuration of implementing the stirring function will be described with reference to FIG. 10. FIG. 10 is a configuration in which the stirring function F is implemented by using two compression functions.

A stirring function F 80 illustrated in FIG. 10(1) is an example in which the stirring function F 80 of 2b-bit input and output is implemented by: two conversion sections 81 and 82 of b-bit input and a-bit output; and two compression functions 83 and 84 of a+b-bit input and b-bit output. Two pieces of b-bit data resulting from division and input to the stirring function F 80 are respectively supplied as b-bit portions of inputs to the compression functions 83 and 84.

Further, at the same time, the respective pieces of b-bit data are input to the conversion sections 81 and 82, converted into pieces of a-bit data, and supplied as a-bit portions of input data to the conversion functions 83 and 84. The conversion sections 81 and 82 may only need to perform simple processing for adjusting the bit length, and can be implemented by, for example, a simple processing configuration such as extension by copying bits and XOR.

It is desirable that the conversion sections 81 and 82 be set to meet the following condition. In other words, setting is made so that every bit of 2b-bit input of the stirring function F 80 affects the a+b-bit input of each of the conversion functions 83 and 84. The stirring function F can be formed by the configuration illustrated in FIG. 10 and as a result, it is possible to implement the stirring function F by a scale of processing required for the two compression functions.

A stirring function F 85 illustrated in FIG. 10(2) is an example in which an input to each of conversion sections 86 and 87 is a 2b-bit input. The conversion sections 86 an 87 are each formed by a function that links two pieces of b-bit data in a case of a>b and reduces the data, thereby creating a-bit by a simple operation such as XOR. It is also desirable to set the conversion sections 86 and 87 to meet the following condition. In other words, setting is made so that every bit of 2b-bit input of the stirring function F 85 affects an a+b-bit input to each of conversion functions 88 and 89. In this configuration as well, it is possible to implement the stirring function F by a scale of processing required for the two compression functions.

The configurations of the stirring functions F in this FIG. 10 can be used as the stirring function F in the configuration of the hash function with reference to FIG. 5 through FIG. 9. By using such a configuration, it is possible to implement the stirring function F by reusing the compression function originally set in the compression function unit in FIG. 5 through FIG. 9. Such sharing of components produces gate-scale reduction effects at the time of mounting hardware, and makes it possible to reduce the size of the device and the cost.

[5. Generalization of Domain Extension Method]

The hash function having the MD construction described with reference to FIG. 5 through FIG. 9 is the configuration in which the output of the one stirring function F is input to the compression functions in two series or the configuration in which the output of the compression functions in two series is input to the one stirring function F. In other words, the compression function is set to employ two series.

Figure 11:
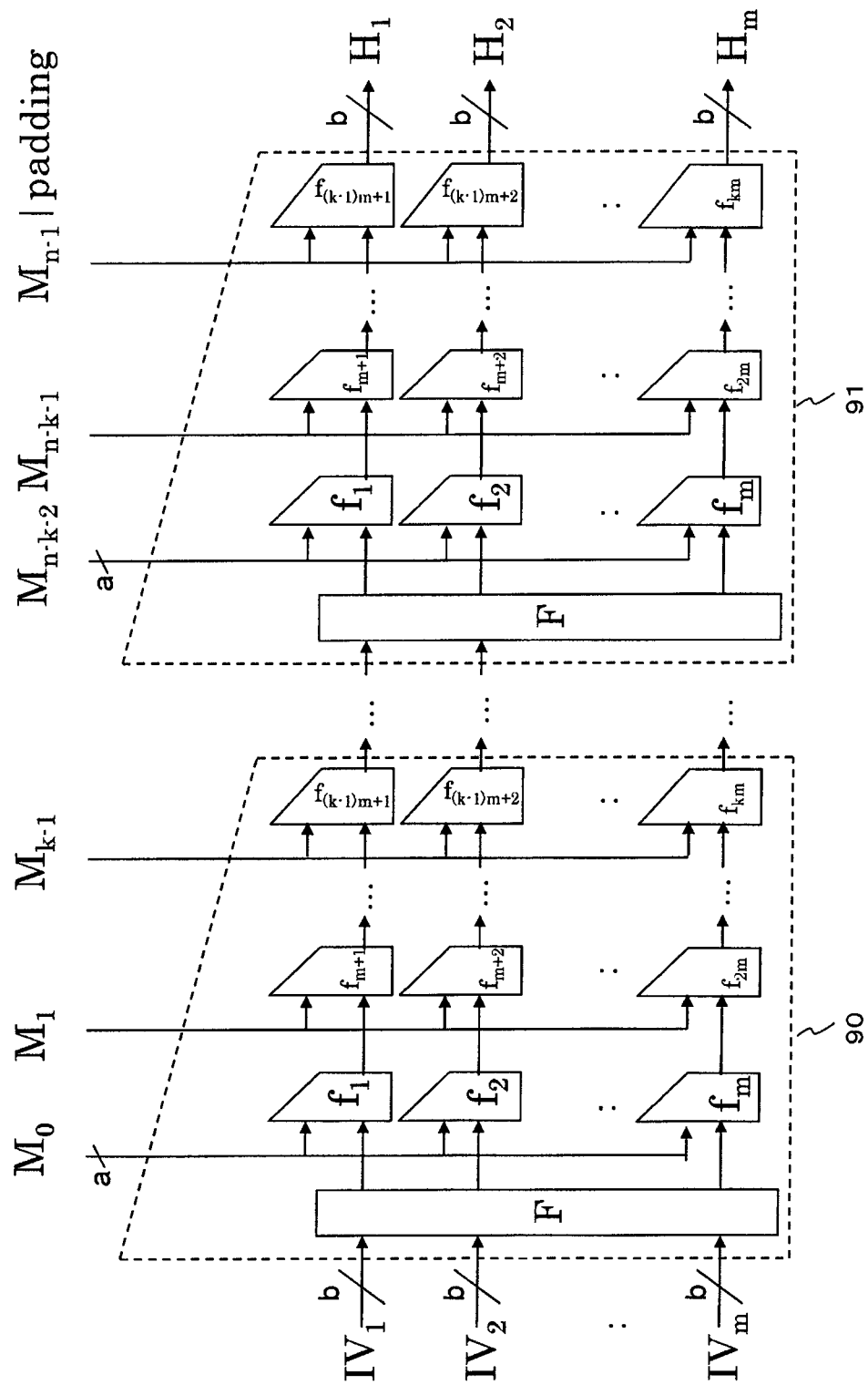
FIG. 11 is a diagram that explains an example of a generalized configuration of a hash function where the number of series is m, and m is an integer not less than 2.

The number of series of the compression functions is not limited to two, and the configuration may use three or more series. FIG. 11 illustrates an example of a generalized configuration of a hash function where the number of series is m, and m is an integer not less than 2.

The configuration in FIG. 11 is a configuration in which based on the configuration illustrated in FIG. 9, the number of series of the compression function is changed from 2 to m. A compression function unit 90 includes a stirring function F of mb-bit input and output, and plural stages of compression functions configured in m series. Each of compression functions f1 to fm, the number of which is m, in the first stage, is fed a b-bit part from bit data of the mb-bit output from the function F, and the first a-bit $M_0$ among input bits $M_0$ to $M_{n-1}$, and produces a b-bit output that is input to compression functions in a subsequent stage. Each of the m-series of compression functions in a k stage is fed an output from the compression function in the previous stage and an a-bit M of the input bits $M_0$ to $M_{n-1}$, and produces a b-bit output. After processing of the compression functions in the k stage, an mb-bit output of the compression functions in the final stage of the compression function unit 90 is input to the stirring function F of the next compression function unit.

A 2 mb-bit output, which is the sum of outputs $H_i$ to $H_m$ of the b-bit output from each of the compression functions whose number is m in the final stage of a compression function unit 91 in the final stage, is produced as a hash value $(H_1|H_2|\ldots|H_m)$. The obtained hash value $H_1, H_2, \ldots, H_m$ is of mb-bit in maximum. By this technique, it is possible to implement a hash function having an output of a longer size.

[6. Generalization of Configuration of Stirring Function F]

Next, a generalized configuration of the stirring function F will be described. The specific configuration of the stirring function F has been described above with reference to FIG. 10. The stirring function F described with reference to FIG. 10 is the configuration to which the compression functions in two series are applied.

Figure 12:
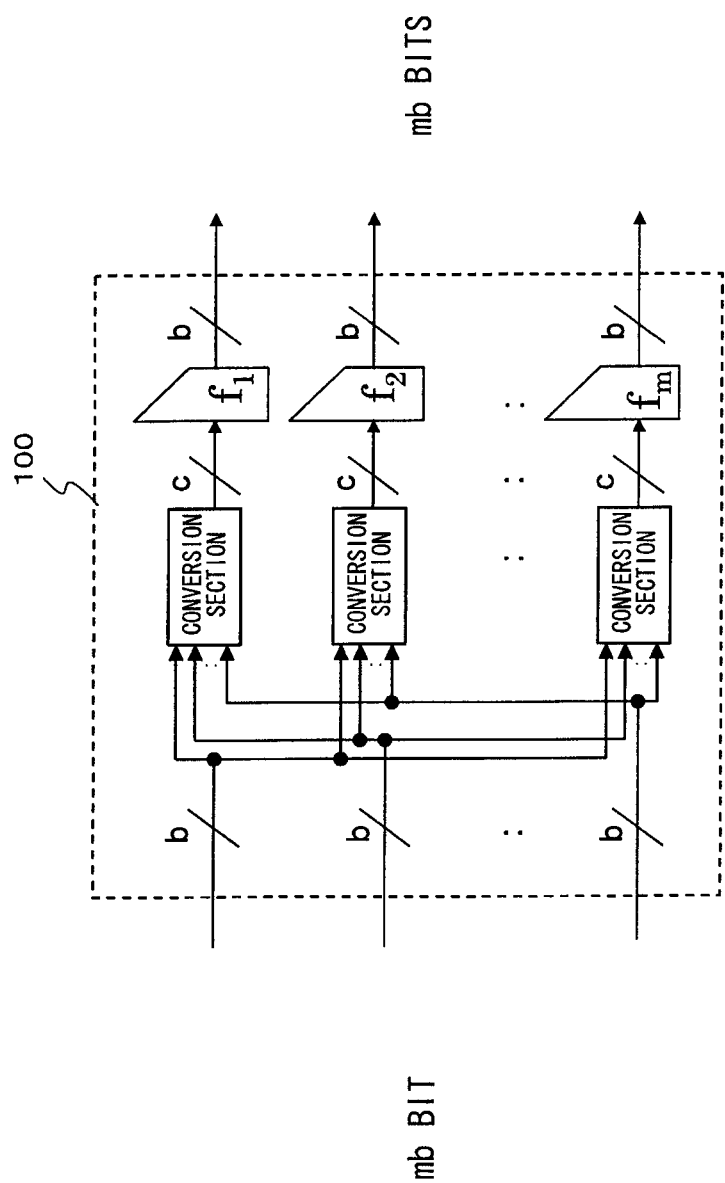
FIG. 12 is a diagram that explains a configurational example of the stirring function F of mb-bit input and output.

FIG. 12 illustrates an example of the generalized configuration of the stirring function F of mb-bit input and output. A stirring function F 100 illustrated in FIG. 12 is formed by compression functions f1 to fm of c-bit input and b-bit output in m series, and conversion sections the number of which is m in the previous stage.

In the example illustrated in FIG. 12, the size of an input to each of the m types of different compression functions f1 to fm is assumed to be c-bit. In order that all the input bits affect each of the compression functions f1 to fm, every mb-bit input is supplied to the conversion section once and reduced to meet the input size of the compression function. In the conversion section, a c-bit output is generated from the mb-bit input by, for example, an exclusive OR (XOR), bit-size expansion processing, or the like.

The condition required of the conversion section is to make every bit of the mb-bit serving as the input bit to the stirring function F affect any bit of the c-bit output. This can be realized by a simple operation. For example, in a case of c=mb, the conversion section may link and output inputs directly.

[7. About Use of Different Compression Functions]

In the above description, in the compression function unit having the plural series of compression functions f1, f2 . . . fm configured in multiple stages, the plural series of compression functions f1, f2 . . . fm in the compression function unit have been described as having different structures. This is a configuration that can objectively show that the degree of safety is highest, but the safety is not impaired immediately even when a single compression function is used. There is a case in which repeated use of a single compression function is advantageous in term of implementation and thus, a configuration in which all the compression functions are the same is also possible as another embodiment. Moreover, a single compression function may not be used, and a configuration in which fewer types of compression functions are repeatedly used can also be possible likewise.

[8. Method of Efficiently Implementing Internal Processing of Compression Function]

Figure 13:
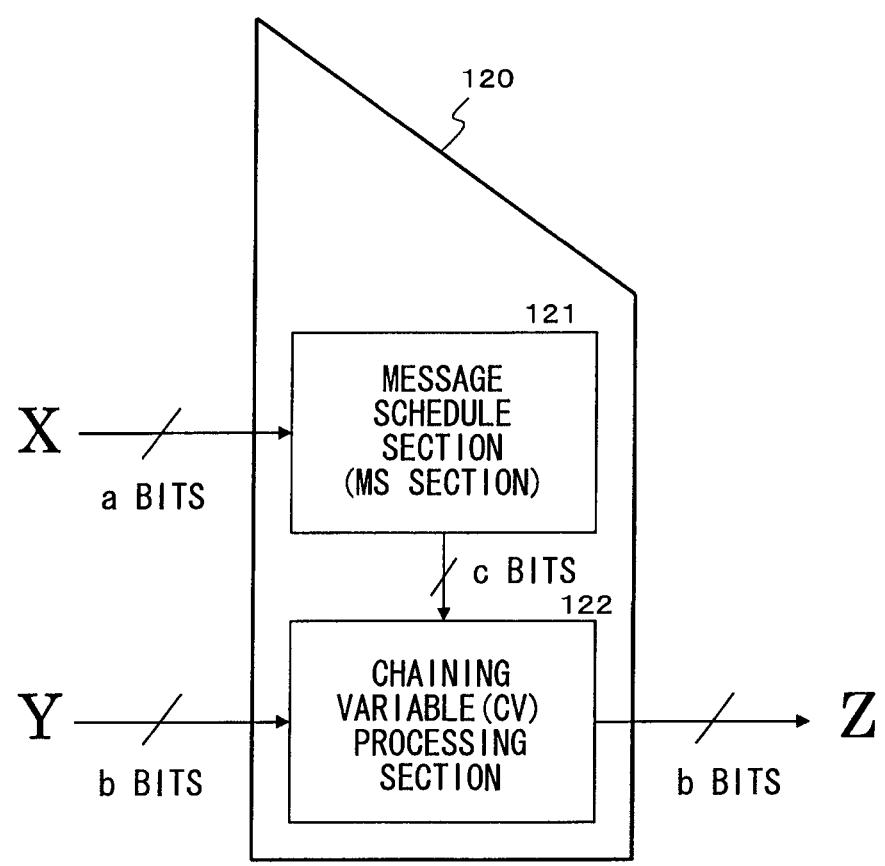
FIG. 13 is a diagram that explains an internal configuration example of the compression function f.

Next, there will be described a specific configurational example of a compression function fi set in the compression function unit described above. An internal configuration example of the compression function f is illustrated in FIG. 13. FIG. 13 is a configurational example of the compression function fi set in the compression function unit described with reference to FIG. 5 through FIG. 12, and further, the compression function fi usable as a constituent element of the stirring function F.

As illustrated in FIG. 13, a compression function 120 has a message schedule section (MS section) 121 and a chaining variable (CV) processing section 122. A [X]a-bit input of an a+b-bit input to the compression function 120 is fed to the message schedule section (MS section) 121, and the remaining [Y]b-bit input is fed to the chaining variable (CV) processing section 122.

The Message Schedule section (MS section) 121 generates and inputs a c-bit output to the chaining variable (CV) processing section 122, through message schedule processing based on the a-bit input. The chaining variable (CV) processing section 122 receives a b+c-bit input made up of the b-bit input to the compression function 120 and the c-bit input from the message schedule section (MS section) 121, and generates a b-bit output [Z] as an output of the compression function 120.

Figure 14:
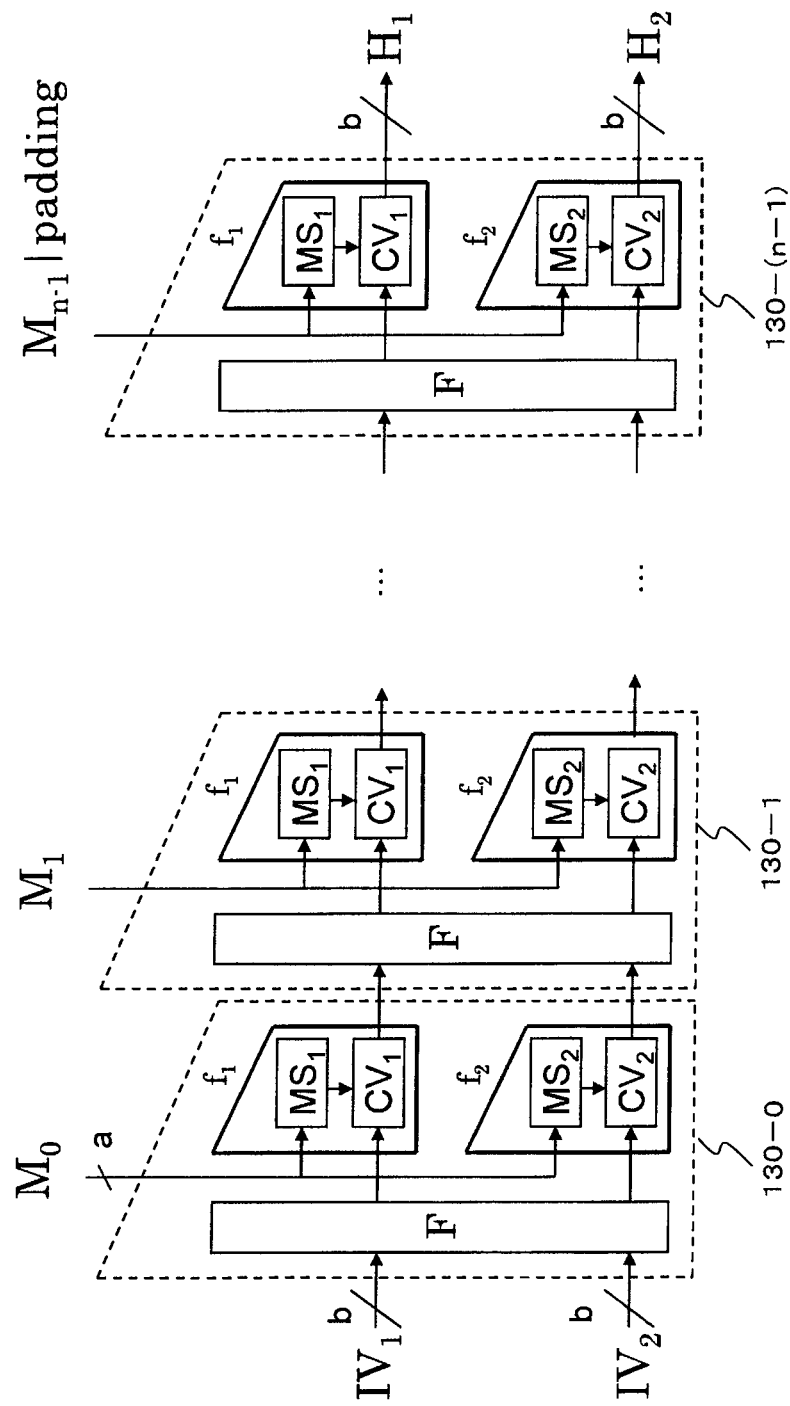
FIG. 14 is a diagram that explains a configurational example in which the compression function formed by a message schedule section (MS section) and a chaining variable (CV) processing section is set in the hash function having the MD construction.

FIG. 14 illustrates a configurational example in which the compression function illustrated in this FIG. 13, namely the compression function formed by the message schedule section (MS section) and the chaining variable (CV) processing section, is set in the hash function having the MD construction described earlier with reference to FIG. 5.

A compression function unit 130 illustrated in FIG. 14 is formed by, in a manner similar to the earlier description with reference to FIG. 5, the stirring function F and the two series of compression functions f1 and f2. These compression functions f1 and f2 each have the configuration described with reference to FIG. 13. In other words, this is the compression function formed by the message schedule section (MS section) and the chaining variable (CV) processing section.

In the example illustrated in FIG. 14, the message schedule sections (MS sections) in the two types of compression functions f1 and f2 are illustrated as MS1 and MS2, respectively, and the chaining variable (CV) processing sections are illustrated as CV1 and CV 2, respectively. This configuration makes it possible to realize a hash function. In the following, a configuration that realizes further improvement in processing efficiency will be described.

In each of compression function units 130-0 to 130-($n$-1) illustrated in FIG. 14, a message Mi is input to the message schedule sections (MS sections) MS1 and MS2 in the two compression functions, concurrently. Therefore, the message schedule section can be shared between the two series of compression functions arranged vertically, which makes it possible to reduce the processing.

Figure 15:
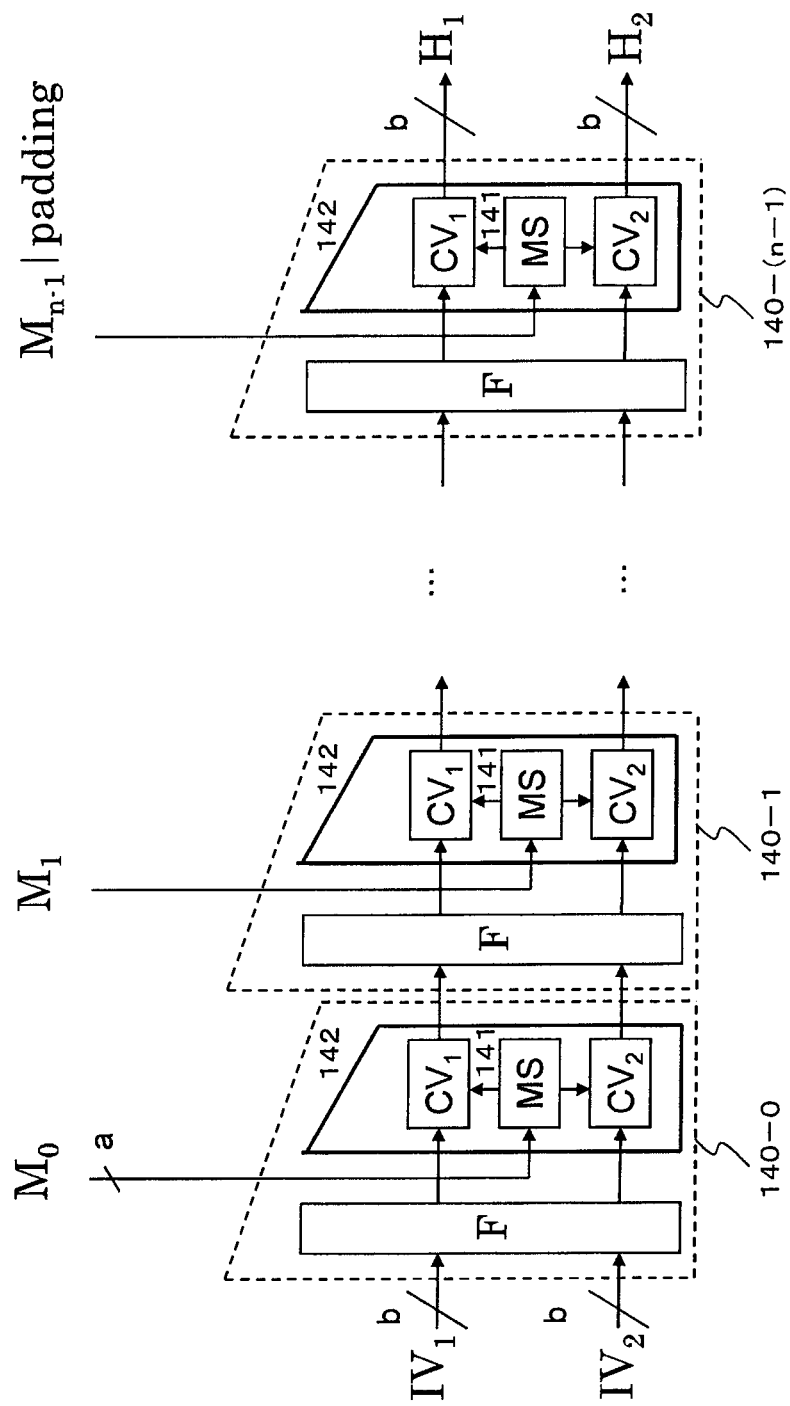
FIG. 15 is a diagram that explains a configurational example of a hash function in which the message schedule section is shared.

FIG. 15 illustrates a configurational example of the hash function in which the message schedule section is shared. In FIG. 14, there is set a compression function 142 in which the message schedule sections of the two vertical compression functions included in each of the compression function units 130-0 to 130-($n$-1) are tuned into a shared single message schedule section (MS section) 141. When the configuration of the compression function 142 having this single message schedule section (MS section) 141 is applied, arithmetic processing of the single message schedule section (MS section) performed in a single compression function unit 140 is performed only once, making it possible to reduce necessary arithmetic processing. For example, reduction in the size of hardware configuration and simplification of a processing step are realized.

The configuration of sharing the message schedule section in the plural compression functions described with reference to FIG. 15 can be applied to the above-described plural hash configurations. In other words, this configuration can be also applied to the compression function units having the plural series of compression functions and the compression functions in the stirring function F described with reference to FIG. 5 to FIG. 12.

[9. Method of Extending Input Message Length]

Figure 16:
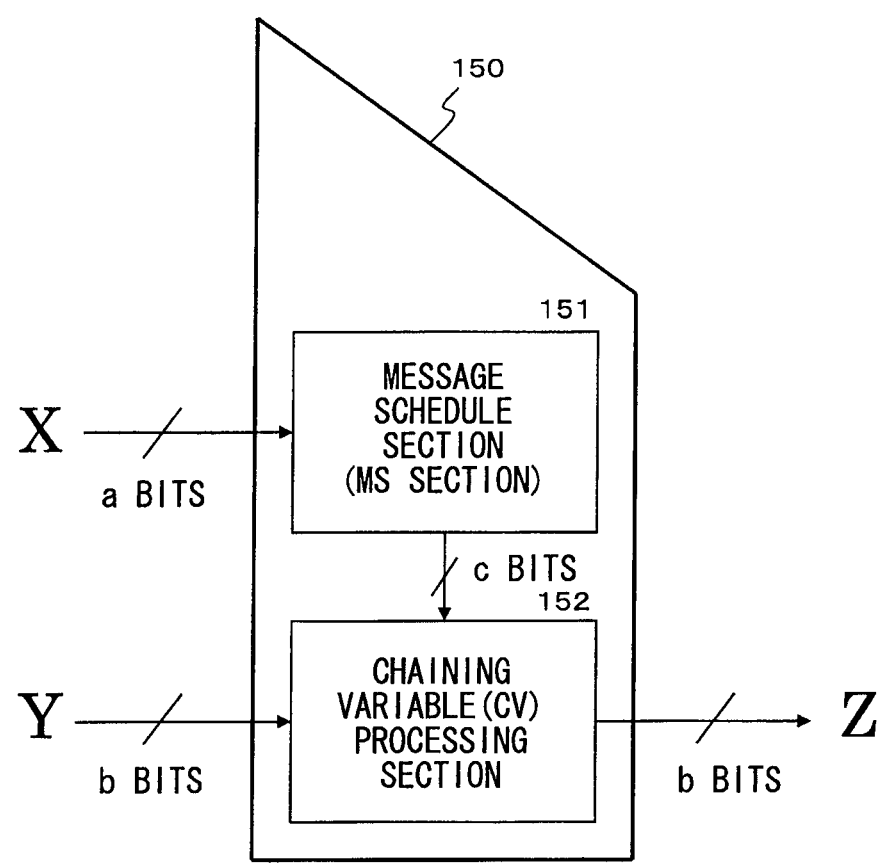
FIG. 16 is a diagram that explains a configurational example of a compression function in which an input message size in the compression function is expanded.

Next, a method of extending an input message size in the compression function will be discussed. A compression function 150 illustrated in FIG. 16 is formed by, like the compression function 120 described with reference to FIG. 13, a message schedule section (MS section) 151 and a chaining variable (CV) processing section 152. The compression function 120 described earlier with reference to FIG. 13 is the configuration in which the a-bit input serves as the message input to the message schedule section (MS section) 121. In contrast, the compression function 150 illustrated in FIG. 16 has the message schedule section (MS section) 151 supporting a 2a-bit input.

Generally, a function supporting an a-bit input and a function supporting a 2a-bit input are different, and must be evaluated based on different safety evaluation criteria. Therefore, where possible, it is desirable to combine the functions supporting the a-bit input and having safety and performance that have been evaluated, thereby configuring a message schedule section supporting 2a-bit. Further, this also makes it possible to reuse other existing function supporting the a-bit input. A specific configurational example of the function will be described later and here, there will be described a method of configuring a compression function supporting an input of 2a-bit or more, by using the function supporting the a-bit input.

Figure 17:
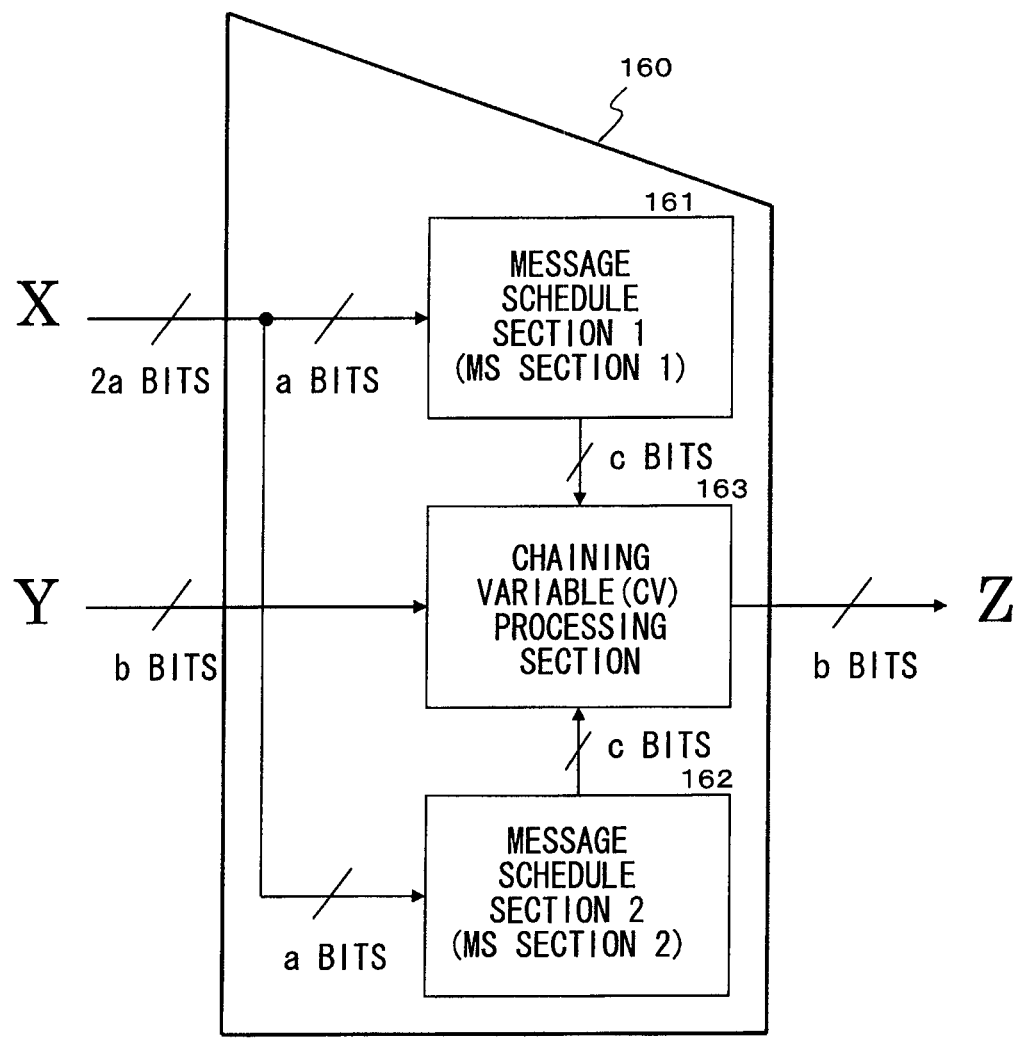
FIG. 17 is a diagram that explains a configurational example of a compression function having a configuration in which the message schedule section is divided into two parts.

FIG. 17 illustrates a configurational example of a compression function 160 having a configuration in which the message schedule section is divided into two parts. After an input message 2a-bit data to the compression function 160 is divided into two a-bit data pieces, processing of generating c-bit outputs in the respective message schedule sections 161 and 162 is performed. The c-bit outputs of the respective two message schedule sections 161 and 162 are both supplied to a chaining variable (CV) processing section 163.

The chaining variable (CV) processing section 163 receives the c-bit outputs of the two message schedule sections 161 and 162 and a b-bit input to the compression function 160, and generates and outputs a b-bit output [Z] that is an output of the compression function. An advantage of this configuration is that the compression function that implements the 2a-bit message input by using the function (message schedule section) supporting the a-bit input shorter than 2a-bit can be configured.

Figure 18:
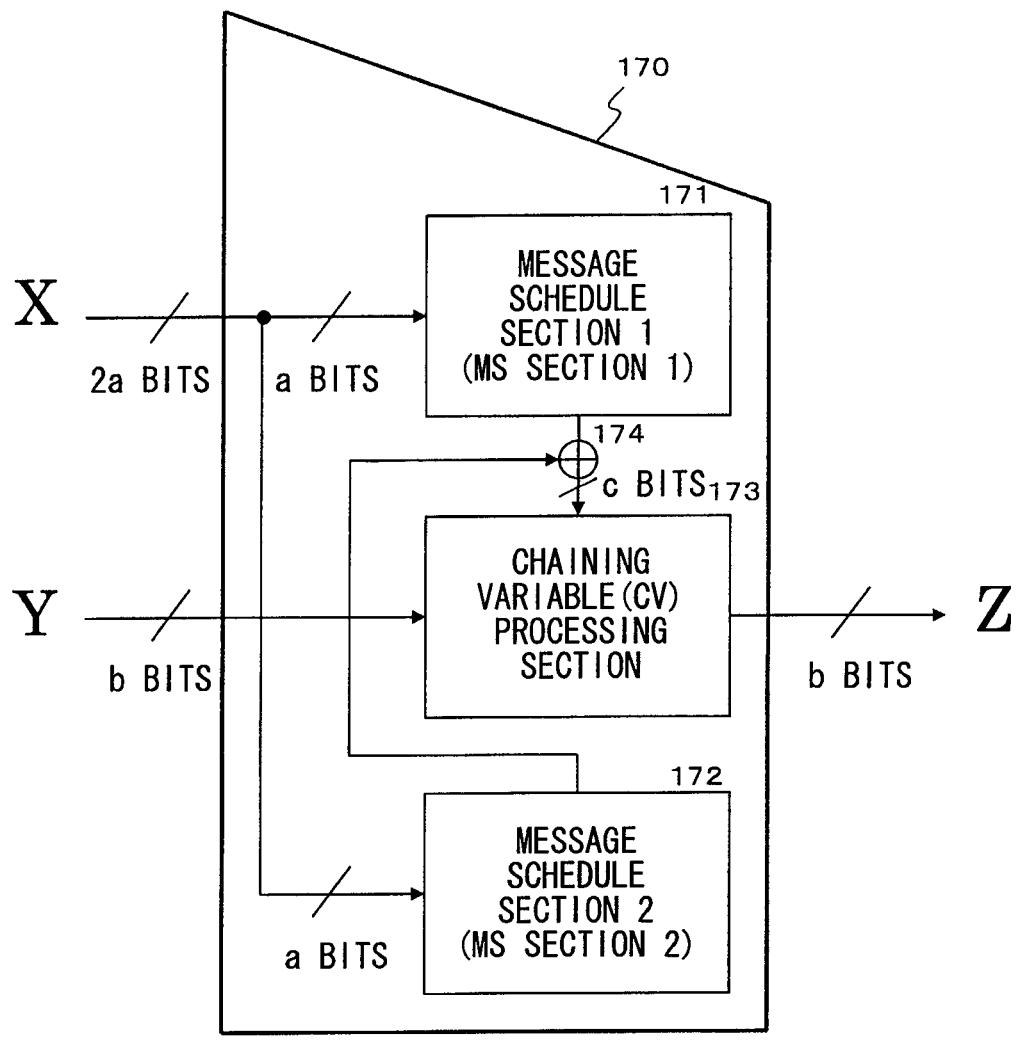
FIG. 18 is a diagram that explains a configurational example of a compression function having a configuration in which the message schedule section is divided into two parts and having an exclusive OR (XOR) operation section.

A compression function 170 illustrated in FIG. 18 is a configurational example of the compression function 170 having a configuration in which the message schedule section is divided into two parts, like the compression function 160 illustrated in FIG. 17. This compression function 170 has an exclusive OR (XOR) operation section 174.

After an input message 2a-bit data to the compression function 170 is divided into two a-bit data pieces, processing of generating c-bit outputs in the respective message schedule sections 171 and 172 is performed. The c-bit outputs of the respective two message schedule sections 171 and 172 are both supplied to a chaining variable (CV) processing section 173, after an exclusive OR (XOR) operation is performed in the exclusive OR (XOR) operation section 174.

This is a configuration in which the outputs of the two message schedule sections are once processed in the exclusive OR (XOR) operation section 174 and then supplied to the chaining variable (CV) processing section 173. An advantage of this configuration is that the inside of the chaining variable (CV) processing section 173 can be simplified by preventing an increase in the size of the message received by the chaining variable (CV) processing section 173. Incidentally, the exclusive OR (XOR) part may be replaced with modulo addition processing.

Figure 19:
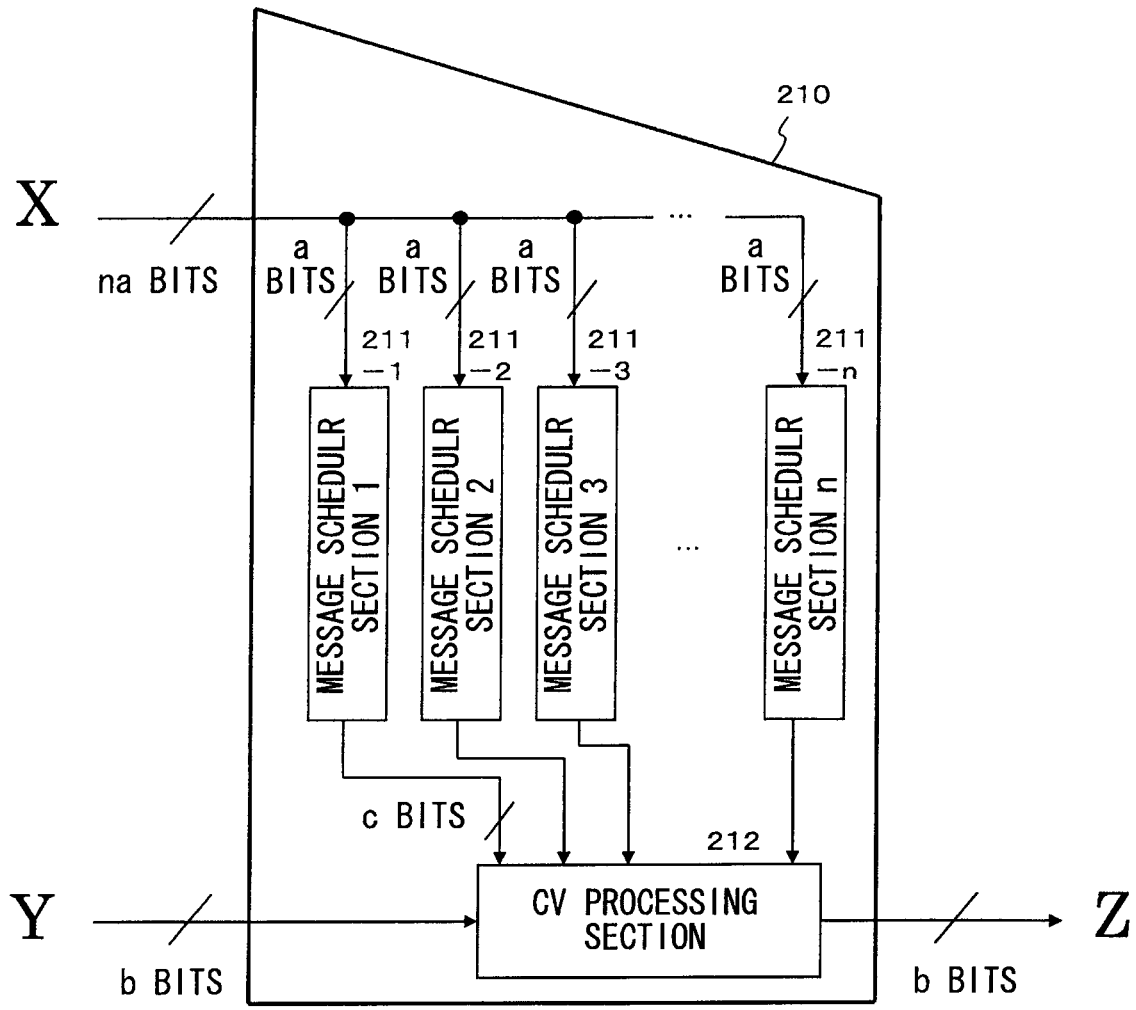
FIG. 19 is a diagram that explains a configurational example of a compression function in which the configuration of the compression function illustrated in FIG. 17 is generalized and set to support an na-bit input.

FIG. 19 illustrates a configurational example of a compression function 210 in which the configuration of the compression function 160 illustrated in FIG. 17 is generalized and set to support an na-bit input. An na-bit message input to the compression function 210 is divided into a-bit messages the number of which is n, and each of the a-bit messages is processed in message schedule sections (MS sections) 211-1 to 211-$n$ which each support an a-bit input independently, so that the message schedule sections (MS sections) 211-1 to 211-$n$ generate c-bit outputs.

The c-bit outputs of the respective message schedule sections (MS sections) 211-1 to 211-$n$ are supplied to a chaining variable (CV) processing section 212. The chaining variable (CV) processing section 212 receives an nc-bit output of the message schedule sections (MS sections) 211-1 to 211-$n$ the number of which is n, and a b-bit input to the compression function 210, and generates and outputs a b-bit output [Z] that is an output of the compression function.

This configuration also has an advantage similar to that described earlier with reference to FIG. 17. In other words, it is possible to configure a compression function that realizes an na-bit message input by using the function (message schedule section) that supports an input of a-bit shorter than na-bit.

Figure 20:
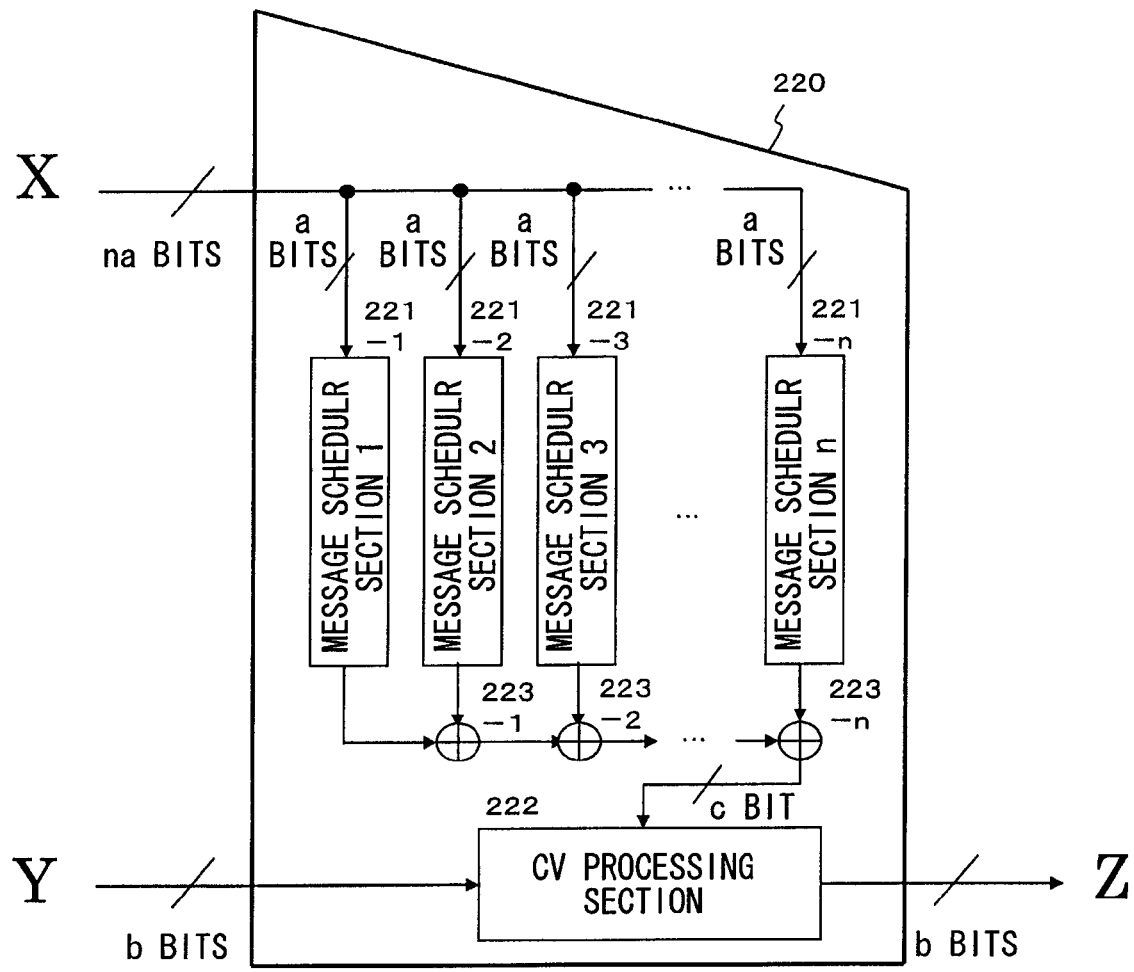
FIG. 20 is a diagram that explains a configurational example of a compression function in which the configuration of the compression function illustrated in FIG. 18 is generalized and set to support an na-bit input.

FIG. 20 illustrates a configurational example of a compression function 220 in which the configuration of the compression function 170 illustrated in FIG. 18 is generalized and set to support an na-bit input. An na-bit message input to the compression function 220 is divided into a-bit messages the number of which is n, and each of the a-bit messages is processed in message schedule sections (MS sections) 221-1 to 221-$n$ which each support an a-bit input independently, so that the message schedule sections (MS sections) 221-1 to 221-$n$ generate c-bit outputs.

The c-bit outputs of the respective message schedule sections (MS sections) 221-1 to 221-$n$ are XORed in exclusive OR (XOR) operation sections 223-1 to 223-$n$ and then supplied to a single chaining variable (CV) processing section 222. Upon receipt of the c-bit output of the exclusive OR (XOR) operation section 223-$n$ and a b-bit input to the compression function 220, the chaining variable (CV) processing section 222 generates and outputs a b-bit output [Z] that is an output of the compression function. With this configuration as well, it is possible to configure a compression function that realizes an na-bit message input by using the function (message schedule section) that supports an input of a-bit shorter than na-bit. Incidentally, a configuration in which the exclusive OR (XOR) processing section is replaced with a modulo addition processing section is also possible.

In this way, the data conversion device according to one embodiment of the present invention has a configuration that has a plurality of processing series to which pieces of data into which a message data is divided are input in parallel, and that executes data conversion processing to which plural compression function execution sections (f) are applied.

Each of the plural compression function execution sections (f) is configured to perform: processing to which a message schedule section (MS section), which carries out message schedule processing by receiving inputs of pieces of data which are divisions of the message data, is applied; and processing to which the chaining variable (CV) processing section, which receives an output of the message schedule section (MS section) and an input of a median value (chaining variable) that is an output from the processing section in the previous stage and generates output data whose number of bits is equal to number of bits in the median value by compression of the input data, is applied.

The plural compression function execution sections, which perform processes in parallel in the plurality of processing series, share one or both of the message schedule section (MS section) and the chaining variable (CV) processing section, and performs processing using a single message schedule section or a single Chaining Variable processing section. This configuration realizes, for example, reduction in the size of hardware configuration and simplification of a processing step.

[10. Hash Function Implementing Method Using Repeated Type of Transposition for CV Processing Section and MS Section]

As described above, the compression function can be realized by having the message schedule section (MS section) and the chaining variable (CV) processing section as constituent elements. Specific configurational examples of these message schedule section (MS section) and chaining variable (CV) processing section will be described.

As the message schedule section (MS section) and the chaining variable (CV) processing section, those based on a transposition function are generally known. For example, SHA-1, Whirlpool and the like known as hash functions have a transposition-function-based configuration.

It is desirable that the transposition function applied to the message schedule section (MS section) and the chaining variable (CV) processing section have high stirring performance.

A configurational example of a transposition function whose stirring performance is improved by repeatedly applying a relatively simple transposition function will be described. In the following description, a relatively simple transposition repeated in the transposition function will be referred to as "internal transposition" and transposition that can be performed as a result of that transposition will be referred to as "overall transposition."

Incidentally, the transposition function is a function that generates an output value based on an input value such that an input and output are the same in size and the respective input and output values are in a one-to-one correspondence. Incidentally, for the transposition function, an inverse function exists because of this property.

Inside the overall transposition, it is possible to perform addition of data externally to intermediate data between two internal transposition processes, and output the intermediate data to the outside of the function. In the compression function, there is a case in which by using this intermediate data, data input to a position other than the original input and output of the overall transposition, and output of additional data are performed. Such data given to one other than the original input is referred to as an added input, and when the intermediate data is made to be an output other than the original output, the data is referred to an intermediate output.

Figure 21:
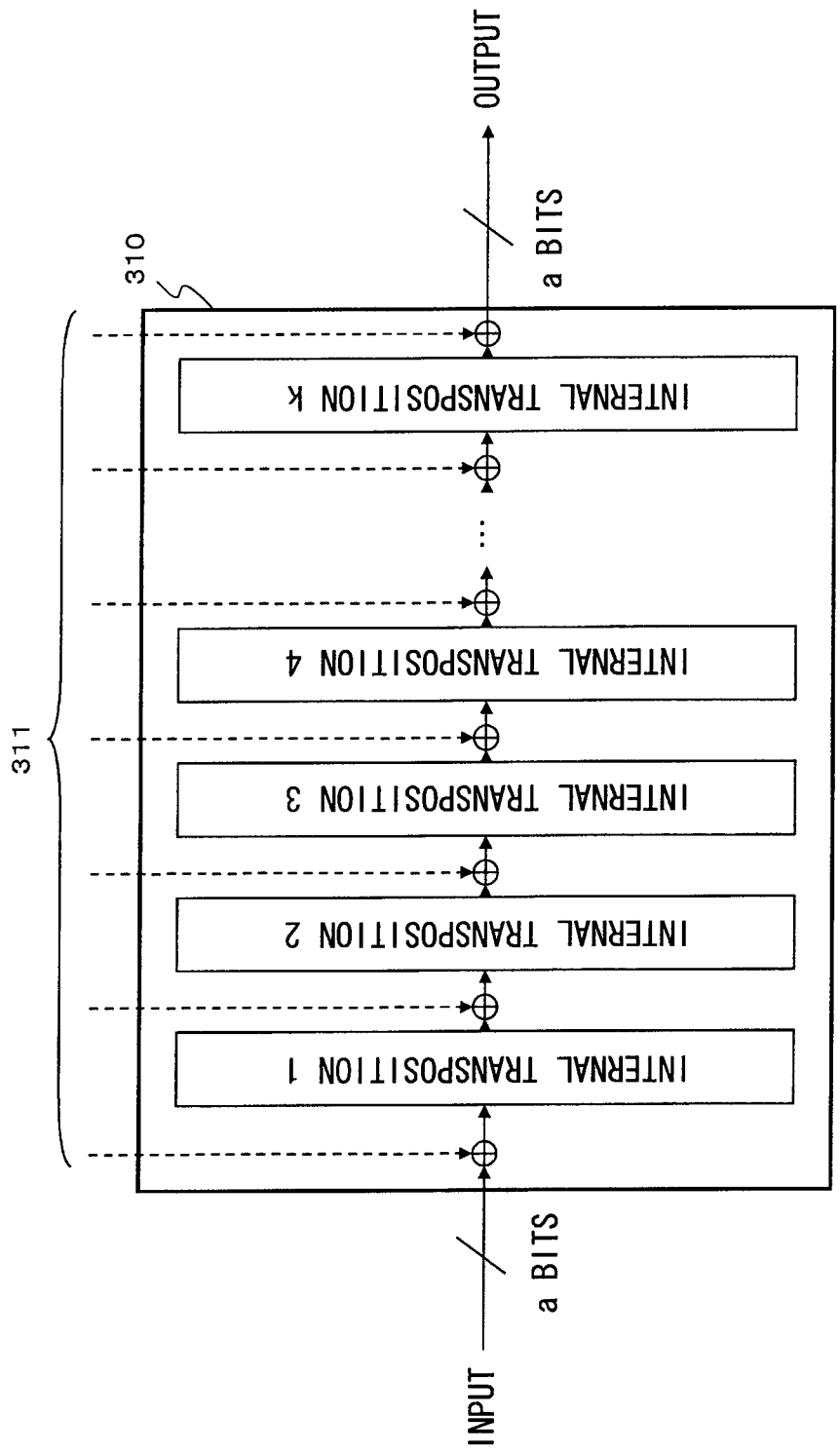
FIG. 21 is a diagram that explains an example of a transposition function having an added input.

A transposition function (transposition processing section) 310 illustrated in FIG. 21 is an example of a transposition function having an added input 311. Further, a transposition function (transposition processing section) 320 illustrated in FIG. 22 is an example of a transposition function having an intermediate output 321.

Figure 22:
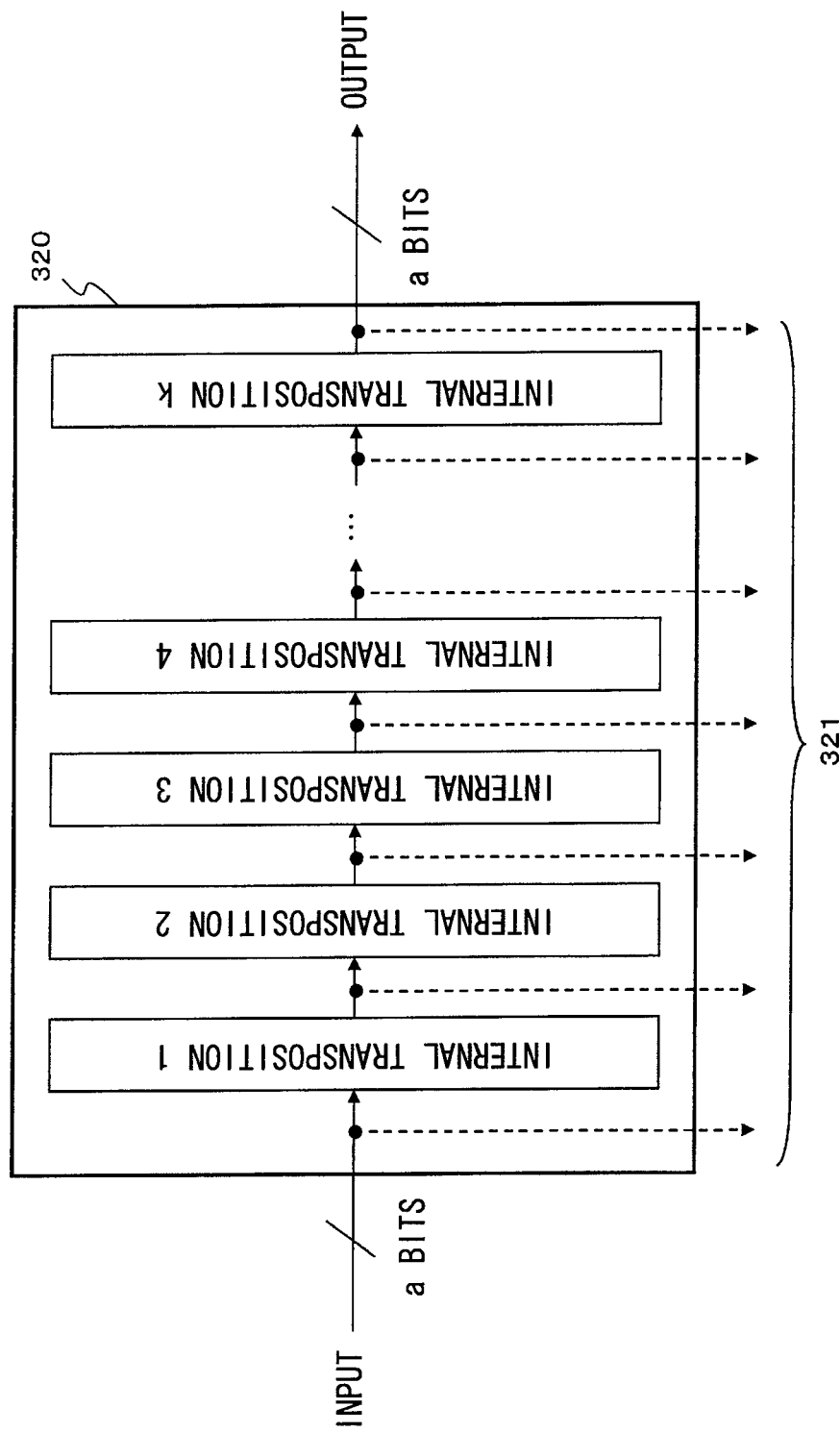
FIG. 22 is a diagram that explains an example of a transposition function having an intermediate output.

The transposition functions illustrated in FIG. 21 and FIG. 22 are both based on the overall transposition that supports a-bit input and output. The inside is configured such that application is repeated from an internal transposition 1 to an internal transposition k. The transposition function 310 illustrated in FIG. 21 has such a configuration that the added input 311 is XORed with the intermediate data that is an output value of the internal transposition, and output to the internal transposition processing section in a subsequent stage or output to the outside. In the transposition function 320 illustrated in FIG. 22, the intermediate data that is an output value of the internal transposition is output to the outside as the intermediate output 321. From now on, in order to distinguish between such overall transposition and normal overall transposition, the transposition function of the type illustrated in FIG. 21 will be referred to as a transposition function with additional input, and the transposition function of the type illustrated in FIG. 22 will be referred to as a transposition function with intermediate output.

Incidentally, the transposition function with additional input inherits the following original property of the transposition.

When the added input is fixed, there is a one-to-one correspondence between the input and the output.

Further, the transposition function with intermediate output has a feature of having the following property derived from the transposition function.

Inputs and the respective intermediate outputs are in a one-to-one correspondence.

As described earlier with reference to FIG. 13 through FIG. 20, the compression function having the hash function is configured to include the message schedule section (MS section) and the chaining variable (CV) processing section.

It has been already known that a compression function is configured by using the transposition function with additional input in the chaining variable (CV) processing section, using the transposition with intermediate output in the message schedule section (MS section), and establishing mutual connection (Whirlpool).

Figure 23:
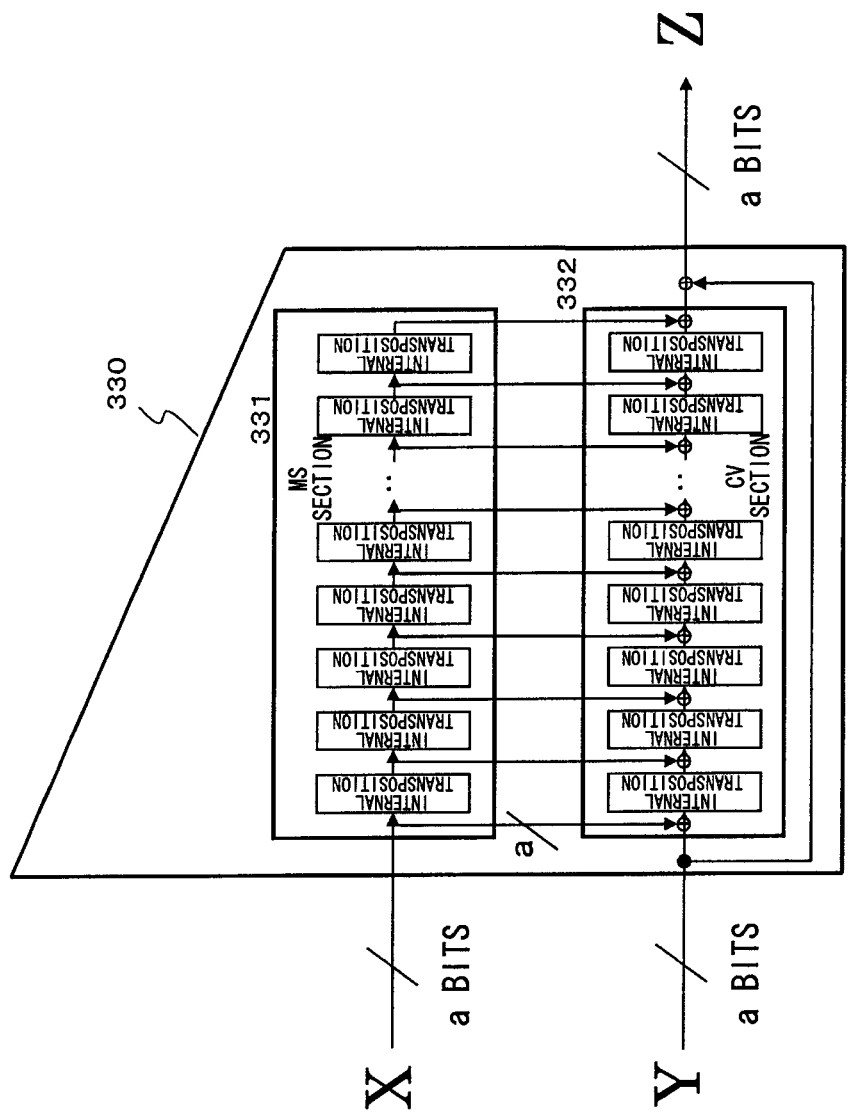
FIG. 23 is a diagram that explains a configurational example of a compression function that employs an existing transposition function.

FIG. 23 illustrates a configurational example of a compression function 330 that employs this existing transposition function. The compression function 330 illustrated in FIG. 23 has such a configuration that a message schedule section (MS section) 331 is set as an a-bit transposition function with intermediate output, and this intermediate output is connected to the added input of an a-bit transposition function with additional input used in a chaining variable (CV) processing section 332.

In the configuration illustrated in FIG. 23, to make the description easy, both of the message schedule section (MS section) 331 and the chaining variable (CV) processing section 332 serve as the a-bit transposition functions, but the message schedule section (MS section) 331 and the chaining variable (CV) processing section 332 may not be necessarily the same in size. When the lengths are different, it is possible to make an adjustment by appropriately carrying out extension and reduction operation. Further, all the intermediate outputs as illustrated in FIG. 23 may not be necessarily connected between the message schedule section (MS section) 331 and the chaining variable (CV) processing section 332, and processing such as appropriate thinning-out by taking the safety and processing efficiency into consideration may be performed, and the intermediate data connected between the message schedule section (MS section) 331 and the chaining variable (CV) processing section 332 may be selected.

[11. Method of Expanding Size of MS Section]

Figure 24:
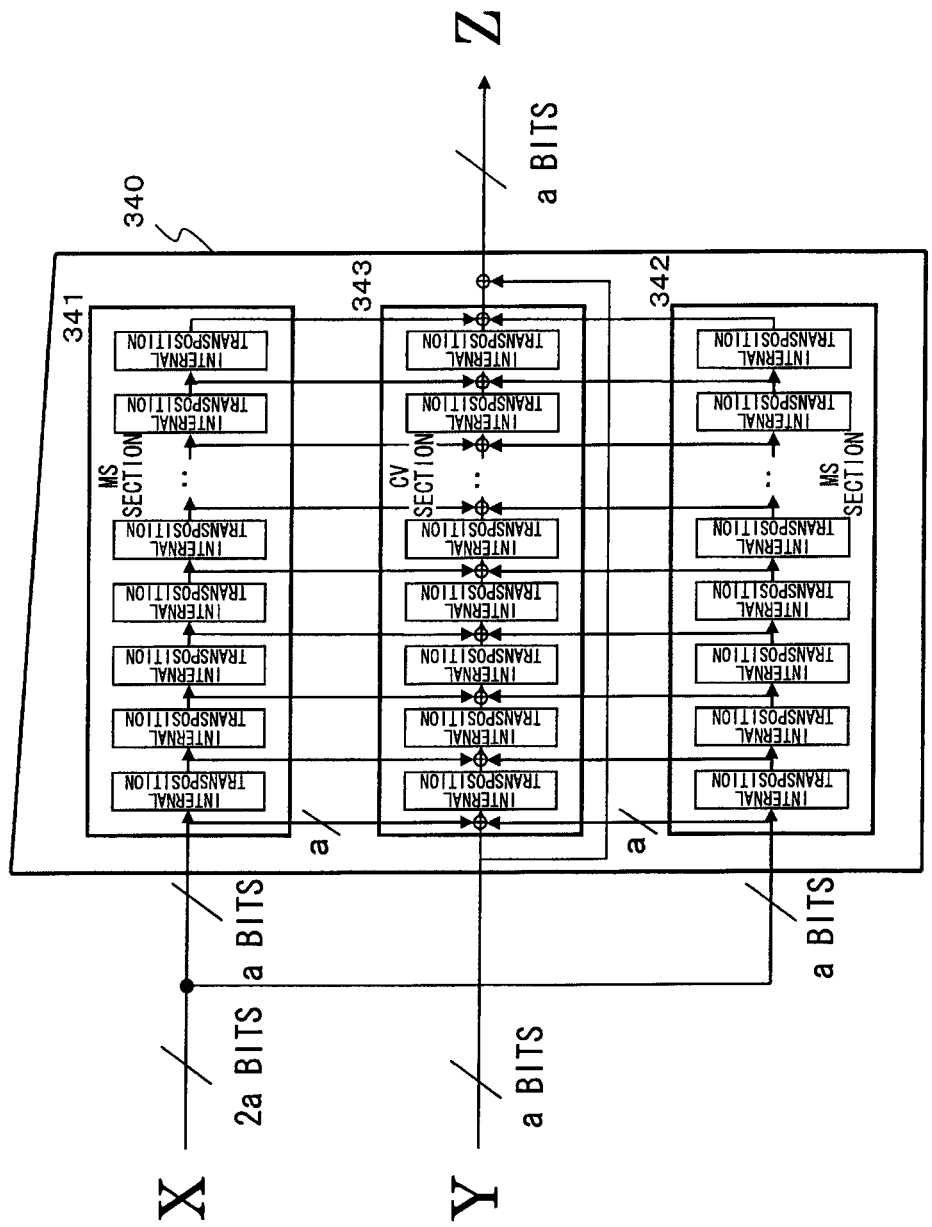
FIG. 24 is a diagram that explains a configurational example of a compression function in which the size of data input to the compression function is expanded.

Illustrated in FIG. 24 is a configurational example of a compression function in which the size of data input to the compression function is expanded. A compression function 340 illustrated in FIG. 24 is a compression function in which the input-bit is increased to 3a-bit. The compression function 340 illustrated in this FIG. 24 is configured in a manner similar to the configuration described earlier with reference to FIG. 18, and has two message schedule sections (MS sections) 341 and 342 and a single chaining variable (CV) processing section 343 to which results of exclusive OR (XOR) operations of outputs from the two message schedule sections (MS sections) 341 and 342 are input.

Each of the two message schedule sections (MS sections) 341 and 342 is formed by the transposition function with intermediate output. The single chaining variable (CV) processing section 343 is formed by the transposition function with additional input.

The transposition function 340 illustrated in this FIG. 24 is configured such that a 2a-bit input X is divided into a-bit portions which are respectively input to the two message schedule sections (MS sections) 341 and 342, and intermediate outputs of the respective two message schedule sections (MS sections) 341 and 342 are supplied to the single chaining variable (CV) processing section 343. When the transposition function with additional input and the transposition function with intermediate output are used in this way, it is possible to readily increase the input length.

Further, in the configuration of the transposition function 340 illustrated in this FIG. 24, the two transposition functions used as the message schedule sections (MS sections) should not be the same, which is because in a case in which they are the same, when the same pieces of a-bit data are input to the respective transpositions, the corresponding intermediate outputs match each other and the results of the exclusive OR (XOR) operations are cancelled. For this reason, it is necessary to prepare different transposition functions for these two without fail. This can be realized by making the internal transposition configurations different.

It is also possible to increase the input X to 3a-or-more bits by generalizing the configuration of the compression function illustrated in this FIG. 24. For example, this can be realized by adding the message schedule section (MS section).

A method of increasing the speed by reducing the amount of processing in the configuration illustrated in FIG. 24 will be shown. In a compression function with a multiple-series configuration which forms a hash function, as described with reference to, for example, FIG. 4 and FIG. 5, the value input by the compression function is a message serving as the data [X] and a median value serving as the data Y, namely a Chaining Variable (CV).

At the time, the number of repeats of the transposition for message processing and the number of repeats of the transposition for the Chaining Variable (CV) series do not necessarily agree with each other. There will be discussed, for example, a case in which the number of repeats of the transposition for message processing is halved in a range in which the safety is not impaired.

Figure 25:
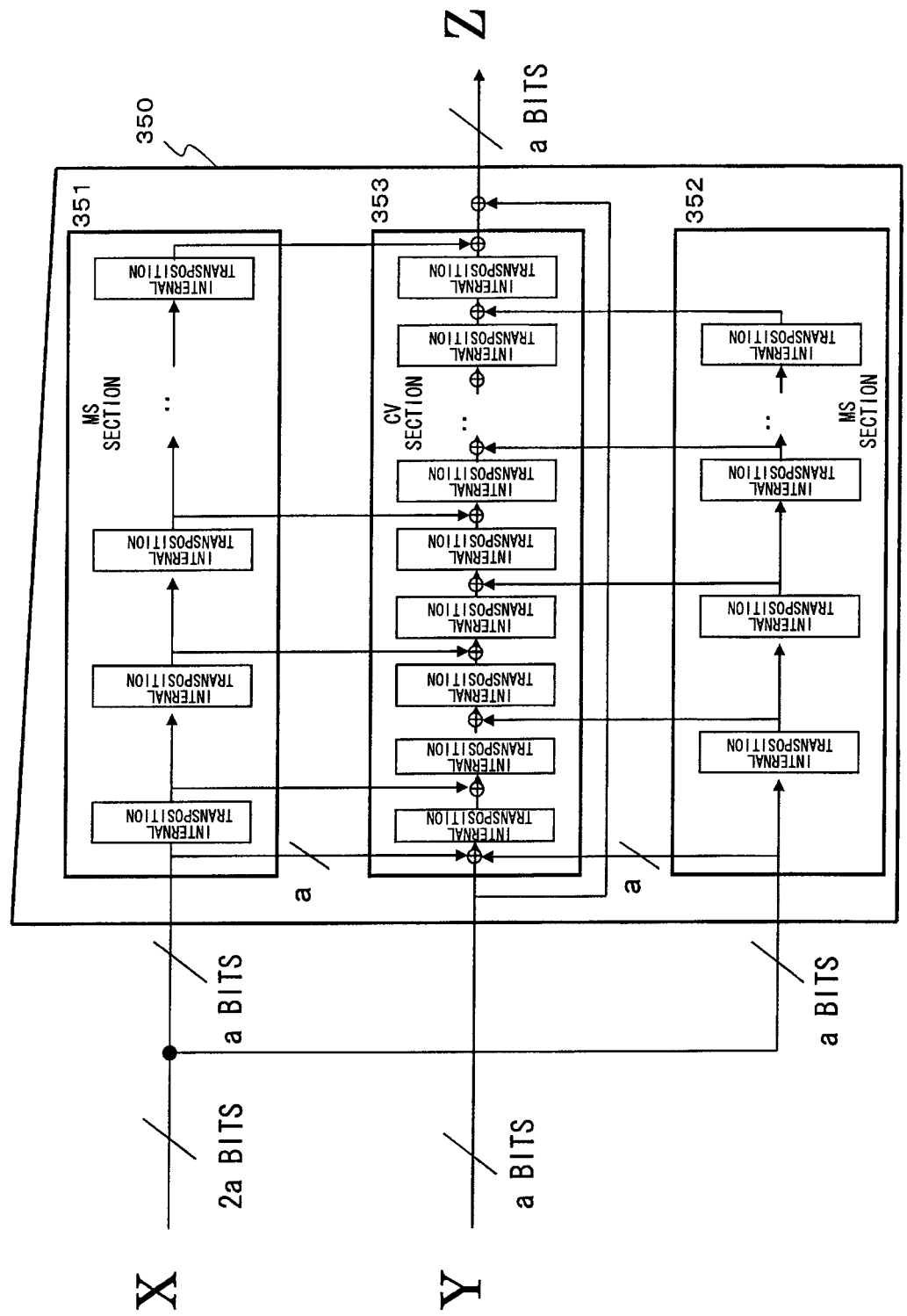
FIG. 25 is a diagram that explains a configurational example of a compression function in which input-bit is increased to 3a-bit.

FIG. 25 is, like FIG. 24, a compression function 350 in which input-bit is increased to 3a-bit. A 2a-bit input X to the compression function 350 is divided into a-bit segments that are then respectively input to two message schedule sections (MS sections) 351 and 352, and intermediate outputs of the respective two message schedule sections (MS sections) 351 and 352 are input to a single chaining variable (CV) processing section 353.

The number of repeats of the internal transposition in the two message schedule sections (MS sections) 351 and 352 illustrated in FIG. 25 is set to be half of the number of repeats of the internal transposition in the chaining variable (CV) processing section 353.

The even-numbered transpositions are removed in the message schedule section (MS section) 351, whereas the odd-numbered transpositions are removed in the message schedule section (MS section) 352, so that the number of repeats of the internal transposition in the two message schedule sections (MS sections) 351 and 352 is halved. This configuration makes it possible to halve the operation required for the message processing.

In this compression function 350 illustrated in FIG. 25, the processing is reduced as compared to the configuration of the compression function 340 illustrated in FIG. 24 and it can be expected that the software processing will improve. Alternate reduction of the functions in the message schedule sections (MS sections) 351 and 352 produces such an advantage that it is possible to set two kinds of transposition capable of performing processing concurrently at the time of hardware implementation, and processing can be realized with a small circuit scale, making it possible to shrink the hardware.

Figure 26:
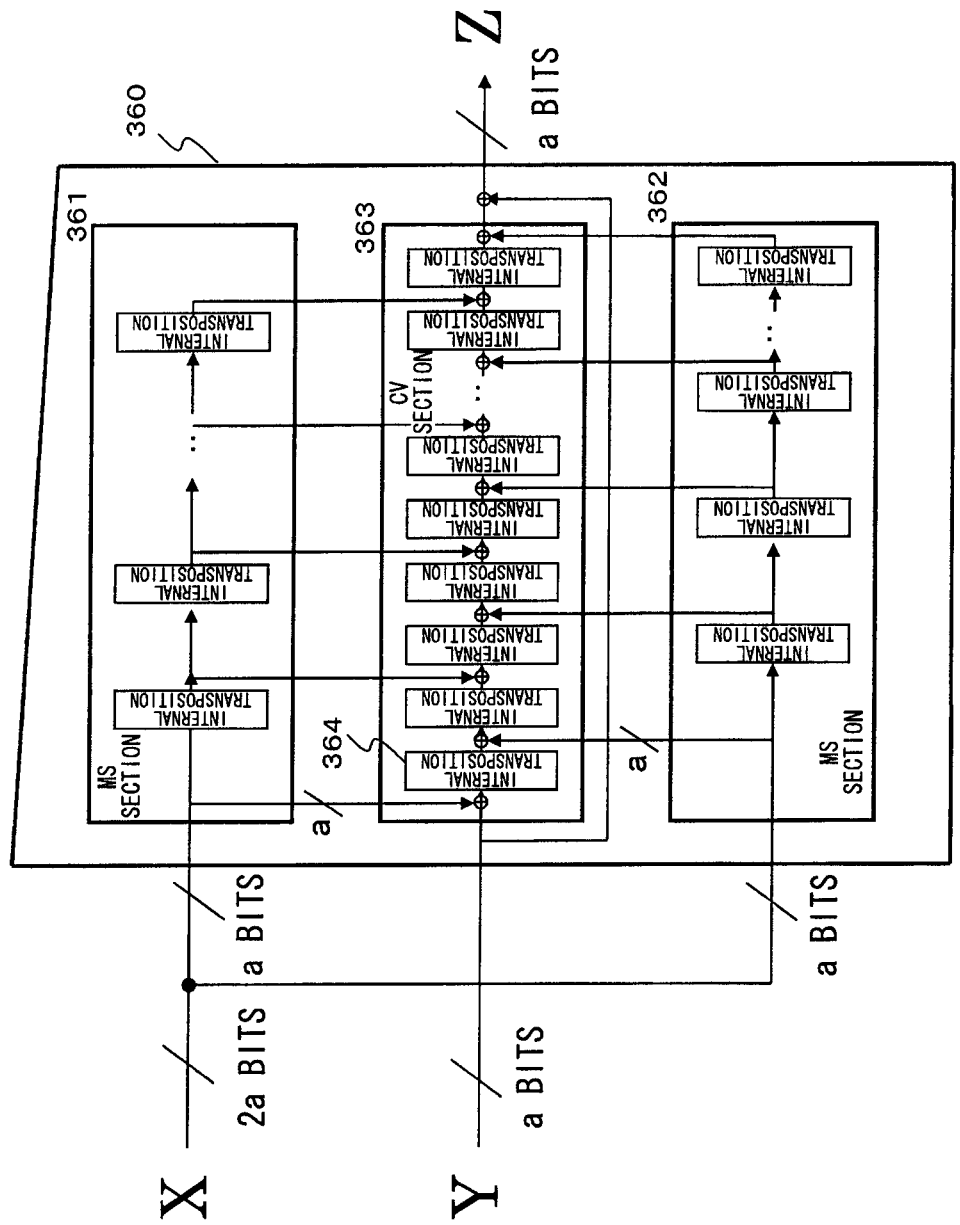
FIG. 26 is a diagram that explains a configurational example of a compression function in which input-bit is increased to 3a-bit.

Further, in a compression function 360 illustrated in FIG. 26, like FIG. 25, input-bit is increased to 3a-bit. A 2a-bit input X to the compression function 360 is divided into a-bit segments that are then respectively input to two message schedule sections (MS sections) 361 and 362, and intermediate outputs of the respective two message schedule sections (MS sections) 361 and 362 are input to a single chaining variable (CV) processing section 363.

The chaining variable (CV) processing section 363 in the compression function 360 illustrated in FIG. 26 is configured such that one internal transposition section 364 is added to the first stage of the chaining variable (CV) processing section 353 in the compression function 350 illustrated in FIG. 25, which is a configuration in which one repeat is added to the number of repeats of the internal transposition.

In the compression function 360 illustrated in FIG. 26, one internal transposition is added to the beginning of the entire transposition for the chaining variable (CV) processing section 363. This is such a configuration that accompanying this change, an input value of the upper message schedule section (MS section) 361 is XORed with an input value of the chaining variable (CV) processing section 363.

The present configuration has such a feature that when attention is focused on one of the message schedule sections (MS sections), the intermediate data supplied to the chaining variable (CV) processing section 363 is always provided every two transposition functions of the chaining variable (CV) processing section 363. In this configuration, the vertical message schedule sections (MS sections) 361 and 362 uniformly affect the series of the chaining variable (CV) processing section 363, and balanced stirring is possible. As a result, there is such an advantage that safety evaluation becomes easy.

[12. Method of Expanding Size of CV Processing Section]

Figure 27:
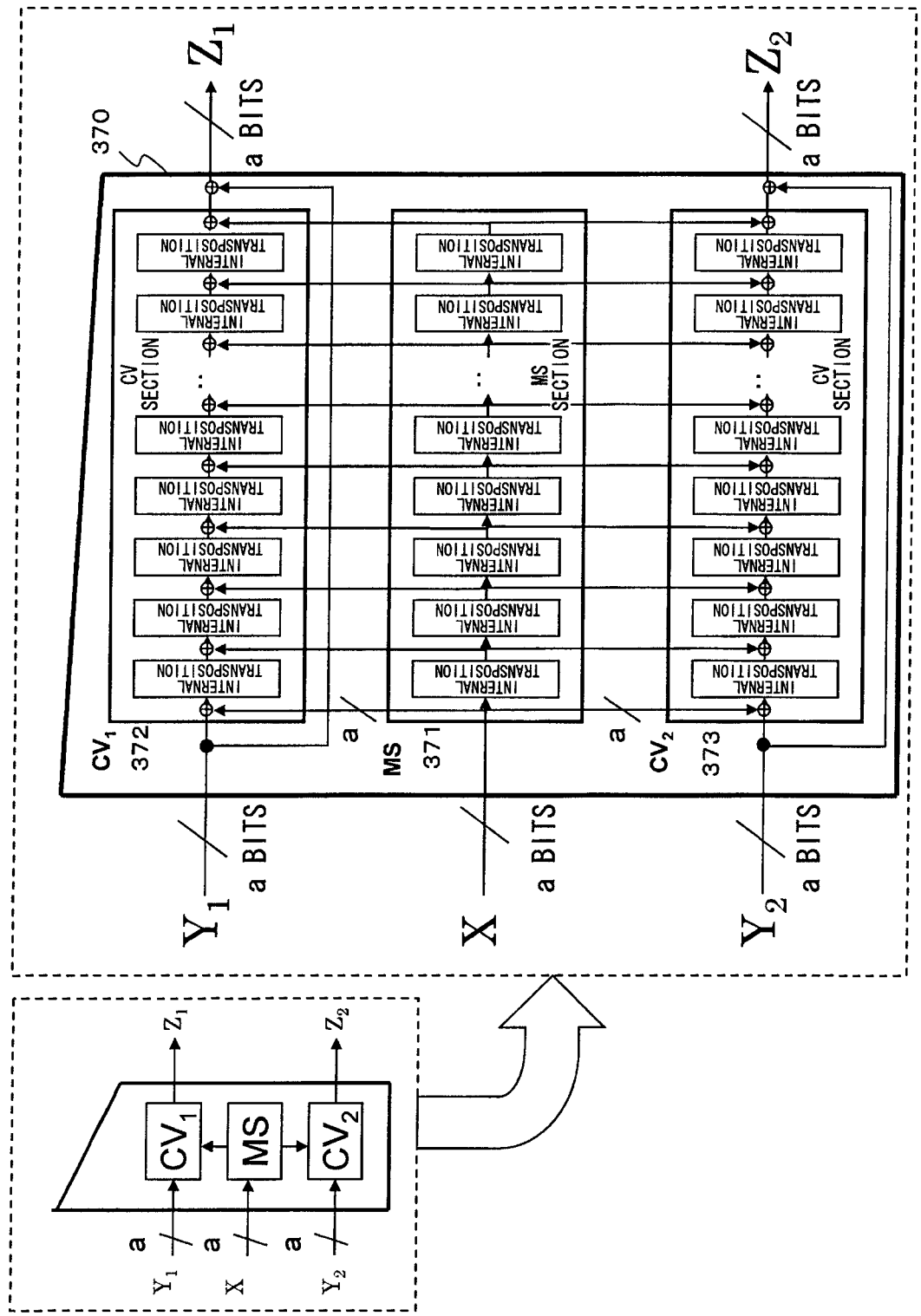
FIG. 27 is a diagram that explains a configurational example in which the message schedule section of two series of compression functions is shared.

A compression function 370 illustrated in FIG. 27 indicates a configuration in which the message schedule section of the two series of compression functions described earlier with reference to FIG. 15 is shared. Application to the case of b=a of the domain extension method provided in FIG. 15 expands the size of the chaining variable (CV) processing section.

In the compression function 370 illustrated in FIG. 27, a-bit of a message [X] is input to a message schedule section (MS section) 371, and a-bits that are two Chaining Variables (CV) serving as the median values are respectively input to chaining variable (CV) processing sections 372 and 373.

The message schedule section (MS section) 371 is formed by the transposition function with intermediate output. The two chaining variable (CV) processing sections 372 and 373 are each formed by the transposition function with additional input. Intermediate outputs of the message schedule section (MS section) 371 are set as added inputs of the two chaining variable (CV) processing sections 372 and 373. In each of the chaining variable (CV) processing sections 372 and 373, the output of the message schedule section (MS section) 371 is XORed with an input or a median value and input to the internal transposition section. Alternatively, this output is used to generate an output value.

[Method of Expanding Sizes of CV Processing Section and MS Section]

Figure 28:
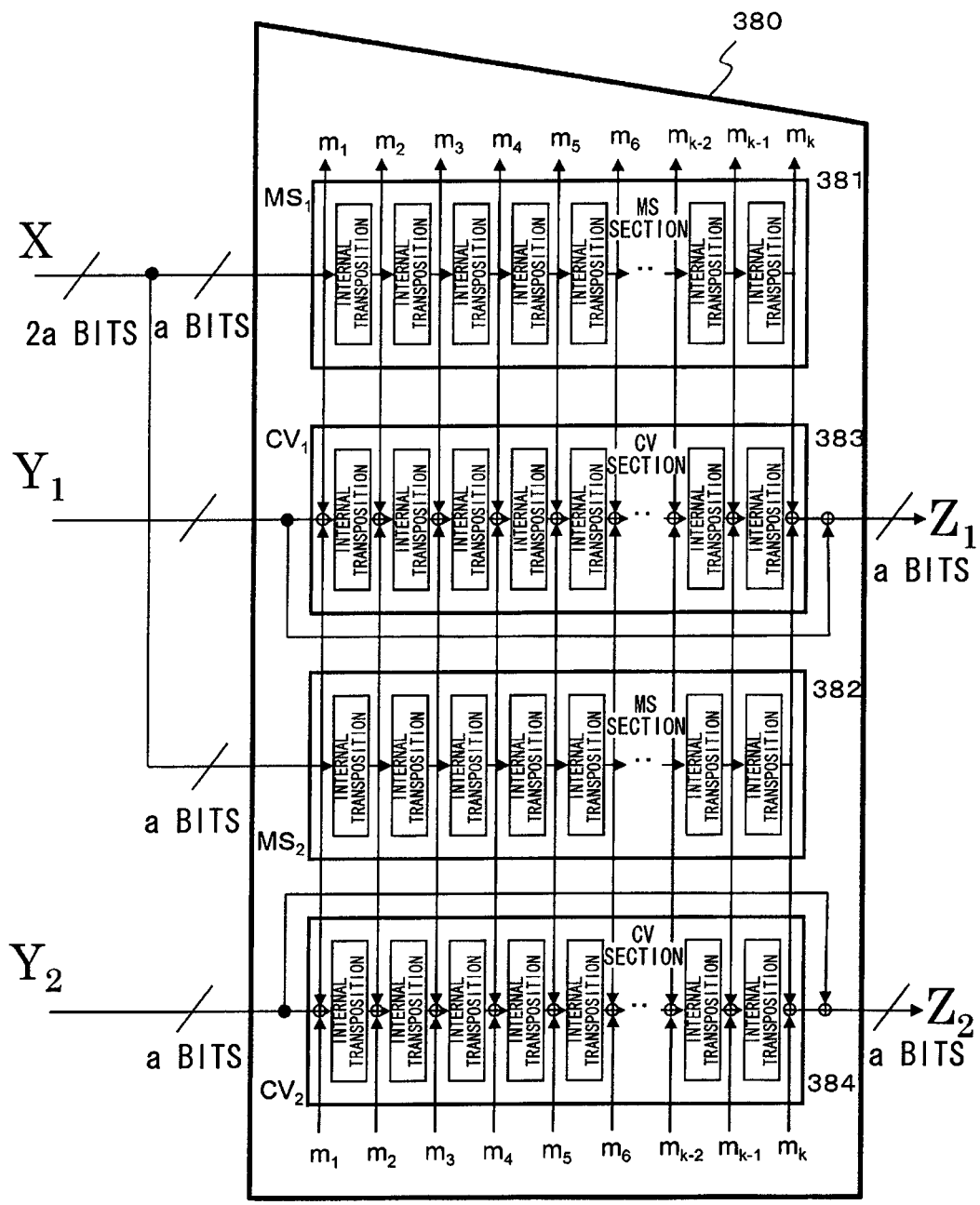
FIG. 28 is a diagram that explains a configurational example of a compression function in which the size of data input to the compression function is expanded.

A compression function 380 illustrated in FIG. 28 is a modification of the compression function 370 illustrated in FIG. 27, and is a configurational example of the compression function in which the size of the data input to the compression function is enlarged by a technique similar to that of the compression function 340 described earlier with reference to FIG. 24. The compression function 380 illustrated in FIG. 28 is a compression function in which the input bit is increased to 3a-bit. This compression function 380 illustrated in FIG. 28 has: two message schedule sections (MS sections) 381 and 382, and a single chaining variable (CV) processing section 383, 384 to which results of exclusive OR (XOR) operations of outputs from the two message schedule sections (MS sections) 381 and 382 are input.

The two message schedule sections (MS sections) 381 and 382 are each formed by the transposition function with intermediate output. The two chaining variable (CV) processing sections 383 and 384 are each formed by the transposition function with additional input. The intermediate output of the message schedule section (MS section) 381 is set as an added input to the chaining variable (CV) processing section 383. The intermediate output of the message schedule section (MS section) 382 is set as an added input to the chaining variable (CV) processing section 384. By the two chaining variable (CV) processing sections 383 and 384, the added input is XORed with an input or a median value and then input to the internal transposition section, or utilized to generate an output value.

[14. Method of Configuring Stirring Function F for Domain Extension Method]

Figure 29:
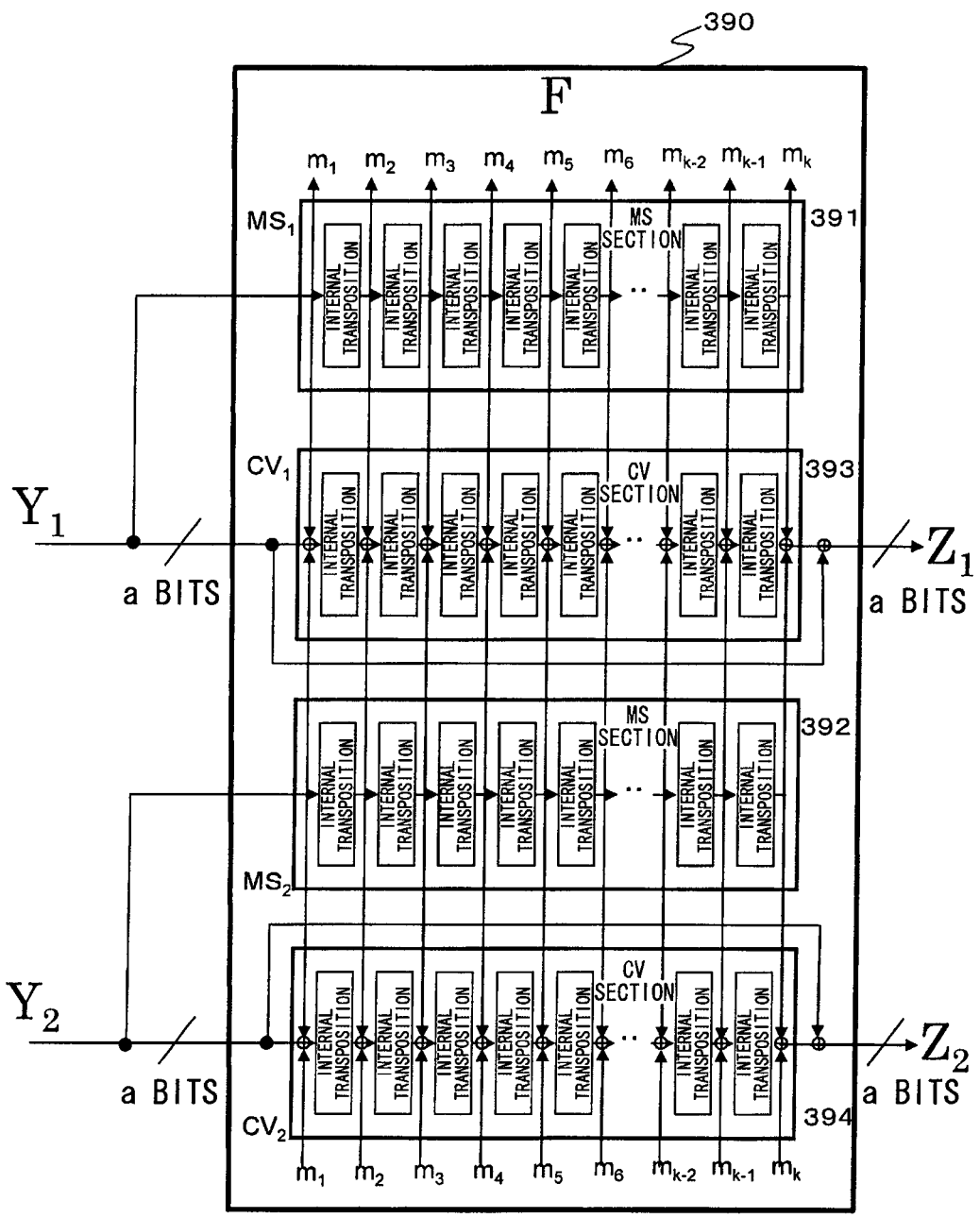
FIG. 29 is a diagram that explains a configurational example of a stirring function F configured by combining two transposition functions with intermediate output and two transposition functions with additional input.

It is possible to configure the stirring function F by combining the transposition function with intermediate output and the transposition function with additional input. FIG. 29 is a configurational example of a stirring function F 390 configured by combining two transposition functions with intermediate output and two transposition functions with additional input.

The stirring function F 390 has: two message schedule sections (MS sections) 391 and 392; and a single chaining variable (CV) processing section 393, 394 to which results of exclusive OR (XOR) operations of outputs from the two message schedule sections (MS sections) 391 and 392 are input.

The two message schedule sections (MS sections) 391 and 392 are each formed by the transposition function with intermediate output. The two chaining variable (CV) processing sections 393 and 394 are each formed by the transposition function with additional input.

The intermediate output of the message schedule section (MS section) 391 is set as an added input to the chaining variable (CV) processing section 393. The intermediate output of the message schedule section (MS section) 392 is set as an added input to the chaining variable (CV) processing section 394. By the two chaining variable (CV) processing sections 393 and 394, the added input is XORed with an input or a median value and then input to the internal transposition section, or utilized to generate an output value.

The stirring function F 390 receives a 2a-bit input as an input [Y], and generates and outputs a 2a-bit output [Z]. Incidentally, the internal transposition of the data conversion device according to the present invention may be configured to be partially reduced, like the configurations in FIG. 25 and FIG. 26 described earlier.

[15. Method of Implementing Transposition Processing with High Diffusion Performance]

The transposition function applied to the message schedule section (MS section) and the chaining variable (CV) processing section can be realized, as described above, by repeatedly applying the internal transposition serving as a relatively simple transposition function. By repeatedly applying such a relatively simple transposition function, it is possible to configure a transposition function whose stirring performance is improved.

Figure 30:
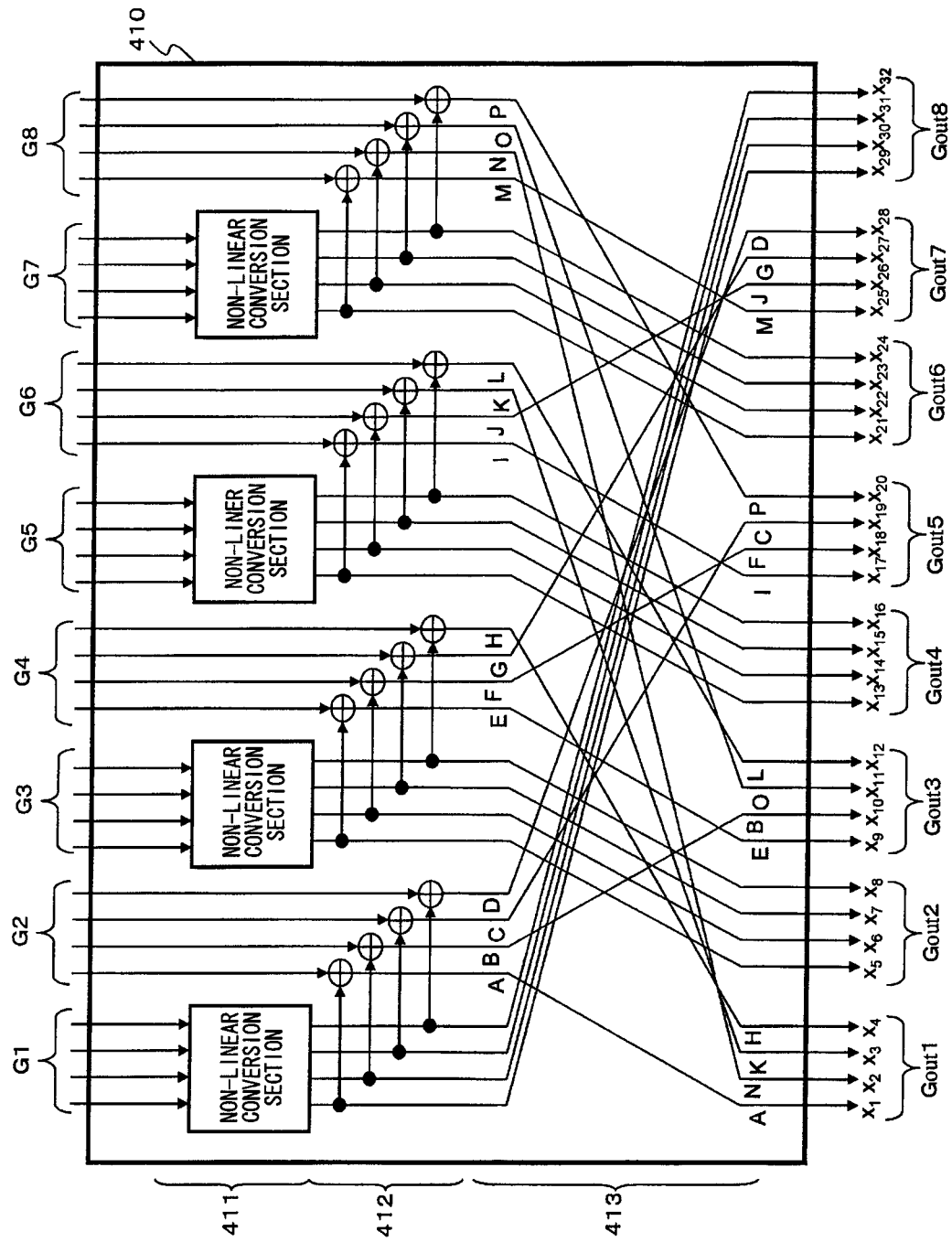
FIG. 30 is a diagram that explains a specific configurational example of a transposition function that can be used as an internal function.

A specific configurational example of the transposition function used as the internal transposition will be described with reference to FIG. 30. In FIG. 30, a repeated type of transposition function with a high stirring performance is configured and thus, this is a configurational example of the transposition function serving as internal transposition used in a transposition function that executes the overall transposition. This internal transposition is repeatedly linked and applied, and therefore the overall transposition is configured. An internal transposition processing section (transposition function) 410 in FIG. 30 shows a configuration of executing transposition of 256-bit input and output.

256-bit data to be input to the internal transposition processing section (transposition function) 410 is represented by 32-byte data. Each byte corresponds to a single input data line illustrated in the figure.

Discussion will be made by, first, diving data by 4 bytes (32 bits) from left, into eight groups (G1 to G8). First, non-linear conversion processing is applied to 4-byte data included in the odd-numbered group (G1, G3, G5 and G7), in the corresponding non-linear conversion section 411.

When being output from the non-linear conversion section 411, the 4-byte data of each of the four groups (G1, G3, G5 and G7) is XORed with the byte-unit data of the group next on the right in an exclusive OR (XOR) operation section 412, and updates the 4-byte (32-bit) data of each of the four even-numbered groups (G2, G4, G6 and G8).

In other words, non-linear conversion result data of the 4-byte data of the group (G1) is XORed with input data of the group (G2), non-linear conversion result data of the 4-byte data of the group (G3) is XORed with input data of the group (G4), non-linear conversion result data of the 4-byte data of the group (G5) is XORed with input data of the group (G6), and non-linear conversion result data of the 4-byte data of the group (G7) is XORed with input data of the group (G8).

By these processes, the 4-byte (32-bit) data of each of the four even-numbered groups (G2, G4, G6 and G8) is updated.

Next, in a swap processing section 413, swap processing of each 1-byte-unit data is performed. The data of the four groups (G1, G3, G5 and G7) formed by the data output from the non-linear conversion sections 411 is moved by the group, i.e. the data of the left-end group is moved to the position of the right-end group, and the data of each of the remaining groups is moved to the position of the group immediately next on the left.

In other words, the group (G1) outputs to the position of an output group (Gout8), the group (G3) outputs to the position of an output group (Gout2), the group (G5) outputs to the position of an output group (Gout4), and the group (G7) outputs to the position of an output group (Gout6).

In such correspondence, the swap processing is performed and output is produced.

On the other hand, in the exclusive OR (XOR) operation section 412, the 4-byte (32-bit) data of each of the four even-numbered groups (G2, G4, G6 and G8) updated by being XORed is divided by the byte and subjected to the swap processing of moving each byte to the different group.

To the 4-byte data of the group (G2), the following swap processing is applied.

ABCD are assigned to the respective bytes of the 4-byte data of the group (G2), from the first byte.

The first 1-byte data A of the group (G2) is output as the first 1-byte data of an output group (Gout1), the second 1-byte data B of the group (G2) is output as the second 1-byte data of an output group (Gout3), the third 1-byte data C of the group (G2) is output as the third 1-byte data of an output group (Gout5), and the fourth 1-byte data D of the group (G2) is output as the fourth 1-byte data of an output group (Gout7).

In such correspondence, the swap processing is performed and output is produced.

To the 4-byte data of the group (G4), the following swap processing is applied.

EFGH are assigned to the respective bytes of the 4-byte data of the group (G4), from the first byte.

The first 1-byte data E of the group (G4) is output as the first 1-byte data of the output group (Gout3), the second 1-byte data F of the group (G4) is output as the second 1-byte data of the output group (Gout5), the third 1-byte data G of the group (G4) is output as the third 1-byte data of the output group (Gout7), and the fourth 1-byte data H of the group (G4) is output as the fourth 1-byte data of the output group (Gout1).

In such correspondence, the swap processing is performed and output is produced.

To the 4-byte data of the group (G6), the following swap processing is applied.

IJKL are assigned to the respective bytes of the 4-byte data of the group (G6), from the first byte.

The first 1-byte data I of the group (G6) is output as the first 1-byte data of the output group (Gout5), the second 1-byte data J of the group (G6) is output as the second 1-byte data of the output group (Gout7), the third 1-byte data K of the group (G6) is output as the third 1-byte data of the output group (Gout1), and the fourth 1-byte data L of the group (G6) is output as the fourth 1-byte data of the output group (Gout3).

In such correspondence, the swap processing is performed and output is produced.

To the 4-byte data of the group (G8), the following swap processing is applied.

MNOP are assigned to the respective bytes of the 4-byte data of the group (G8), from the first byte.

The first 1-byte data M of the group (G8) is output as the first 1-byte data of the output group (Gout7), the second 1-byte data N of the group (G8) is output as the second 1-byte data of the output group (Gout1), the third 1-byte data O of the group (G8) is output as the third 1-byte data of the output group (Gout3), and the fourth 1-byte data P of the group (G8) is output as the fourth 1-byte data of the output group (Gout5).

In such correspondence, the swap processing is performed and output is produced.

Incidentally, in the internal transposition processing section (transposition function) in the next round, the output groups (Gout1, Gout3, Gout5 and Gout7) are input to the non-linear conversion.

In this way, by executing the swap processing to interchange the input and the output, it is ensured that for each byte-unit data, different types of conversion processing are performed.

As shown in an output section of the internal transposition processing section (transposition function) 410 illustrated in FIG. 30, the outputs of 32 bytes are assumed to be x1 to x32. For example, the intermediate output of the transposition function with intermediate output illustrated in FIG. 22 is equivalent to these outputs. In other words, the message schedule section (MS section) in the configuration of each compression function or stirring function F described with reference to FIG. 23 through FIG. 27 is formed by the transposition function with intermediate output, but is equivalent to the intermediate output that is output by these message schedule sections (MS sections).

This intermediate output is input as the added input in the transposition function with additional input illustrated in FIG. 21. For example, the chaining variable (CV) processing section in the configuration of each compression function or stirring function F described with reference to FIG. 23 through FIG. 27 is formed by the transposition function with additional input, and as the added input of these chaining variable (CV) processing sections, the 32-byte outputs: x1 to x32 of the output section of the internal transposition processing section (transposition function) 410 illustrated in FIG. 30 are input.

Incidentally, the configurations of the internal transposition processing sections (transposition functions) 410 illustrated in FIG. 30 are, as described with reference to FIG. 23 through FIG. 27, set numerously within the compression function or the stirring function F. Setting may be made such that the output values x1 to x32 of the intermediate data generated by this internal transposition processing section (transposition function) are all used, or partially used.

For example, there may be provided a configuration in which attention is focused on the configuration of the internal transposition processing section (transposition function) 410 illustrated in FIG. 30, and only x5 to x8, x13 to x16, x21 to x24, and x29 to x32 on the output side of the non-linear conversion sections 411 are used as the intermediate outputs. Alternatively, there may be provided a configuration in which conversely, only x1 to x4, x9 to x12, x17 to x20, and x25 to x28 input to the non-linear conversion sections in the next transposition function are used as the median values.

Next, with reference to FIG. 31, there will be described an example of the internal configuration of the non-linear conversion section 411 configured in the internal transposition processing section (transposition function) 410 described with reference to FIG. 30. The non-linear conversion section 411 can be configured as a transposition function that receives 4-byte data and outputs 4-byte data.

Figure 31:
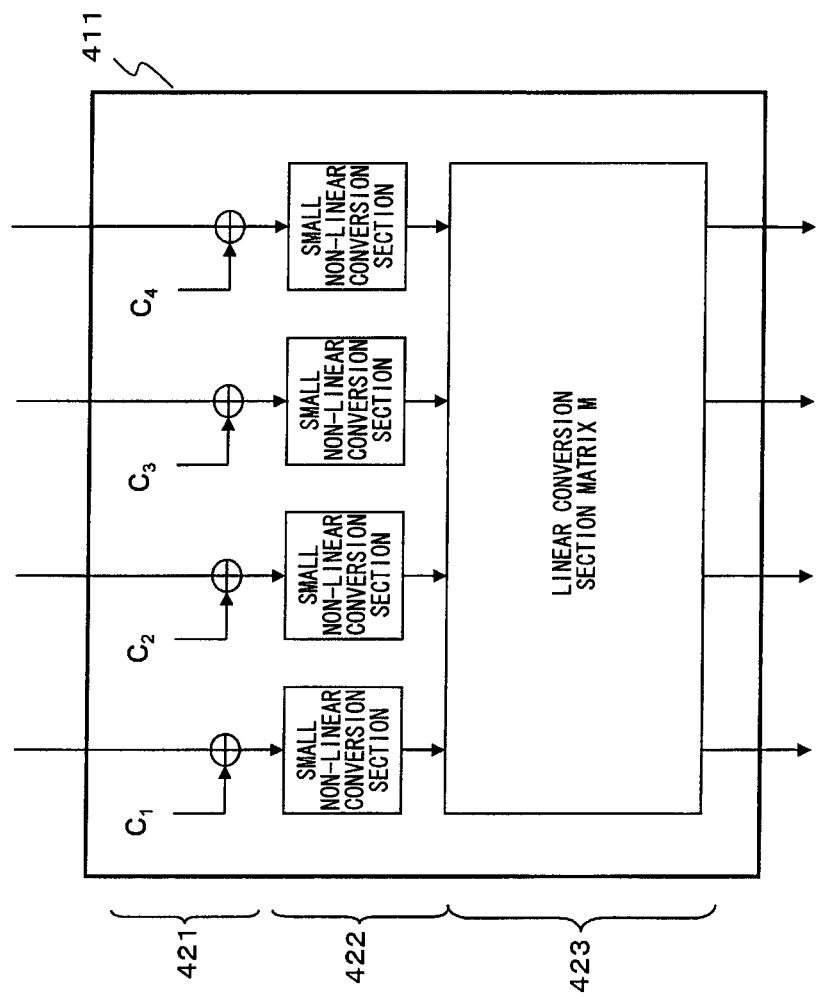
FIG. 31 is a diagram that explains one example of an internal configuration of a non-linear conversion section configured in an internal transposition processing section (transposition function).

To the non-linear conversion section 411 illustrated in FIG. 31, 4-byte data is input. A single line illustrated in FIG. 31 corresponds to 1-byte data. In exclusive OR (XOR) operation sections 421, the input data are respectively XORed with four constant values (constants) C1, C2, C3 and C4 predetermined for each of the non-linear conversion sections 411. Incidentally, there are four non-linear conversion sections 411 configured in the internal transposition processing section (transposition function) 410 described with reference to FIG. 30, and mutually different constant values (constants) are set in these four non-linear conversion sections 411. Processing of setting this constant value (constant) will be described later.

The data, which are respectively XORed with the four constant values (constants) C1, C2, C3 and C4 predetermined for each of the non-linear conversion sections 411 in the exclusive OR (XOR) operation sections 421, are subjected to non-linear conversion processing of 1-byte input and output in small non-linear conversion sections 422.

Outputs of the small non-linear conversion sections 422 are input to a linear conversion section 423, and output after being subjected to linear conversion. Incidentally, the small non-linear conversion section 422 described here may be called S-box, and can be expressed as a conversion table of 256 pieces of 1-byte data. Further, the linear conversion section 423 is executed as processing of calculating output data by conversion processing with use of a linear conversion matrix (M) with respect to the input data. The linear conversion matrix (M) is also called a diffusion matrix and may be expressed as a 4×4 matrix having elements of GF $(2^8)$.

Incidentally, the transposition function is also desired to cause certain data to affect the maximum number of pieces of data, and at the same time, not to cause the sum of non-zero elements included in the input and output to be on a low level where possible. This is effective at improving the analysis resistance and eliminating the vulnerability. Specifically, this becomes a measure against differential attack and linear attack.

The configurations of the internal transposition processing sections (transposition functions) 410 illustrated in FIG. 30 are, as described with reference to FIG. 23 through FIG. 27, set numerously within the compression function or the stirring function F. In other words, processing in which the internal transposition processing section (transposition function) 410 illustrated in FIG. 30 is repeated in plural rounds is performed.

Also, there are many encryption algorithms that execute a round operation in which the same transposition processing configuration is repeated in plural rounds, and it is known that application of the so-called DSM (Diffusion Switching Mechanism) is effective as a measure against the vulnerability, which uses plural different matrixes, e.g. two matrixes [M1] and [M2], without using the linear conversion matrix

[M] applied to all the rounds as a single fixed matrix. Incidentally, an encryption algorithm to which the DSM is applied is described, for example, in Japanese Unexamined Patent Application Publication No. 2007-199156 that is a patent application of the same applicant as that of the present application.

The effects of improving the vulnerability by this DSM are also effective in the hash function. In other words, plural different matrixes are used without making the linear conversion matrix [M] applied to all the rounds to be a single fixed matrix, and therefore it is possible to make it hard to distinguish from a random function, and the resistance to various kinds of analysis processing can be improved.

Figure 32:
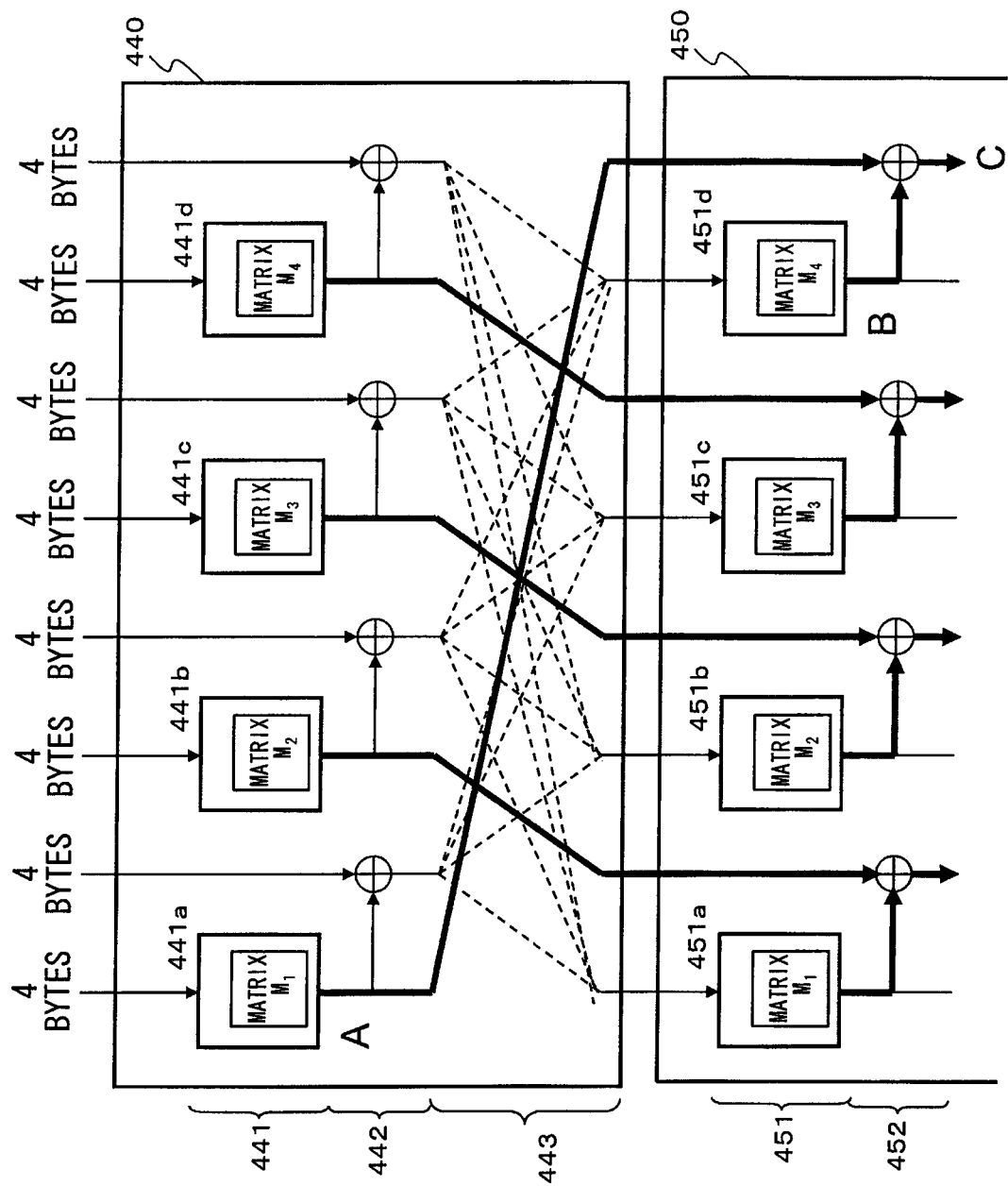
FIG. 32 is a diagram that explains a configurational example of a repeated round of an internal transposition processing section in which setting is made such that plural different matrixes are used as a linear conversion matrix [M] used in the non-linear conversion section of the internal transposition processing section (transposition function).

FIG. 32 illustrates a configurational example of a repeated round of an internal transposition processing section in which setting is made such that plural different matrixes are used as the linear conversion matrix [M] used in the non-linear conversion section 411 of the internal transposition processing section (transposition function) 410 illustrated in FIG. 30 a large number of which are set in the compression function and the stirring function F.

FIG. 32 is a diagram that illustrates a simplified configuration in which two rounds of the internal transposition processing sections (transposition functions) illustrated in FIG. 30 which are numerously set in the compression function or the stirring function F are combined. An internal transposition processing section (transposition function) 440 has a configuration similar to the internal transposition processing section (transposition function) 410 illustrated in FIG. 30. An internal transposition processing section (transposition function) 450 indicates the round to perform the next internal transposition. Each input line is equivalent to 4-byte data.

The internal transposition processing section (transposition function) 440 has, like the internal transposition processing section (transposition function) 410 illustrated in FIG. 30, a non-linear conversion section 441, an exclusive OR (XOR) operation section 442, and a swapping processing section 443. The non-linear conversion section 441 has the configuration described with reference to FIG. 31.

The non-linear conversion section 441 has, as described with reference to FIG. 31, exclusive OR (XOR) operation sections, small non-linear conversion sections, and a linear conversion section. The linear conversion section performs linear conversion processing with use of a linear conversion matrix (M).

FIG. 32 illustrates four non-linear conversion processing sections each for the unit of 4-byte data, as the non-linear conversion section 441, and each of these has the configuration described with reference to FIG. 31. The linear conversion matrixes [M] applied to the linear conversion sections in these four non-linear conversion sections are indicated as M1, M2, M3 and M4 from left in FIG. 32. The linear conversion matrixes M1, M2, M3 and M4 are different linear conversion matrixes.

The internal transposition processing sections (transposition functions) 440 and 450 in the respective rounds have the same configurations. In other words, in either of the internal transposition processing sections (transposition functions) 440 and 450, the linear conversion matrixes [M] applied to the linear conversion sections in the four non-linear conversion sections are M1, M2, M3 and M4 from left. In this way, in the internal transposition, the same matrixes are used at the same positions.

As apparent from lines (thick) linking the rounds illustrated in FIG. 32, an output of the non-linear conversion in the internal transposition processing section (transposition function) 440 in the round on the upper stage is XORed with an output of one non-linear conversion in the internal transposition processing section (transposition function) 450 in the round on the lower stage.

For example, the output (output A in the figure) of a non-linear conversion section 441a having the linear conversion matrix M1 at the left end of the non-linear conversion section 441 in the internal transposition processing section (transposition function) 440 in the round on the upper stage is XORed with the output of (output B in the figure) of a non-linear conversion section 451d having the linear conversion matrix M4 at the right end of a non-linear conversion section 451 in the internal transposition processing section (transposition function) 450 in the round on the lower stage, in an exclusive OR (XOR) operation section 452. An output as a result of this is an output C illustrated in the figure.

Any of the outputs of the four non-linear conversion sections of the non-linear conversion section 441 in the internal transposition processing section (transposition function) 440 in the round on the upper stage is XORed with any of the outputs of the four non-linear conversion sections of the non-linear conversion section 451 in the internal transposition processing section (transposition function) 450 in the round on the lower stage.

When the combination of the output of the non-linear conversion section 441 and the output of the non-linear conversion section 451, each of which is XORed in each of the vertical rounds, is expressed as a combination of the linear conversion matrixes [M] in each non-liner conversion section, the combination is as shown below.

(1) M1 and M4 (non-linear conversion sections 441a and 451d)
(2) M2 and M1 (non-linear conversion sections 441b and 451a)
(3) M3 and M2 (non-linear conversion sections 441c and 451b)
(4) M4 and M3 (non-linear conversion sections 441d and 451c)

In this way, by providing the configuration in which the results of executing the linear conversion processes with use of different linear conversion matrixes are caused to affect each other, it is possible to realize a configuration to which the above-described DSM (Diffusion Switching Mechanism) is applied and improve the analysis resistance.

Incidentally, when the link between the two matrixes is expressed by using a sign "|", and when there is provided such a configuration that there is selected and used a matrix in which setting is made so that the number of branches of the linking matrixes that are the pairs of the above-described matrixes (1) to (2): M1|M4, M2|M1, M3|M2, M4|M3 becomes large (e.g. three or more), it is possible to further improve the analysis resistance. Alternatively, it is a configuration in which the number of branches of matrixes $'M1^{-1}|'M4^{-1}$, $'M2^{-1}|'M1^{-1}$, $'M3^{-1}|'M2^{-1}$, and $'M4^{-1}|'M2^{-1}$, in which all the matrixes acquired by transposing the respective inverse matrixes are obtained, is three or more.

By providing the configuration in which the number of branches is thus made large, it is possible to improve the resistance to differential attack and linear attack.

In this way, it is desirable to provide such a configuration that as the linear conversion matrixes set in the non-linear conversion section within the internal transposition processing section (transposition function) to be performed as a repeated round operation, the different matrixes by adopting the DMS configuration are used. Further, the matrixes to be used are desired to have such a configuration that the number of branches in the linking matrixes of the pairs of mutually affecting matrixes is set to be large.

Incidentally, in the description provided with reference FIG. 32, the four matrixes are used for the description, but the implementation is also possible by using two matrixes in order to meet the condition of the same number of branches. For example, there may be provided such a configuration that the number of branches of M1|M2 is three or more, or the number of branches of $^tM1^{-1}|^tM2^{-1}$ obtained by arranging matrixes acquired by transposing inverse matrixes is three or more, and therefore a matrix arrangement is made in a manner similar to the configuration illustrated in FIG. 33.

In the configuration illustrated in FIG. 33, when the combination of the output of the non-linear conversion section 441 and the output of the non-linear conversion section 451, which are XORed in each of the vertical rounds, is expressed as a combination of the linear conversion matrixes [M] in each non-liner conversion section, the combination is as shown below.

(1) M1 and M2 (non-linear conversion sections 461a and 471d)

(2) M2 and M1 (non-linear conversion sections 461b and 471a)

(3) M1 and M2 (non-linear conversion sections 461c and 471b)

(4) M2 and M1 (non-linear conversion sections 461d and 471c)

Figure 33:
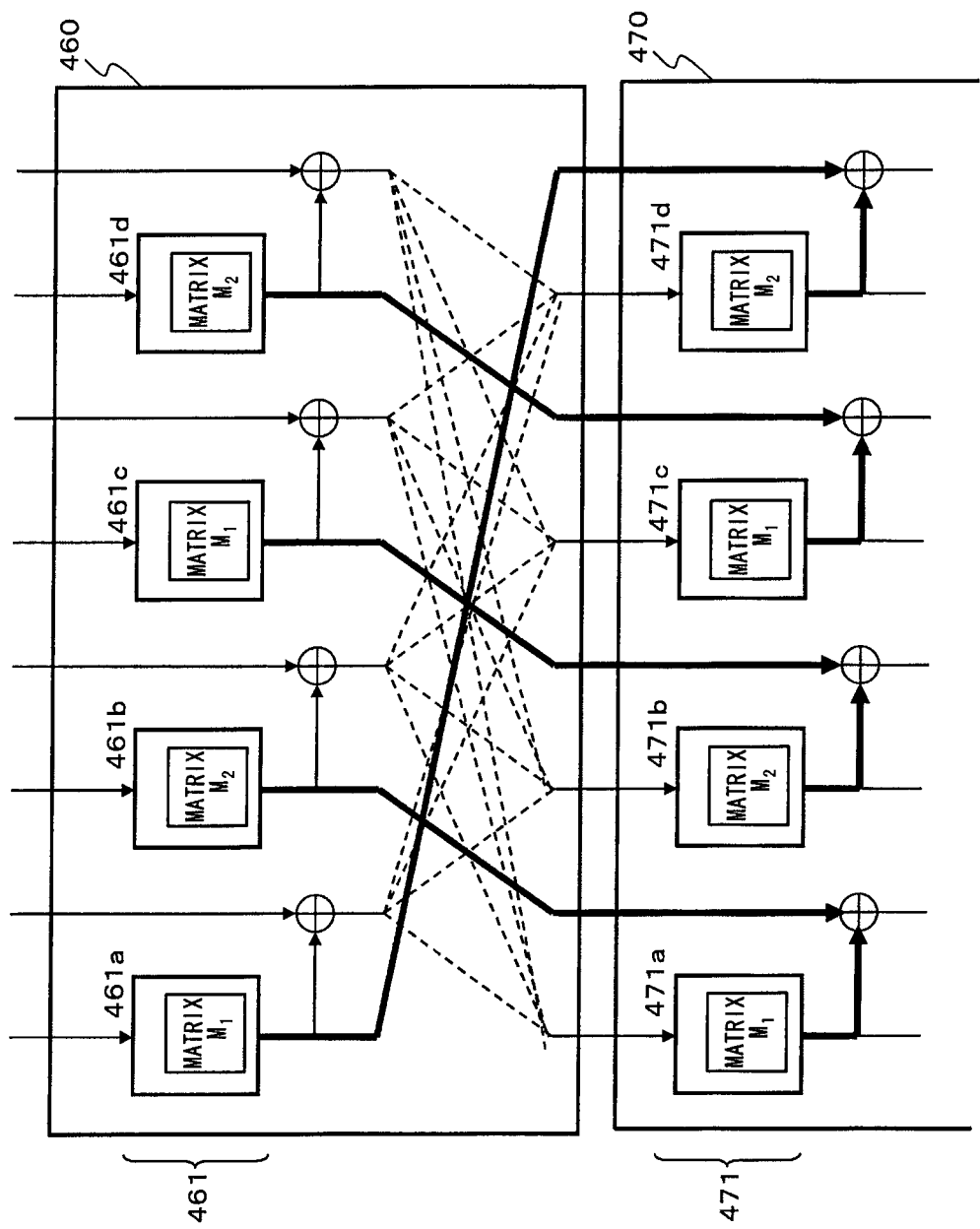
FIG. 33 is a diagram that explains a configurational example of a repeated round of an internal transposition processing section in which setting is made such that plural different matrixes are used as the linear conversion matrix [M].

This configuration illustrated in FIG. 33 can reduce hardware circuits and a table size in memory required for the matrixes in view of implementation and thus is a further preferable configuration.

In this way, by providing the configuration in which the results of executing the linear conversion processes with use of different linear conversion matrixes are caused to affect each other, it is possible to realize a configuration to which the above-described DSM (Diffusion Switching Mechanism) is applied and improve the analysis resistance.

So far, there has been described the configuration example of the internal transposition for realizing the overall function whose stirring performance is improved. Incidentally, the above-described example of processing has been described as an example of 256-bit input, but this is an example, and the data size can be set variously, and it is possible to provide a configuration according to the data size. In that case, setting is made to perform processing according to the size for the input and output size of the small non-linear conversion section, and the linear conversion section as well.

[16. Method of Generating Transposition Function Having Output with High Independence]

In the above-described processing example, the internal transposition processing configurations numerously set in the compression function and the stirring function F have been described as a processing example in which, for example, the internal transposition processing configuration illustrated in FIG. 30 is used, and this same configuration is set to be repeated. By configuring the linear conversion processing matrixes in the non-linear conversion section of this internal transposition processing as described above, it is possible to improve the analysis resistance.

Further, in a configuration that requires plural overall transposition functions, there is a case in which the analysis resistance is improved by using plural overall transpositions as if the transpositions act independently of each other. In that case, there is a method realized by varying the internal transpositions included in these overall transpositions. Its configurational example will be described.

In order to realize the processing of the plural different overall transpositions, a technique of changing a component included in an internal transposition in each of the overall transpositions is effective. However, in view of implementation efficiency and easiness of safety evaluation processing, it is not always desirable to use multiple different components. It is desirable to realize various kinds of processing by reducing components to be used to a minimum.

As a configuration for making the internal transposition processing differ for each overall transposition, the following configuration is conceivable.

A change is made so that a constant value (used in the exclusive OR (XOR) operation section 421 of FIG. 31) to be used for each overall transposition is replaced with another.

The S-box (small non-linear conversion section 422 of FIG. 31) serving as the non-linear conversion section which is a component of the internal transposition processing included in the overall transposition or the linear conversion matrix (linear conversion section 423 of FIG. 31) is made to differ, and it is repeatedly used, so that the overall transposition is provided.

Incidentally, the constant value is a constant to be input in the exclusive OR (XOR) operation section 421 of the non-linear conversion section 411 of the internal transposition processing section 410 described with reference to FIG. 30 and FIG. 31.

However, in order to change the constant value entirely for each overall transposition or to change the S-box, matrix, etc., supply of these different pieces of data and a component configuration are required, and it is necessary to increase the circuit and memory capacity. Such an increase in the circuit and memory capacity is a disadvantage in terms of implementation and also, the cost for reevaluating the safety increases, which is a problem.

Thus, in the present invention, setting is made so that the internal transposition processing configurations vary from one overall transposition to another.

(a) When plural different small non-linear operations (S-box) (small non-linear conversion sections 422 of FIG. 31) are used, the small non-linear operations (S-box) of the internal transposition are replaced for each overall transposition.

(b) The matrix to be used as the linear conversion section (linear conversion section 423 of FIG. 31) is set to be plural different matrixes generated from a single matrix, and the matrixes are set to vary from one overall transposition to another. For example, by performing interchanges of lines and interchanges of columns, plural different matrixes are generated from a single matrix.

(c) When plural kinds of matrixes are used as the matrix to be used as the linear conversion section (linear conversion section 423 of FIG. 31), the matrixes of the internal transpositions are replaced for each overall replacement (in a range in which the conditions of the DSM are not collapsed, when the above-described DSM is used or the like).

(d) A combination of any of the above-described (a) to (c).

It is possible to efficiently change the transposition processing configuration in the internal transposition processing performed repeatedly, based on setting like the above-described (a) to (d). In other words, without greatly increasing the circuit and memory capacity, different transposition processes can be performed.

In particular, when the above-described (c) and (b) are combined, it is possible to realize different overall transpositions efficiently. In other words, when the above-described DSM configuration is applied and two or more kinds of linear conversion matrixes are stored in the memory, there is provided such a configuration that new matrixes are generated by interchanging lines and columns of these matrixes and used as the linear conversion matrixes. When such setting is made, it is possible to efficiently perform different liner conversion processes based on a small amount of data.

Incidentally, in the configuration in which the DSM is used and the plural different linear conversion matrixes are provided, there arises a problem of evaluating the safety when the processing of interchanging the lines and columns of matrixes is performed, but it is known that if a matrix having a predetermined rule, e.g. a circulant matrix, or a Hadamard-matrix, is used, the safety evaluation is not affected even when the matrixes generated by interchanging the lines and columns are applied. Therefore, it can be said that the safety evaluation is easy, and it is an effective means to create different transposition functions by an easy change.

[17. Processing of Generating Constant Applied to Transposition Function]

As described earlier, as one technique of setting the transposition processing configuration of each round to differ, the technique of making a change to replace the constant ([C] used in exclusive OR (XOR) operation sections 421 of FIG. 31) with another in the unit of each round or the unit of plural rounds is effective.

However, in order to retain the constants corresponding to a great number of rounds, a large memory capacity is required. In the following, there will be described a configurational example in which multiple different constants are efficiently generated from a small number of constants, and can be used in the transposition function.

First, a constant required for the transposition function is defined. Here, 4 bytes are collectively referred to as 1 word. For example, there are four non-linear conversion sections in the internal transposition processing section (transposition function) 410 in FIG. 30, each of the non-linear conversion sections has the configuration illustrated in FIG. 31. As illustrated in FIG. 31, in one non-linear conversion section 411, four constants are used. Each constant is used in the exclusive OR operation with the 1-byte input data and thus, one constant Cn is 1-byte data. In one non-linear conversion section 411, four constants are used and thus, a 1-word constant is required per one non-linear conversion.

In the internal transposition processing section (transposition function) 410 in FIG. 30, there are four non-linear conversion sections and thus, constants of 4 words are required for one internal transposition processing. When this basic transposition is repeated k times and therefore the overall transposition is configured, constants of 4k words are required in total.

Here, among the internal transpositions the number of which is k, the j-th constant value included in the i-th internal transposition counted from the input side is expressed as $C_{i,j}$. Then, the constants required for a single overall transposition can be expressed as follows.

(Example of the Group of Constants Required for a Single Overall Transposition)

First internal transposition: $C_{1,1}, C_{1,2}, C_{1,3}, C_{1,4}$

Second internal transposition: $C_{2,1}, C_{2,2}, C_{2,3}, C_{2,4}$

Third internal transposition: $C_{3,1}, C_{3,2}, C_{3,3}, C_{3,4}$

Fourth internal transposition: $C_{4,1}, C_{4,2}, C_{4,3}, C_{4,4}$ $\vdots$ (k-1)-th internal transposition: $C_{k-1,1}, C_{k-1,2}, C_{k-1,3}, C_{k-1,4}$ -continued k-th internal transposition: $C_{k,1}, C_{k,2}, C_{k,3}, C_{k,4}$ As a conventional technique disclosing a method of generating a constant, there is a technique disclosed in, for example, Japanese Unexamined Patent Application Publication No. 2008-58827. This conventional technique is a method of: using a value stored in an 8-bit variable eight times to generate a 64-bit constant; and to generate further the next constant, assuming the data within the variable as an element on $GF(2^8)$ and subjecting the data to an x-fold or $x^{-1}$-fold operation, thereby increasing the kinds of data sequentially. Incidentally, x used here is a variable x at the time when an irreducible polynomial that defines a finite field $GF(2^n)$ to be used is expressed by a polynomial f(x).

In the following, as a constant generation processing construction, there will be described a method of generating partial constants based on a series obtained by the x-fold operation for constant generation data, and generating the rest based on a series obtained by the $x^{-1}$-fold operation. This method makes it possible to locally destroy a simple relationship between constant values without increasing the work for the generation. As a result, it is possible to increase the disorder of the constants. In the present case, there will be described an example in which 64 bits equivalent to two words are created from a single 16-bit value.

A constant generation processing according to the present invention will be described in comparison with the constant generation processing disclosed in the above-mentioned Japanese Unexamined Patent Application Publication No. 2008-58827.

First, a conventional constant generation procedure will be described. The conventional constant generation procedure is as follows.

[1] An initial value is stored in each of 16-bit variables S.
[2] i=1 . . . k is subjected to the following processing.
 (2.1) $C_{i,1}$=(S xor $Mask_1$)<<<$Rot_1$|(S xor $Mask_2$)<<<$Rot_2$
 $C_{i,2}$=(S xor $Mask_3$)<<<$Rot_3$|(S xor $Mask_4$)<<<$Rot_4$
 $C_{i,3}$=(S xor $Mask_5$)<<<$Rot_5$|(S xor $Mask_6$)<<<$Rot_6$
 $C_{i,4}$=(S xor $Mask_7$)<<<$Rot_7$|(S xor $Mask_8$)<<<$Rot_8$
[2.2] S←S·x Incidentally, $Mask_n$ and $Rot_e$ are separately determined constants. Incidentally, here, the sign "|" indicates a linkage between bits. (A xor B) indicates exclusive OR(XOR) operation processing of A and B.

The four constants ($C_{i,1}$ to $C_{i,4}$) generated in this way may appear to be random numbers at first glance, but changes are made only by a Mask operation and a rotation shift operation and thus, there is such a feature that no matter what value S is, the relationship expressed by a specific linear operation is always maintained between the constants. As apparent from an example of block encryption, it is often insufficient to increase the disorder only by the linear conversion, and it is desirable that a non-linear property be present where possible.

Next, there will be described a constant generation technique according to the present invention in which a non-linear relationship is introduced between constants without increasing the implementation cost and reducing the performance.

[1] An initial value is stored in each of 16-bit variables S and T.
[2] i=1 . . . k is subjected to the following processing.
 (2.1) $C_{i,1}$=(S xor $Mask_1$)<<<$Rot_1$|(S xor $Mask_2$)<<<$Rot_2$
 $C_{i,2}$=(S xor $Mask_3$)<<<$Rot_3$|(S xor $Mask_4$)<<<$Rot_4$
 $C_{i,3}$=(T xor $Mask_5$)<<<$Rot_5$|(T xor $Mask_6$)<<<$Rot_6$
 $C_{i,4}$=(T xor $Mask_7$)<<<$Rot_7$|(T xor $Mask_8$)<<<$Rot_8$

[2.2] S→S·x, T←T·x$^{-1}$

According to the above processing, the 16-bit variables S and T are applied and therefore the four constants ($C_{i,1}$ to $C_{i,4}$) are generated, so that half of the four constants included in each internal transposition is an x-fold series, and the remaining half belongs to an x$^{-1}$-fold series.

By configuring in this way, a fixed linear relationship is not maintained between the constant generated from S and the constant made up of T, and an effect of improving the independence is obtained.

When the above-described constant generation processing is generalized and described, it is possible to explain that this is processing in which the initial values S and T are renewed by using values having different indexes like x$^a$ and x$^b$. By generating plural constants by applying such initial values S and T, half of the generated constants becomes the x$^a$-fold series, and the remaining half belongs to the x$^b$-fold series.

Incidentally, further, if an increase of not only the two series of S and T, but of the initial values is acceptable, it is possible to provide a configuration in which constants are generated by using three or more series.

[18. Method of Generating Constants for Plural Overall Transpositions]

In the compression function, plural overall transpositions exist, and it is necessary to prepare a group of constant values formed by plural constants, for each of the overall transpositions. Suppose the number of overall transpositions is m, and these are expressed as P1, P2, . . . , Pm. If the above-described constant generation technique is applied, it is possible to apply a method in which the initial values in m groups are changed for each overall transposition according to these overall transpositions whose number is m, and each of constant values to be applied in the internal transposition in the overall transposition is generated. However, use of such technique multiplies the work for generating the constant values by m, which is inefficient.

There will be described a technique of simplifying the processing of generating constant groups to be applied to plural overall transpositions. For example, when overall transpositions the number of which is m are present in the compression function, constants required for the first overall transposition are generated by the above-described method that uses the plural initial values S and T, constants required for the second and subsequent overall transpositions are generated by subjecting the constants generated for the first overall transposition to a simple operation.

In one configuration of data conversion processing, for example, in a configuration in which the overall transpositions the number of which is m are set in the compression function, the j-th constant value (word) included in the i-th internal transposition counted from the input side of the x-th overall transposition is expressed by $C_{i,j}(x)$. A constant $C_{i,j}(1)$ for the first overall transposition is assumed to be generated by the above-described method that uses the plural initial values S and T.

Figure 34:
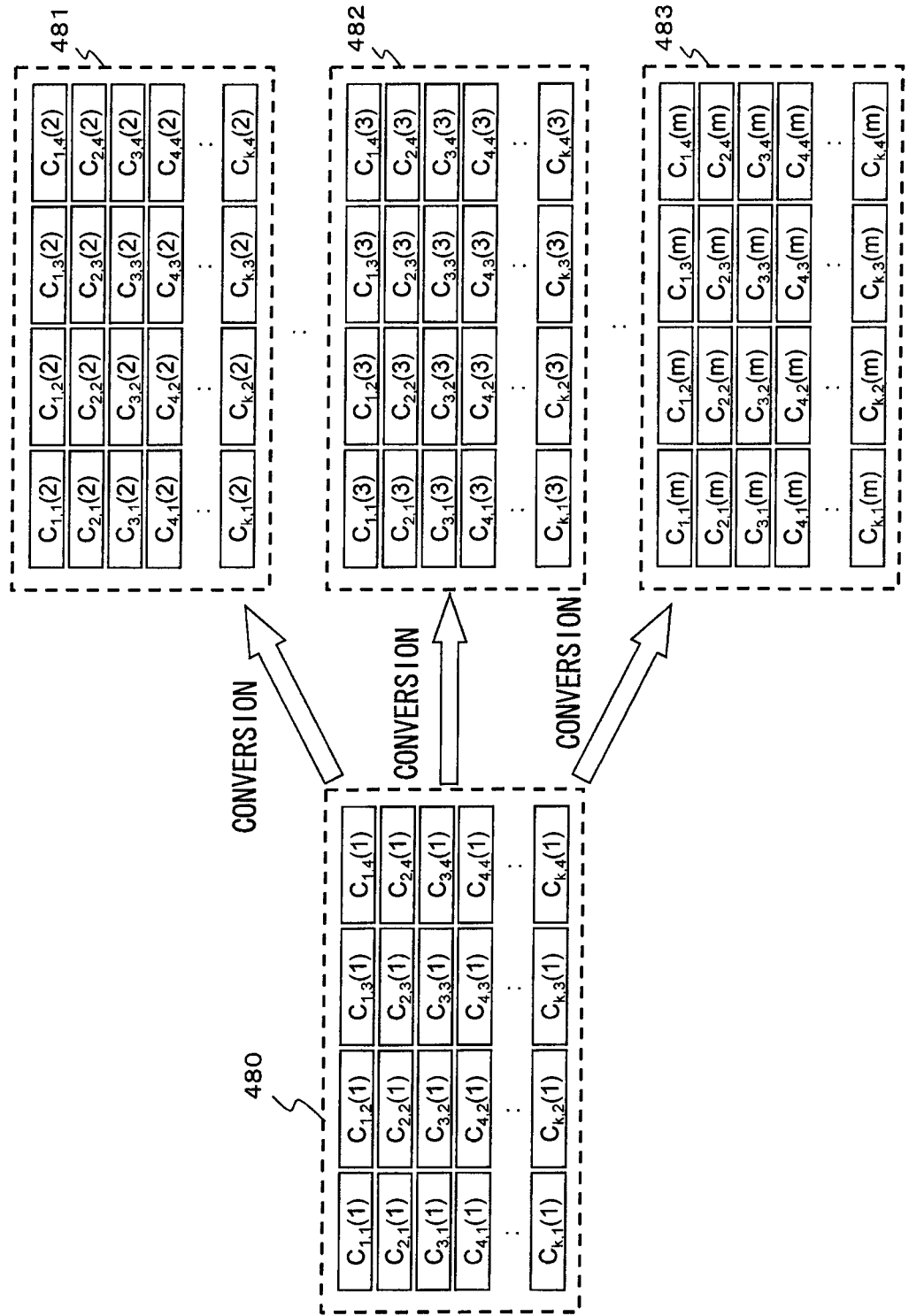
FIG. 34 is a diagram that explains a technique of generating constants $C_{i,j}(2), C_{i,j}(3), \ldots C_{i,j}(m)$ for overall transpositions.

At the time, constants $C_{i,j}(2)$, $C_{i,j}(3)$, . . . $C_{i,j}(m)$ for the second and subsequent overall transpositions are generated. With reference to FIG. 34, there will be described a method of generating the constants $C_{i,j}(2)$, $C_{i,j}(3)$, . . . $C_{i,j}(m)$ for the second and subsequent overall transpositions.

FIG. 34 illustrates, as constant groups required for the overall transpositions the number of which is m, a first constant group 480 generated by the above-described method that uses the plural initial values S and T, a second constant group 481, a third constant group 482, and an m-th constant group 483, which are generated by conversion processing of the first constant group 480.

This is an example in which setting is made such that in all the overall transpositions the number of which is m, internal transpositions the number of which is k are included in one overall transposition, and words of four constants are required for one overall transposition.

The second to m-th groups are generated by the conversion processing applied to the first constant group 480. A specific example of the conversion processing will be described.

As the conversion processing, any of the following three types of conversion processing can be applied.

(Conversion Processing Example 1)

A rotation amount distinctively determined for each overall transposition is assumed to be Rx, and a constant is generated based on $C_{i,j}(x)=C_{i,j}(1)<<<Rx$.

$C_{i,j}(1)$ is a constant serving as an element of the first constant group 480 generated by the above-described method that uses the plural initial values S and T.

x is an identification number of the constant group and takes a value of 2 to m.

(Conversion Processing Example 2)

A mask value (word) distinctively determined for each overall transposition is assumed to be Mx, and a constant is generated based on $C_{i,j}(x)=C_{i,j}(1)$ xor Mx.

$C_{i,j}(1)$ is a constant serving as an element of the first constant group 480 generated by the above-described method that uses the plural initial values S and T.

x is an identification number of the constant group and takes a value of 2 to m.

(Conversion Processing Example 3)

A method resulting from the combination of the above-described conversion processing examples 1 and 2.

A constant is generated based on $C_{i,j}(x)=(C_{i,j}(1)<<<Rx)$ xor Mx or $C_{i,j}(x)=(C_{i,j}(1)$ xor Mx$)<<<Rx$.

$C_{i,j}(1)$ is a constant serving as an element of the first constant group 480 generated by the above-described method that uses the plural initial values S and T.

x is an identification number of the constant group and takes a value of 2 to m.

By applying any of the above-described conversion processing examples 1 to 3, it is possible to generate plural different constant groups from one constant group, and these are set as constants applied to the respective overall transposition.

Incidentally, in the case of the above-described conversion processing example 1, it can be ensured that as long as $C_{i,j}(O)$ does not have a special bit pattern, a result of XOR operation between $C_{i,j}(x)$ and $C_{i,j}(y)$ with respect to arbitrary x, y does not become zero and thus, it is possible to configure different overall transpositions. Further, in the case of the above-described conversion processing example 2 as well, it can be ensured that a result of XOR operation does not become zero and thus, this processing example is also suitable for generation of different overall transpositions.

Incidentally, the rotation amount and the mask value shown in the above-described conversion processing examples are configured to use the value determined for each overall transposition, but a similar effect can be expected in a configuration in which plural values are set and used for generating plural constant values required for one overall transposition.

By adopting these schemes, as long as there is a group of constant values for the first transposition function, it is possible to create a group of constant values for another transposition function with the cost of light processing and thus, a speedup of the processing can be expected.

In particular, when a program execution function, namely software, is implemented in a data conversion device, it is possible to provide a programming configuration in a form of dynamically creating a group of constant values for all the overall transpositions as necessary without development on memory and thus, an increase in memory use efficiency can be expected.

Incidentally, the description has been provided by using the examples in which the target of rotation operation is based on the unit of word, but this may be changed to a form of applying the rotation in the unit of connected two or more words, and an effect similar to that described above can be expected.

[19. Technique of Reducing Output Value of Hash Function]

Next, there will be described a configuration example of a data conversion device in which in a hash-value generating processing configuration, a function to output an n-bit hash value is prepared, and a k-bit output is cut off, so that an n-k-bit hash value can be output.

It is a configuration in which, for example, a hash function having a 256-bit output is prepared, and that output is reduced by 32 bits to result in a 224-bit hash function.

Figure 35:
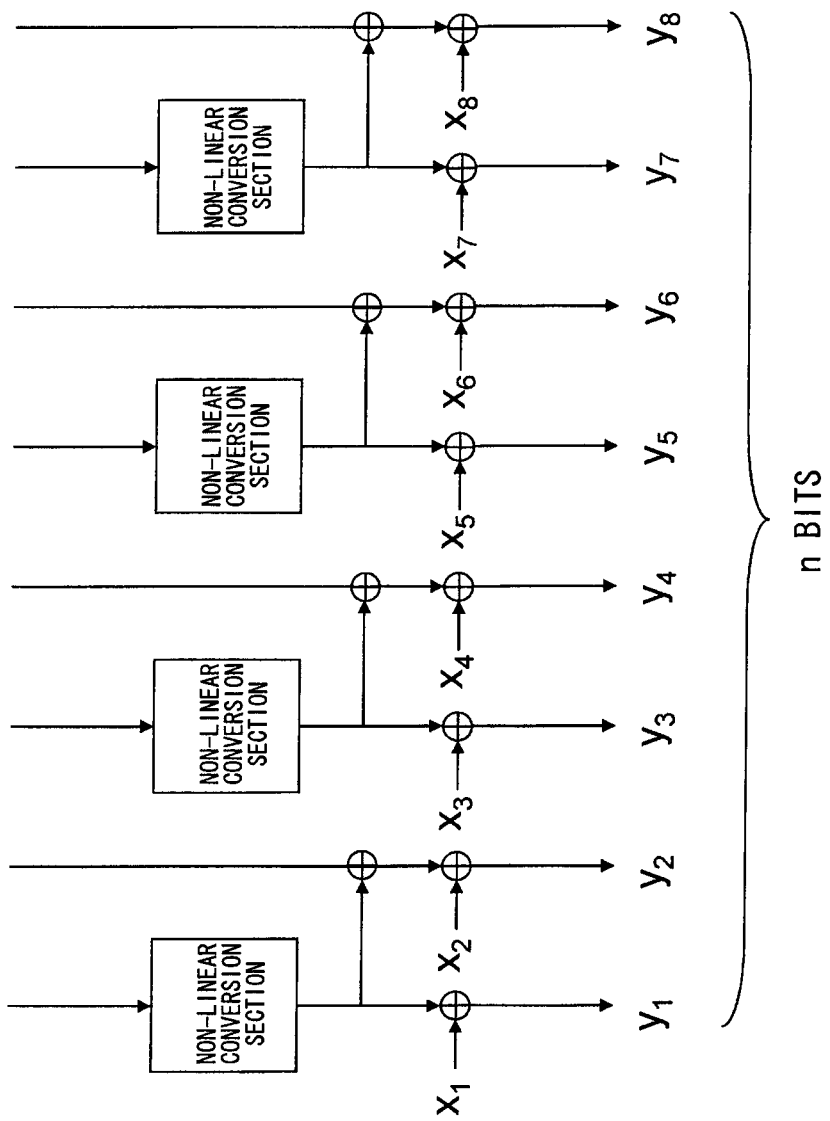
FIG. 35 is a diagram that explains one example of a technique of reducing output bits of a hash function.

FIG. 35 illustrates an internal transposition processing configuration in the final stage of the overall transposition, which is a configuration similar to the internal transposition processing section (transposition function) 410 illustrated in FIG. 30. Outputs $y_1$ to $y_8$ are outputs of the overall transposition, and indicate a hash value serving as an output of the hash function. Incidentally, FIG. 35 illustrates a data line of 1 word (4 bytes) as one data line in a simplified way. The outputs $y_i$ to $y_8$ on the whole become an output of 4×8=32 bytes=256 bits.

Incidentally, for easy description, processing of interchanging pieces of data after an exclusive OR operation is assumed not to be performed immediately before the output. Further, data Xi that is XORed with a data series immediately before the output is assumed to represent feed-forwarded data that is formed by a chaining value (CV) serving as a median value input to this compression function, a message, and the like.

Here, there will be discussed a method of deleting k-bit data of n-bit data of the output, and thereby performing a reduction of output data. It is necessary to determine, of output series in the figure: $y_1$ to $y_8$, bits included in which data series are to be cut off. As one method, there is a scheme in which each k-bit block are cut off sequentially from left. In that case, the following problem is conceivable. If the k bits are beyond the sum of the sizes of two data lines from left, a result of non-linear conversion processing at the left end does not affect any bit of the remaining output. This makes it evident that calculation of this part is useless.

As to a reduction technique not being biased to a particular data series in order to avoid such a waste, the following two processing techniques will be described.

(Data Reduction Technique 1)

The number of output data series is assumed to be m, and the number of bits to be cut off (the number of bits to be deleted) is assumed to be k.

In order to divide the k bits into m blocks as uniformly as possible, parameters a and b are calculated according to the following equation.

$$a = m - (k - m \times \lfloor k/m \rfloor)$$

$$b = k - m \times \lfloor k/m \rfloor \qquad \text{[Equation 1]}$$

$\lfloor k/m \rfloor$ indicates an integer part of (k/m).
In the following, $\lfloor k/m \rfloor$ is expressed as f(k/m).
By the above formula, a and b are calculated.
Incidentally, it is a+b=m.

Figure 36:
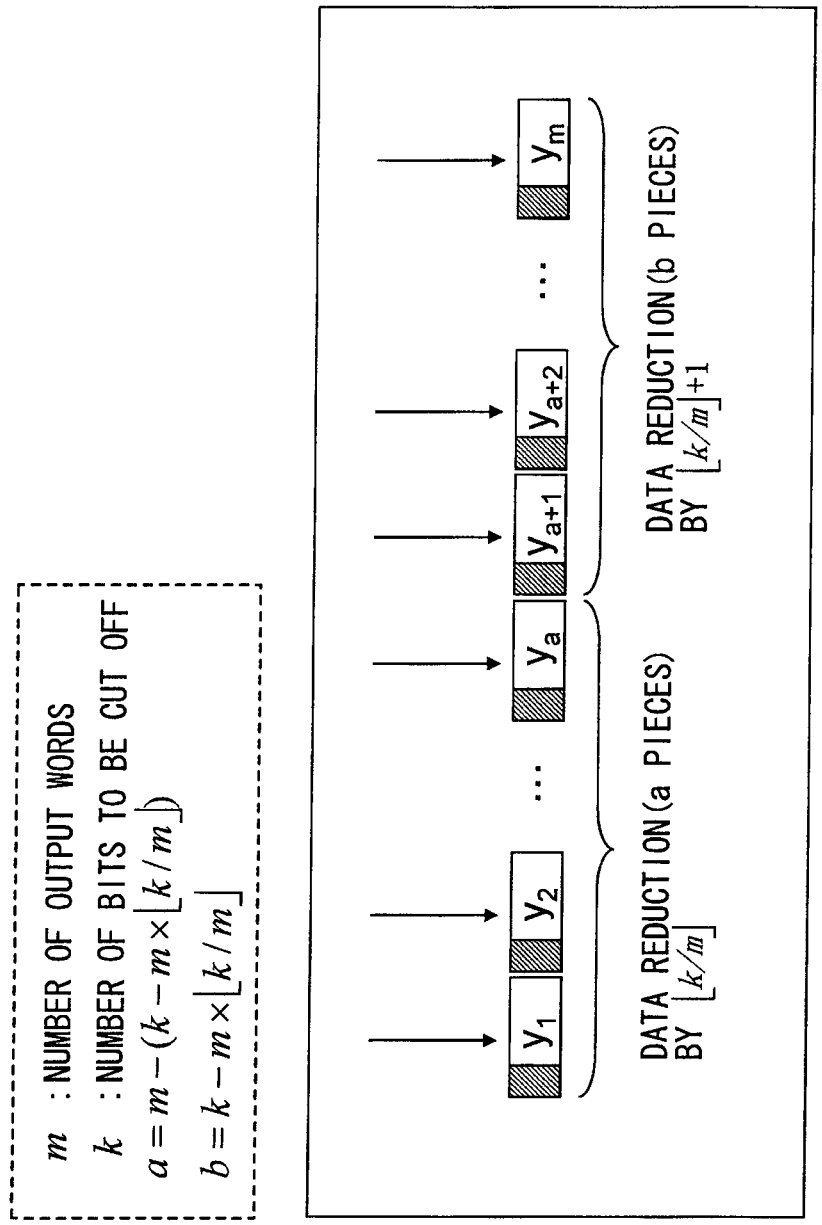
FIG. 36 is a diagram that explains one example of a technique of reducing output bits of a hash function.

From each piece of output data in the output series the number of which is a, among the series y1 to ym the number of which is m obtained as the output, reduction is made by f(k/m) bits. Further, from each piece of output data in the remaining output series the number of which is b, reduction is made by f(k/m)+1 bits. In other words, as illustrated in FIG. 36, a data reduction process for each output series is performed.

When the transposition is used, it is possible to ensure that the results of all the non-linear conversions affect any of outputs by performing discrete cutting off, rather than by cutting off sequential bit string and therefore, no waste occurs in the processing of generating the output values.

In the output-bit reduction process described above, the processing is performed with all the output data series as a target of the data reduction, but there may be provided such a configuration that only part of the output series is selected and the data reduction process is performed.

For example, in the internal transposition processing configuration illustrated in FIG. 33, two pieces of output data from left are affected by the output of the same non-linear conversion and thus, there may be provided such a configuration that, for example, only the odd-numbered (or even-numbered) data series from left are selected as a target of the cutting off. Even when such processing is performed, an effect of no occurrence of waste of processing, like the above-described effect, can be expected, and further, the work for the processing can be reduced since the number of portions to be cut off becomes small. Incidentally, when the number of output series is n, this series selection configuration can be applied to a case where a bit length to be cut off is not more than n/2.

(Data Reduction Technique 2)

The number of output data series is assumed to be m, and the number of bits to be cut off (the number of bits to be deleted) is assumed to be k.

In order to divide the k bits into m blocks as uniformly as possible, parameters a and b are calculated according to the following equation.

$$a = (m/2) - (k - (m/2 \times \lfloor 2k/m \rfloor))$$

$$b = k - (m/2) \times \lfloor k/m \rfloor$$

$\lfloor 2k/m \rfloor$ indicates an integer part of (2k/m).
In the following, $\lfloor 2k/m \rfloor$ is expressed as f(2k/m).
By the above formula, a and b are calculated.
Incidentally, it is a+b=m/2.

From each piece of output data in the output series the number of which is a, among the odd-numbered outputs $y_1, y_3, y_5, \ldots, y_{2m-1}$ the number of which is m/2 of y1 to ym the number of which is m obtained as the output, reduction is made by f(2k/m) bits. Further, from each piece of output data in the remaining output series the number of which is b, reduction is made by f(2k/m)+1 bits.

In this way, there may be provided such a configuration that only a part of the output series is selected and the data reduction process is performed. In this processing example, the number of to-be-cut-off portions is reduced and therefore the work for the processing can be reduced.

[20. Configurational Example of Data Conversion Device]

Figure 37:
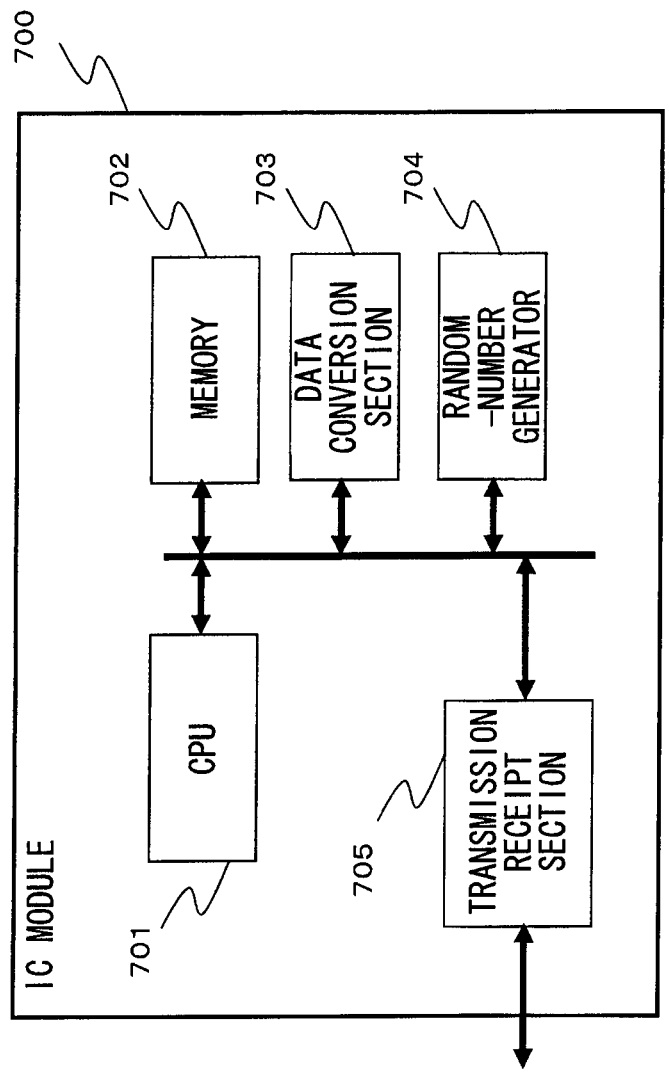
FIG. 37 is a diagram that explains a configurational example of an IC module serving as a data conversion device that executes the processes according to the present invention.

Lastly, FIG. 37 illustrates a configurational example of an IC module 700 serving as a device that performs processing according to the above-described embodiment. The above-described processing can be performed in, for example, a PC, an IC card, a reader/writer, and other various kinds of information processing device. Further, each processing can be performed by applying a hard circuit forming a logical circuit or a program, or both. As an example of performing the processing, there is the IC module 700 illustrated in FIG. 37, such an IC module 700 can be mounted in various kinds of equipment.

A CPU (Central processing Unit) 701 illustrated in FIG. 37 is a processor that performs: starting and ending of data conversion processing such as encryption processing and hash processing; control of data transmission and receipt; control of data transfer between constituent elements; and other various kinds of program. A memory 702 is composed of ROM (Read-Only-Memory) that stores a program executed by the CPU 701, or fixed data such as operation parameters, and RAM (Random Access Memory) used as a storage region for a program executed in the processing of the CPU 701 and parameters that change as appropriate in program processing, and a work region. Further, the memory 702 can be used as a storage region for key data required for the data conversion processing such as the encryption processing and the hash processing, data applied to a conversion table (transposition table) and a conversion matrix applied in the data conversion processing, and the like. Incidentally, it is desirable that the data storage region be configured as a memory having a tamper-resistant structure.

A data conversion section 703 performs the above-described various kinds of processing, namely, various kinds of processing such as: the data conversion processing supporting various functions including the hash function, the compression function, the transposition function, and the stirring function; the constant calculation; and the output-data cutting-off process. Incidentally, in the execution of these functions, the linear conversion, non-linear conversion, exclusive OR operation and the like defined in the execution of each function are performed according to a sequence preset. These processes are implemented by hardware or software, or a configuration of their combination.

Incidentally, here, the example in which the data conversion section is an independent module is shown, but it may be configured such that without providing such an independent module, for example, a program of encryption processing or hash processing is stored in the ROM, and the CPU 701 reads out and executes the program stored in the ROM. It may also be configured such that various kinds of processing such as the execution of each function, the constant calculation, and the output-data reduction process are performed by the CPU 701 according to the program.

A random-number generator 704 performs random-number generation processing required for generation of keys and parameters necessary for the encryption processing and the hash processing.

A transmission receipt section 705 is a data communication processing section that performs data communications with the outside, and executes the data communications with an IC module such as a reader/writer, and performs output of a cipher text generated in the IC module or data input from equipment such as the external reader/writer.

Up to this point, the present invention has been described in detail with reference to the particular embodiments. However, it is obvious for a person ordinarily skilled in the art to achieve modifications and substitutions of the embodiments without departing from the gist of the present invention. In other words, the present invention has been disclosed in form of illustration, and should not be interpreted in a limited manner. In order to determine the gist of the present invention, the section of the scope of claims should be referred to.

Further, the series of processes described in the description can be executed by hardware, or software, or a configuration of both of them combined. When the processing by the software is executed, a program in which a processing sequence is recorded can be installed on memory built in dedicated hardware within a computer and executed, or the program can be installed onto a general-purpose computer capable of executing various kinds of processing and executed. For example, the program can be recorded in a recording medium beforehand. The program can be installed from the recording medium onto a computer and moreover, can be received through a network such as LAN (Local Area Network) and the Internet, and installed on a recording medium such as a built-in hard disk.

Incidentally, various kinds of processing described in the description are not only executed in a time series according to the description, but may be executed in parallel or individually according to the performance of a device that executes the processing or as required. Further, the system in the present description is a configuration of a logical group of plural devices, and is not limited to one in which the devices of the respective configurations are present within the same enclosure.

INDUSTRIAL APPLICABILITY

As described above, according to the configuration of one embodiment of the present invention, there are provided the stirring processing section that executes the data stirring process for the input data, and the compression processing section performing the data compression process on the input data including the data segments which are divisions of the message data, the message data being a target of the data conversion. Part of the multi-stage compression subsections perform the data compression process based on both of the output of the stirring processing section and the data segments in the message data. There is provided the configuration in which the stirring process is executed on at least each fixed timing of the compression processing round of plural rounds and thus, there is realized the data conversion device that performs the hash-value generation with improved analysis resistance and a high degree of safety.

The invention claimed is:

1. A data conversion device, comprising circuitry configured to:
perform a data stirring process on input data; and
perform a data compression process on input data including data segments which are divisions of message data;
wherein the compression processing is a multi-stage compression,
part of the multi-stage compression is a data compression process based on both of output of the stirring processing and the data segments in the message data, and
part of the multi-stage compression is a data compression process based on both of output of a previous-stage compression and the data segments in the message data.

2. The data conversion device according to claim 1, wherein the circuitry is further configured to output a hash value of the message data.

3. The data conversion device according to claim 1, wherein the multi-stage compression includes a Merkle-Damgard (MD) Construction.

4. The data conversion device according to claim 1, wherein the multi-stage compression includes a plurality of processing series that receive the same data segments in the message data to perform processing in parallel.

5. The data conversion device according to claim 1, wherein the circuitry is further configured to:

perform the data stirring process on the input data, and generate output data whose number of bits is equal to number of bits in the input data, and perform the data compression process on the input data, and generate output data whose number of bits is less than number of bits in the input data.

6. The data conversion device according to claim 1, wherein the data conversion device is configured such that the data stirring process and the data compression process are alternately performed.

7. The data conversion device according to claim 1, wherein the data conversion device is configured such that the data stirring process is performed corresponding to each of multi-stage data compression processes.

8. The data conversion device according to claim 1, wherein the circuitry is further configured to:
perform an adjustment process of number of bits in the input data; and
receive the input data and perform a compression process thereon.

9. The data conversion device according to claim 8, wherein circuitry is further configured to:
perform a plurality of adjustment processes in parallel, and
perform a plurality of compression processes in parallel on outputs from the respective adjustment processes.

10. The data conversion device according to claim 1, wherein the circuitry is further configured to:
repeatedly perform each of transposition processes to output an intermediate value which is a result of each of the transposition processes, and
repeatedly perform a transposition process with use of the outputted intermediate value, as an additional input.

11. The data conversion device according to claim 10, wherein the circuitry is further configured to utilize an XOR result as input data for the transposition process in following stage, the XOR result being a logical value of an exclusive OR between the outputted intermediate value and a result of transposition process in previous stage.

12. The data conversion device according to claim 10, wherein each of the transposition processes includes a non-linear conversion process performed for part or all of input data and a swap process which is a data interchanging process.

13. The data conversion device according to claim 12, wherein the non-linear conversion process is a process including an exclusive OR operation with use of a constant, a non-linear conversion, and a linear conversion with use of a linear conversion matrix.

14. The data conversion device according to claim 13, wherein the linear conversion process in each of the transposition processes is performed according to a Diffusion Switching Mechanism (DSM) with use of a plurality of different matrixes.

15. The data conversion device according to claim 10, wherein each of the transposition processes is configured such that a data process is performed based on a respective one of a plurality of constants groups which are different from one another, and
the plurality of constants groups, which are generated by data conversion processes performed on a fundamental group and are different from one another, are applied to respective transposition processes, the fundamental group being defined as a constants group to be applied to one transposition process.

16. The data conversion device according to claim 15, wherein
the constants group to be utilized as the fundamental group is configured of a plurality of constants generated through application of a conversion rule to a plurality of initial values S and T which are different from each other, and
the conversion rule is configured to include an update process for the initial values, the update process being represented by following expression:

$S \leftarrow S \cdot x^a, T \leftarrow T \cdot x^b$ where a≠b.

17. The data conversion device according to claim 15, wherein the data conversion processes for the fundamental group is a process which allows a bit rotation operation to be performed on each of constants which constitute the fundamental group, or a process which allows an operation to be performed on predetermined mask data.

18. The data conversion device according to claim 1, wherein the circuitry is further configured to:
perform a cutting-off process which allows an ultimately outputted hash value to be reduced in number of bits, and
calculate the number of bits to be reduced, for output bits of each of a plurality of output-data series which constitute an output of the data conversion section, according to a predetermined calculation expression, and then execute the cutting-off process according to a result of the calculation.

19. A data conversion method, comprising:
performing a data stirring process on input data; and
performing a data compression process on input data including data segments which are divisions of message data;
wherein the compression processing is a multi-stage compression,
part of the multi-stage compression is a data compression process based on both of output of the stirring processing and the data segments in the message data, and
part of the multi-stage compression is a data compression process based on both of output of a previous-stage compression and the data segments in the message data.

20. A non-transitory computer-readable medium having stored therein instructions that, when executed by a device, cause the device to perform a computer data conversion method, the method comprising:
performing a data stirring process on input data; and
performing a data compression process on input data including data segments which are divisions of message data;
wherein the compression processing is a multi-stage compression,
part of the multi-stage compression is a data compression process based on both of output of the stirring processing and the data segments in the message data, and
part of the multi-stage compression is a data compression process based on both of output of a previous-stage compression and the data segments in the message data.

* * * * *